(12) United States Patent
Hosek

(10) Patent No.: US 12,208,517 B2
(45) Date of Patent: Jan. 28, 2025

(54) DISTRIBUTED-ARCHITECTURE ROBOT WITH MULTIPLE LINKAGES

(71) Applicant: Persimmon Technologies Corporation, Wakefield, MA (US)

(72) Inventor: Martin Hosek, Salem, NH (US)

(73) Assignee: Persimmon Technologies Corporation, Wakefield, MA (US)

( * ) Notice: Subject to any disclaimer, the term of this patent is extended or adjusted under 35 U.S.C. 154(b) by 176 days.

(21) Appl. No.: 17/698,017

(22) Filed: Mar. 18, 2022

(65) Prior Publication Data
US 2022/0297285 A1 Sep. 22, 2022

Related U.S. Application Data

(60) Provisional application No. 63/162,769, filed on Mar. 18, 2021.

(51) Int. Cl.
| | |
|---|---|
| *B25J 9/04* | (2006.01) |
| *B25J 9/10* | (2006.01) |
| *H01L 21/687* | (2006.01) |
| *B25J 11/00* | (2006.01) |

(52) U.S. Cl.
CPC .............. *B25J 9/043* (2013.01); *B25J 9/104* (2013.01); *H01L 21/68707* (2013.01); *B25J 11/0095* (2013.01)

(58) Field of Classification Search
CPC ...... B25J 9/043; B25J 9/104; H01L 21/68707
See application file for complete search history.

(56) References Cited

U.S. PATENT DOCUMENTS

| | | | | |
|---|---|---|---|---|
| 5,950,495 A | * | 9/1999 | Ogawa ...................... | B25J 9/06 414/935 |
| 5,975,834 A | * | 11/1999 | Ogawa ..................... | B25J 18/04 414/744.5 |
| 6,109,860 A | * | 8/2000 | Ogawa .............. | H01L 21/67742 414/744.5 |
| 6,297,611 B1 | * | 10/2001 | Todorov ................... | B25J 9/107 318/567 |
| 7,891,935 B2 | * | 2/2011 | Kremerman ............. | B25J 9/044 414/744.5 |
| 9,033,644 B2 | * | 5/2015 | Hudgens .................. | B25J 9/104 414/744.5 |
| 9,149,936 B2 | * | 10/2015 | Hosek .................. | B25J 15/0014 |

(Continued)

FOREIGN PATENT DOCUMENTS

JP         06338554 A   * 12/1994

*Primary Examiner* — Gerald McClain
(74) *Attorney, Agent, or Firm* — Harrington & Smith

(57) ABSTRACT

An apparatus includes a drive; a movable arm having a base pivotally connected to the drive, first and second linkages, the first linkage having a first link rotatable on the base at a first rotary joint, a second link connected to the first link at a second rotary joint, and a third link connected to the second link at a third rotary joint, the third link having an end-effector, and the second linkage having a fourth link rotatable on the base at a fourth rotary joint, a fifth link connected to the fourth link at a fifth rotary joint, and a sixth link connected to the fifth link at a sixth rotary joint, the sixth link having another end-effector. The apparatus also includes a master controller coupled to the drive, the master controller being configured to control movements of the movable arm and the base relative to the drive.

7 Claims, 57 Drawing Sheets

(56) References Cited

U.S. PATENT DOCUMENTS

| | | |
|---|---|---|
| 10,224,232 B2 | 3/2019 | Hosek |
| 10,269,604 B2 | 4/2019 | Hofmeister et al. |
| 10,424,498 B2 | 9/2019 | Hofmeister et al. |
| 10,569,430 B2 | 2/2020 | Hosek et al. |
| 10,596,710 B2 | 3/2020 | Hosek et al. |
| 10,742,070 B2 | 8/2020 | Hosek et al. |
| 10,800,050 B2* | 10/2020 | Hosek et al. |
| 2002/0094265 A1* | 7/2002 | Momoki ............... B25J 9/042 414/744.5 |
| 2006/0210387 A1* | 9/2006 | Saeki ................. B25J 9/042 414/744.5 |
| 2012/0141235 A1* | 6/2012 | Krupyshev ........... B25J 9/042 414/744.5 |
| 2012/0232690 A1* | 9/2012 | Gilchrist ............ B25J 11/0095 700/228 |
| 2013/0121798 A1* | 5/2013 | Hosek ................ H01L 21/677 414/800 |
| 2014/0365011 A1* | 12/2014 | Hosek ................ B25J 9/1682 700/259 |
| 2016/0229296 A1 | 8/2016 | Hosek et al. |
| 2018/0105044 A1 | 4/2018 | Hosek et al. |
| 2018/0105045 A1 | 4/2018 | Hosek et al. |
| 2018/0108552 A1 | 4/2018 | Hofmeister et al. |
| 2019/0270196 A1* | 9/2019 | Muthukamatchi ........................ H01L 21/67742 |
| 2020/0262660 A1 | 8/2020 | Hosek et al. |
| 2021/0245372 A1* | 8/2021 | Hosek ................ B25J 19/007 |

* cited by examiner

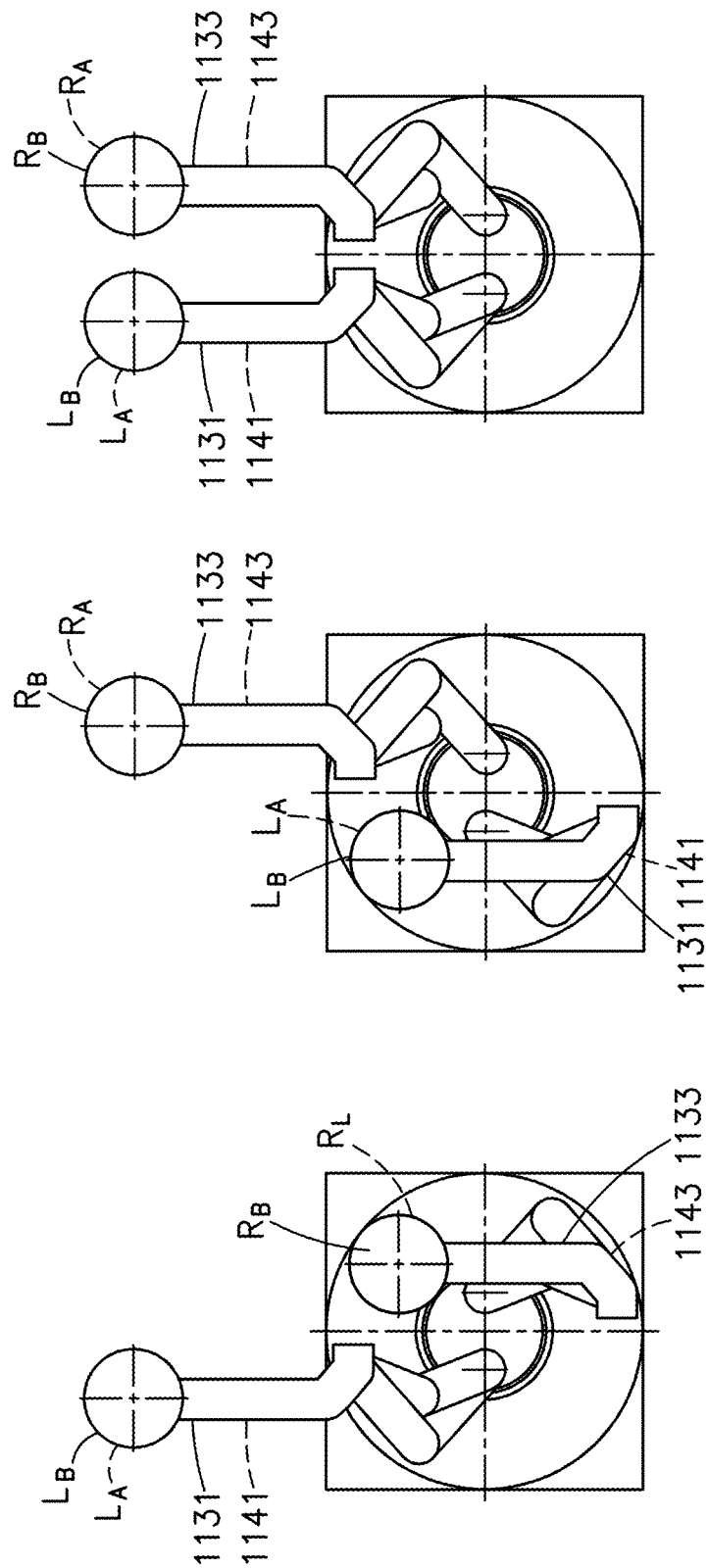

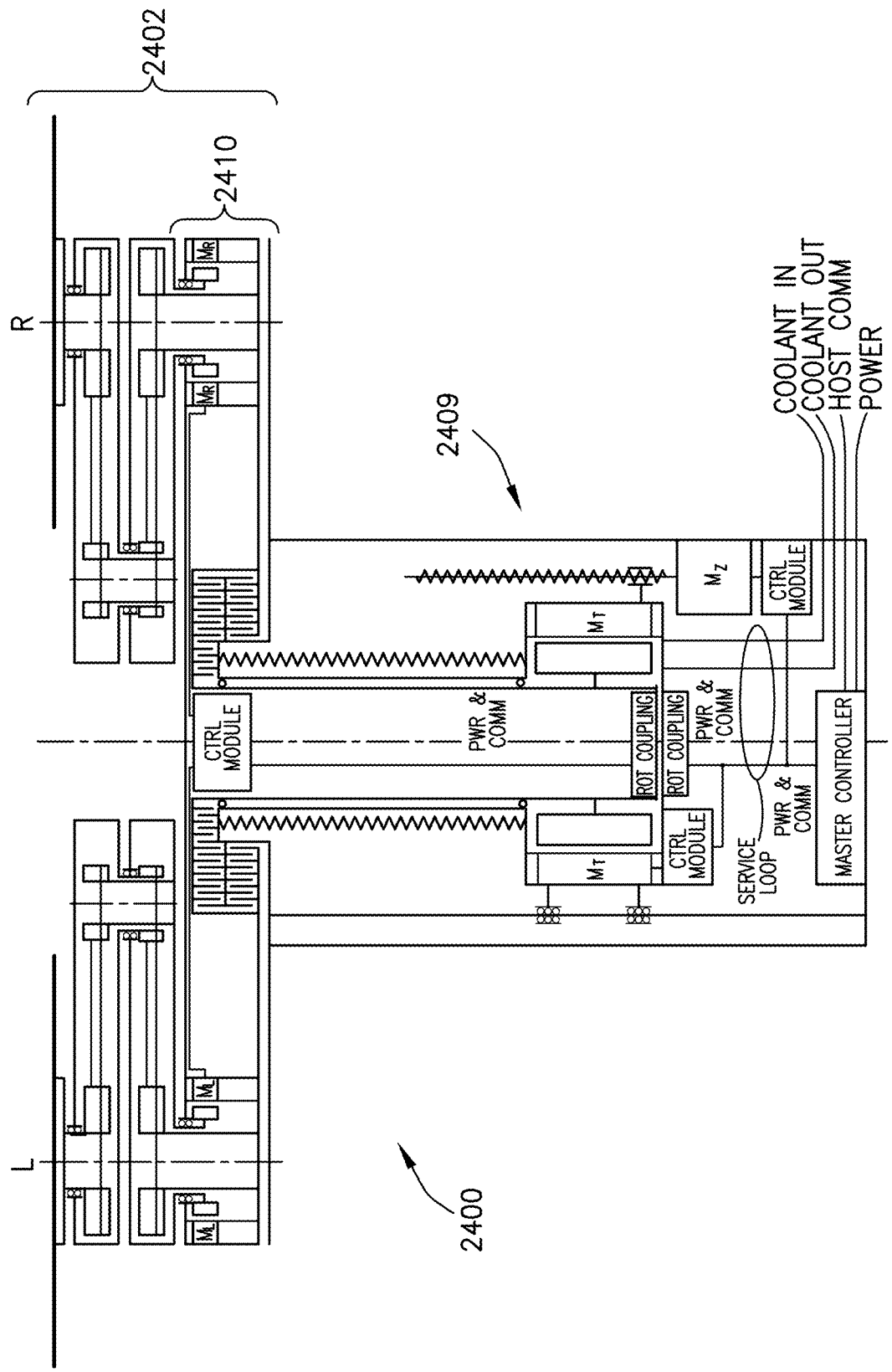

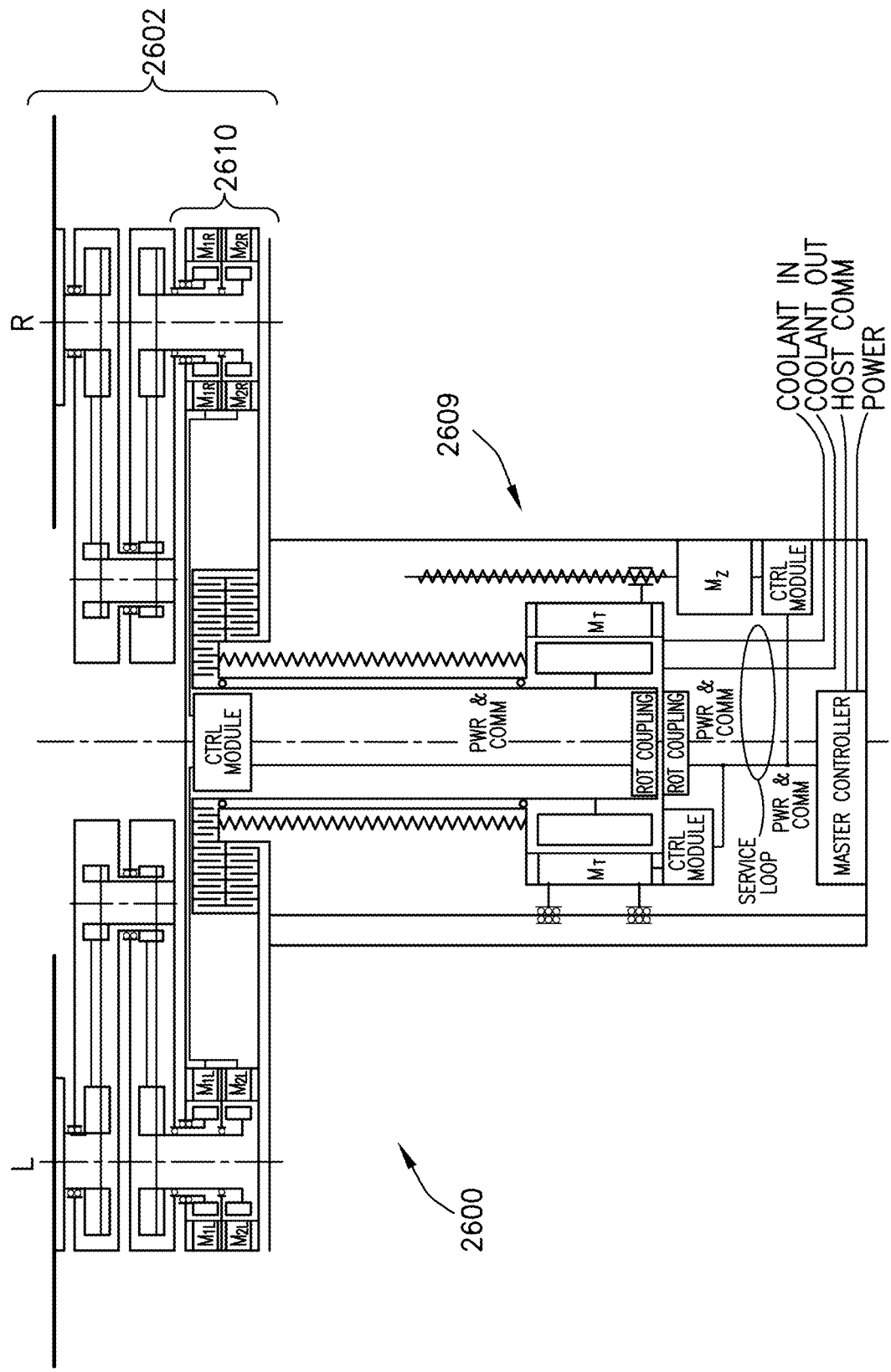

DISTRIBUTED-ARCHITECTURE ROBOT WITH MULTIPLE LINKAGES

CROSS REFERENCE TO RELATED APPLICATION

This application claims priority under 35 USC 119(e) to U.S. Provisional Application No. 63/162,769, filed Mar. 18, 2021, the content of which is hereby incorporated by reference in its entirety.

BACKGROUND

Technical Field

The example and non-limiting embodiments relate generally to material-handling robots and, more particularly, to a material-handling robot having distributed actuators for controlling multiple linkages and being suitable for manipulating and transferring payload, such as semiconductor wafers, in semiconductor processing systems.

Brief Description of Prior Developments

Material-handling robots operating in vacuum environments typically use centralized actuators. One such robot generally comprises a robot arm, a drive unit that houses all of the actuators for moving the robot arm, and a control system that receives external inputs and directs the actuators to perform the desired motion of the robot arm and/or to move the robot arm to a desired position.

SUMMARY

In accordance with one aspect, an apparatus comprises a drive; a movable arm comprising a base pivotally connected to the drive, a first linkage, and a second linkage, the first linkage comprising a first link rotatable on the base at a first rotary joint, a second link connected to the first link at a second rotary joint, and a third link connected to the second link at a third rotary joint, the third link comprising a first end-effector configured to carry a first payload, and the second linkage comprising a fourth link rotatable on the base at a fourth rotary joint, a fifth link connected to the fourth link at a fifth rotary joint, and a sixth link connected to the fifth link at a sixth rotary joint, the sixth link comprising a second end-effector configured to carry a second payload. The apparatus also comprises a master controller coupled to the drive, the master controller being configured to control a coordination of movements of the movable arm and the base relative to the drive. The first rotary joint comprises a first shoulder pulley and the fourth rotary joint comprises a second shoulder pulley, the first shoulder pulley and the second shoulder pulley being connected to the base via a substantially rigid post. The first link is rotatable about the first rotary joint by a first actuator attached to the base. The fourth link is rotatable about the fourth rotary joint by a second actuator attached to the base.

In accordance with another aspect, an apparatus comprises a drive; a first movable arm comprising a base pivotally connected to the drive, a first linkage, and a second linkage, the first linkage comprising a first link rotatable on the base at a first rotary joint, a second link connected to the first link at a second rotary joint, and a third link connected to the second link at a third rotary joint, the third link comprising a first end-effector configured to carry a first payload, and the second linkage comprising a fourth link rotatable on the base at a fourth rotary joint, a fifth link connected to the fourth link at a fifth rotary joint, and a sixth link connected to the fifth link at a sixth rotary joint, the sixth link comprising a second end-effector configured to carry a second payload. The apparatus also comprises a master controller coupled to the drive, the master controller being configured to control a coordination of movements of the first movable arm and the base relative to the drive. The first rotary joint comprises a first shoulder pulley and the fourth rotary joint comprises a second shoulder pulley, the first shoulder pulley and the second shoulder pulley being rotatably connected to the base and independently actuatable. The first link is rotatable about the first rotary joint by a first actuator attached to the base. The fourth link is rotatable about the fourth rotary joint by a second actuator attached to the base. The first shoulder pulley and the second shoulder pulley are independently actuatable by a third actuator attached to the base.

In accordance with another aspect, an apparatus comprises a drive; a movable arm comprising a base pivotally connected to the drive, the base comprising an upper portion and a lower portion, a first linkage comprising at least one first link and being configured to carry a first payload, the at least one first link being rotatable on the lower portion of the base at a first rotary joint, and a second linkage comprising at least one second link and being configured to carry a second payload, the at least one second link being rotatable on the upper portion of the base at a second rotary joint; and a master controller coupled to the drive, the master controller being configured to control a coordination of movements of the base, the first linkage, the second linkage, the third linkage, and the fourth linkage relative to the drive. The first link is rotatable through a first shoulder pulley attached to the lower portion by a first actuator, and the second link is rotatable through a second shoulder pulley attached to the upper portion by a second actuator.

In accordance with another aspect, an apparatus comprises a drive; a movable arm comprising a base pivotally connected to the drive, the base comprising an upper portion and a lower portion, a first linkage comprising at least one first link and being configured to carry a first payload, the at least one first link being rotatable on the lower portion of the base at a first rotary joint; a second linkage comprising at least one second link and being configured to carry a second payload, the at least one second link being rotatable on the upper portion of the base at a second rotary joint; a third linkage comprising at least one third link and being configured to carry a third payload, the at least one third link being rotatable on the lower portion of the base at a third rotary joint; and a fourth linkage comprising at least one fourth link and being configured to carry a fourth payload, the at least one fourth link being rotatable on the upper portion of the base at a fourth rotary joint. The first link is rotatable on the lower portion by a first actuator and through a first shoulder pulley not attached to the lower portion by a second actuator, and the second link is rotatable on the upper portion by a third actuator and through a second shoulder pulley not attached to the upper portion by a fourth actuator, and the third link is rotatable on the lower portion by a fifth actuator and through a third pulley attached to the lower portion, and the fourth link is rotatable on the upper portion by a sixth actuator and through a fourth shoulder pulley attached to the upper portion. A master controller is coupled to the drive, the master controller being configured to control a coordination of movements of the base, the first linkage, the second linkage, the third linkage, and the fourth linkage relative to the drive. The first actuator, the second actuator, the third actuator, the fourth actuator, the fifth actuator, and the sixth actuator are attached to the base.

In accordance with another aspect, an apparatus comprises a drive; a movable arm comprising a base pivotally connected to the drive, the base comprising an upper portion and a lower portion, a first linkage comprising at least one first link and being configured to carry a first payload, the at least one first link being rotatable on the lower portion of the base at a first rotary joint, a second linkage comprising at least one second link and being configured to carry a second payload, the at least one second link being rotatable on the upper portion of the base at a second rotary joint, a third linkage comprising at least one third link and being configured to carry a third payload, the at least one third link being rotatable on the lower portion of the base at a third rotary joint, and a fourth linkage comprising at least one fourth link and being configured to carry a fourth payload, the at least one fourth link being rotatable on the upper portion of the base at a fourth rotary joint. The first link is rotatable on the lower portion by a first actuator and through a first shoulder pulley not attached to the lower portion by a second actuator, and the second link is rotatable on the upper portion by a third actuator and through a second shoulder pulley not attached to the upper portion by a fourth actuator, and the third link is rotatable on the lower portion by a fifth actuator and through a third pulley not attached to the lower portion by a sixth actuator, and the fourth link is rotatable on the upper portion by a seventh actuator and through a fourth shoulder pulley not attached to the upper portion by an eighth actuator. The apparatus also includes a master controller coupled to the drive, the master controller being configured to control a coordination of movements of the base, the first linkage, the second linkage, the third linkage, and the fourth linkage relative to the drive.

BRIEF DESCRIPTION OF THE DRAWINGS

The foregoing aspects and other features are explained in the following description, taken in connection with the accompanying drawings, wherein:

FIGS. 13A-13J are diagrammatic top views of operations of the robot of FIG. 11;

DETAILED DESCRIPTION

Figure 1A:
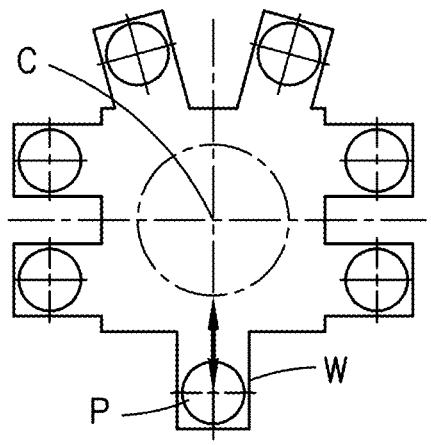
FIGS. 1A-1M are diagrammatic top views of operations of one example of a material-handling robot.

Although the features will be described with reference to the example embodiments shown in the drawings, it should be understood that features can be embodied in many alternate forms of embodiments. In addition, any suitable size, shape, or type of elements or materials could be used.

Features as described herein may be used to provide a material-handling robot capable of picking and placing a payload P from and to workstations W, such as offset and/or radial workstations of the example system as illustrated in FIGS. 1A-1M, including the following operations: (a) carrying individual payloads independently, (b) picking, placing, and exchanging individual payloads independently, (c) carrying multiple payloads simultaneously, (d) picking, placing, and exchanging multiple payloads simultaneously, and (e) independently adjusting payload positions when placing multiple payloads simultaneously.

Figure 1B:
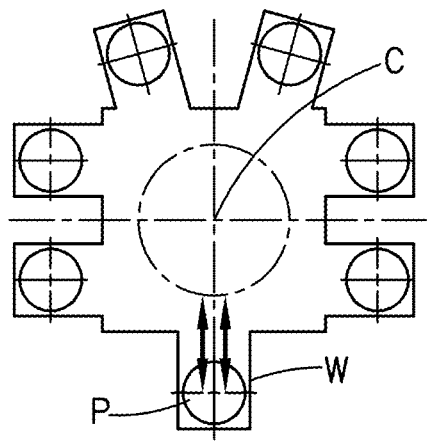
Figure 1C:
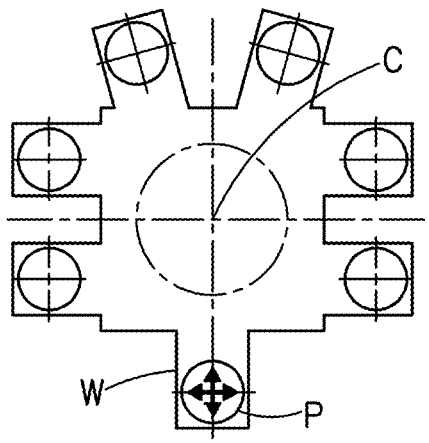
Figure 1D:
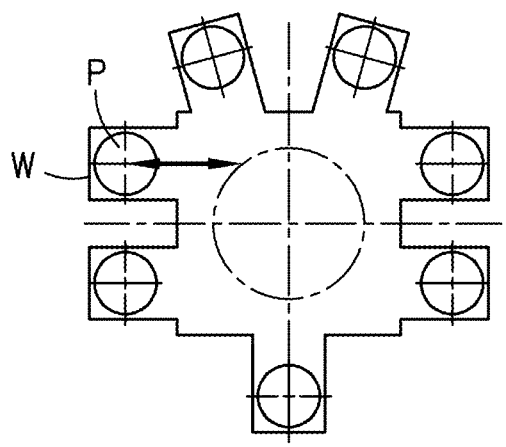
Figure 1E:
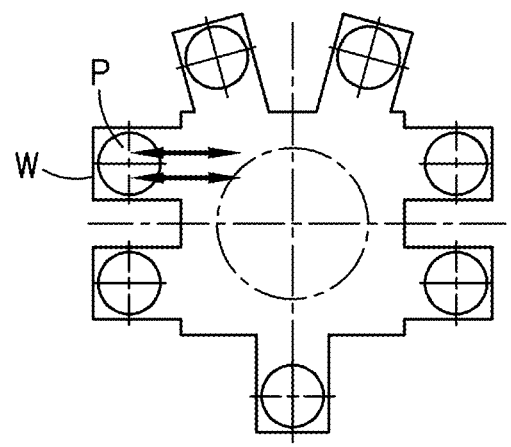
Figure 1F:
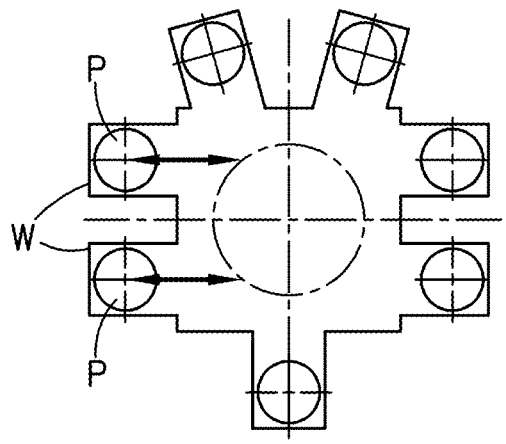
Figure 1G:
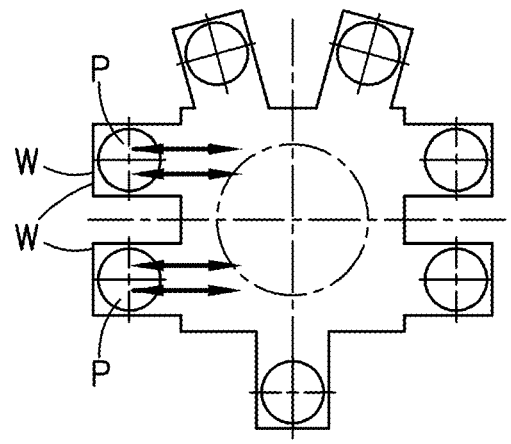
Figure 1H:
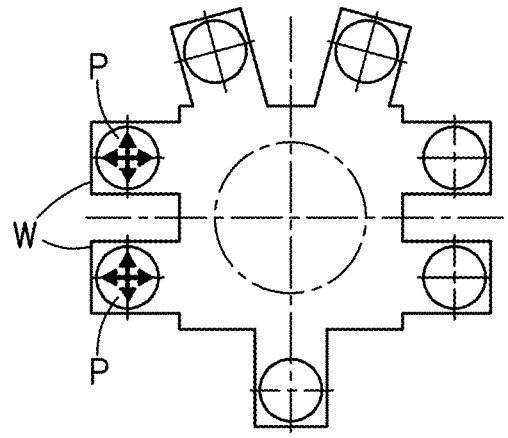
Figure 1I:
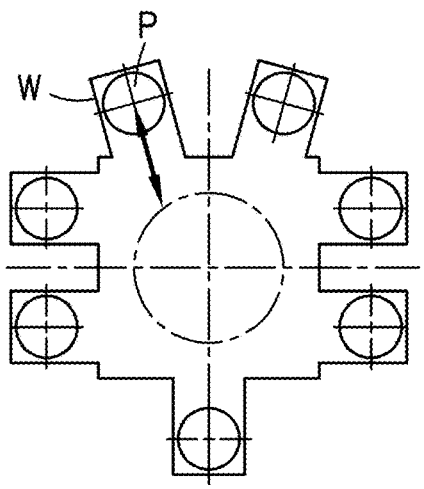
Figure 1J:
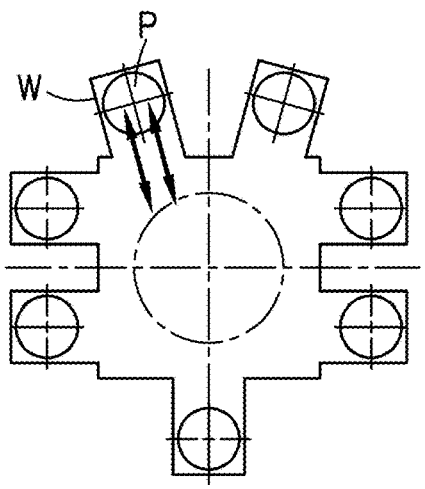
Figure 1K:
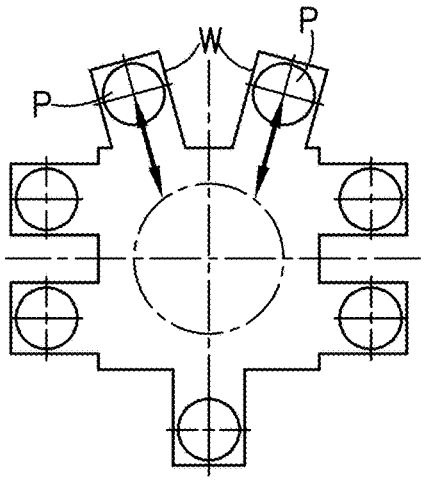
Figure 1L:
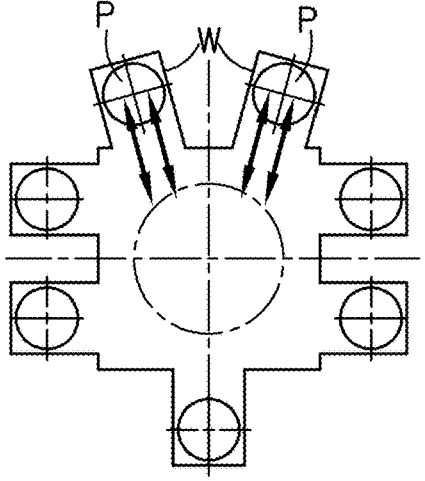
Figure 1M:
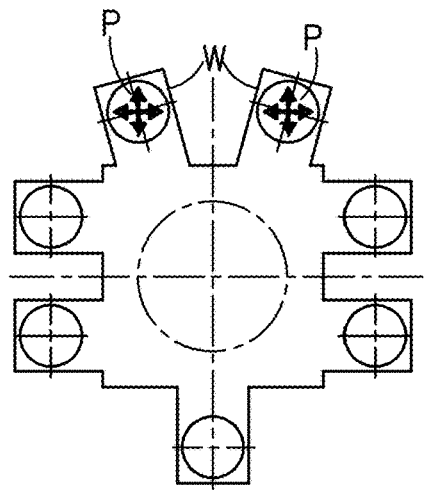

Referring to FIGS. 1A-1M, example operations as described above are illustrated diagrammatically. As shown in FIG. 1A, a pick or a place of an individual payload P at a radial workstation W is illustrated; as shown in FIG. 1B, a simultaneous pick or a simultaneous place of a pair of payloads at two radial workstations in a stacked configuration is illustrated; and as shown in FIG. C, position adjustment, as illustrated by the example arrows in FIG. 1C, of one or more payloads P at a radial workstation or radial workstations is illustrated. The term "radial" as used in reference to FIGS. 1A-1M is intended to mean radial relative to the center C of a transport robot. The radial movement is illustrated in FIGS. 1A and 1B by the arrows in the radial direction relative to the center C. Similarly, FIG. 1D illustrates a pick or a place of an individual payload P at an offset orthogonal workstation W; FIG. 1E illustrates a simultaneous pick or a simultaneous place of a pair of payloads at two offset orthogonal workstations in a stacked configuration; FIG. 1F illustrates a simultaneous pick or a simultaneous place of a pair of payloads at two offset orthogonal workstations in a side-by-side configuration; FIG. 1G illustrates a simultaneous pick or a simultaneous place of four payloads at offset orthogonal workstations; and FIG. 1H illustrates independent simultaneous position adjustment of two or more payloads at offset orthogonal workstations. FIG. 1I illustrates a pick or a place of an individual payload at a non-orthogonal non-radial workstation; FIG. 1J illustrates a simultaneous pick or a simultaneous place of a pair of payloads at two non-orthogonal non-radial workstations in a stacked configuration; FIG. 1K illustrates a simultaneous pick or a simultaneous place of a pair of payloads at two non-orthogonal non-radial workstations in a side-by-side configuration; FIG. 1L illustrates a simultaneous pick or a simultaneous place of four payloads at non-orthogonal non-radial workstations; and FIG. 1M illustrates independent simultaneous position adjustment of two or more payloads at non-orthogonal non-radial workstations.

The above capabilities improve overall productivity of the system by allowing for concurrent processing of multiple payloads while also providing the flexibility of processing individual payloads sequentially, for example, when concurrent processing is impossible due to maintenance being performed on a portion of the system.

Features as described herein may be used to provide a material-handling robot with actuators distributed within the structure of the robot (as opposed to the conventional architecture with all actuators centralized in the drive unit of the robot) to support an increased number of motion axes required for the above capabilities while minimizing the mechanical complexity and improving performance.

Figure 2A:
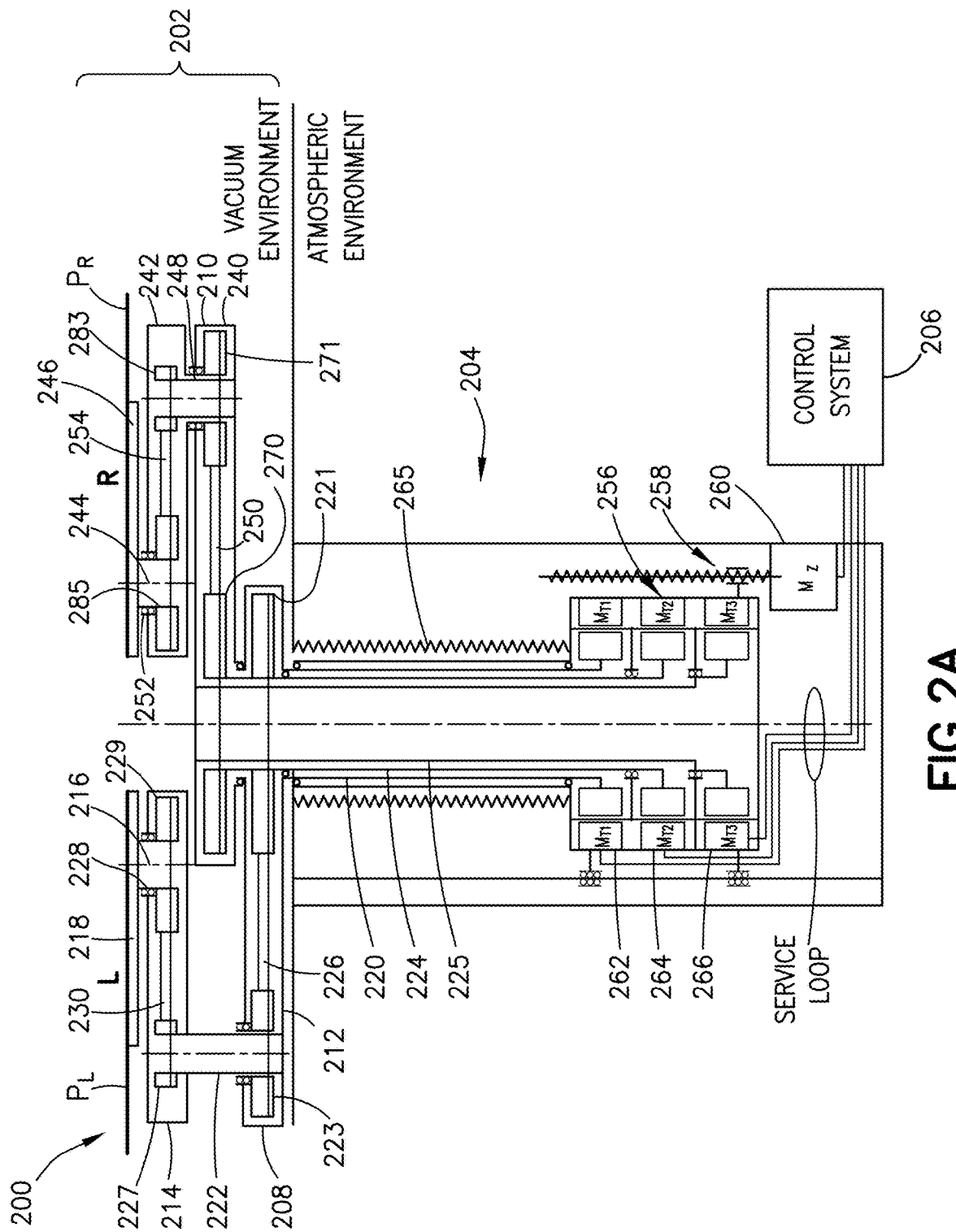
FIG. 2A is a schematic view of one example of a material-handling vacuum-environment robot with conventional architecture utilizing centralized actuators.
Figure 2B:
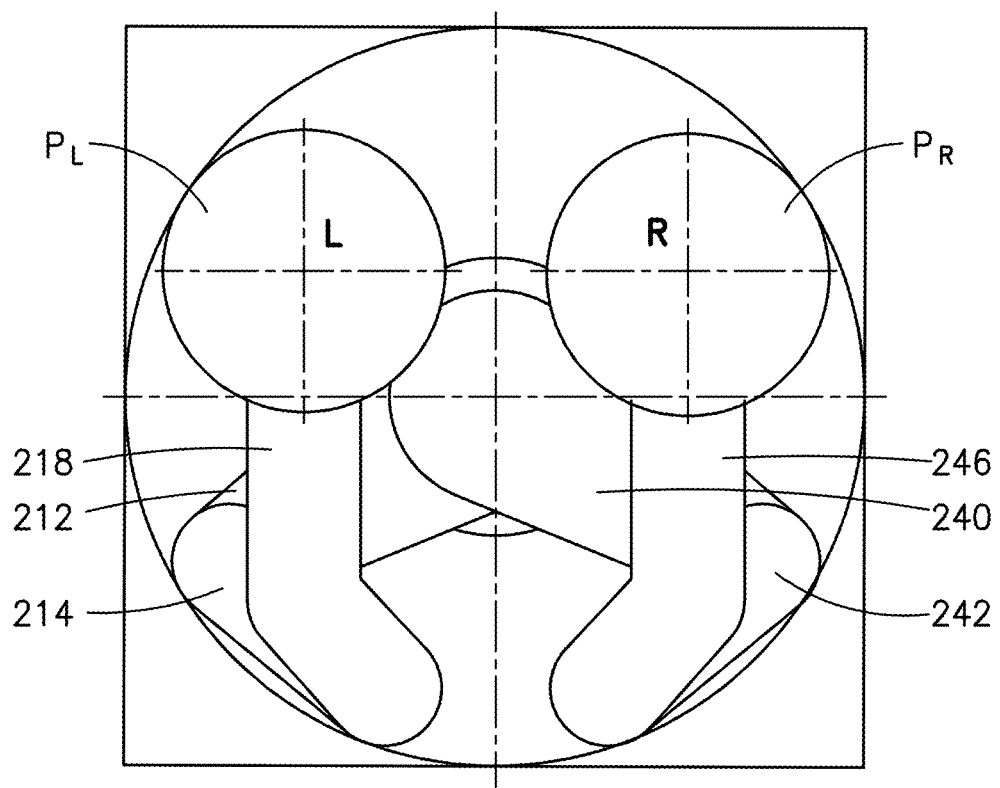
FIG. 2B is a diagrammatic top view of the example robot of FIG. 2A.

Referring to FIG. 2A, a simplified cross-sectional view of an example material-handling vacuum-environment robot with the conventional architecture utilizing centralized actuators is shown and is hereinafter referred to as "robot 200." The example robot 200 comprises a robot arm 202, a drive unit 204, and a control system 206. Referring to FIG. 2B, a top view of the robot 200 with the arm 202 at a retracted position is shown.

Figure 23:
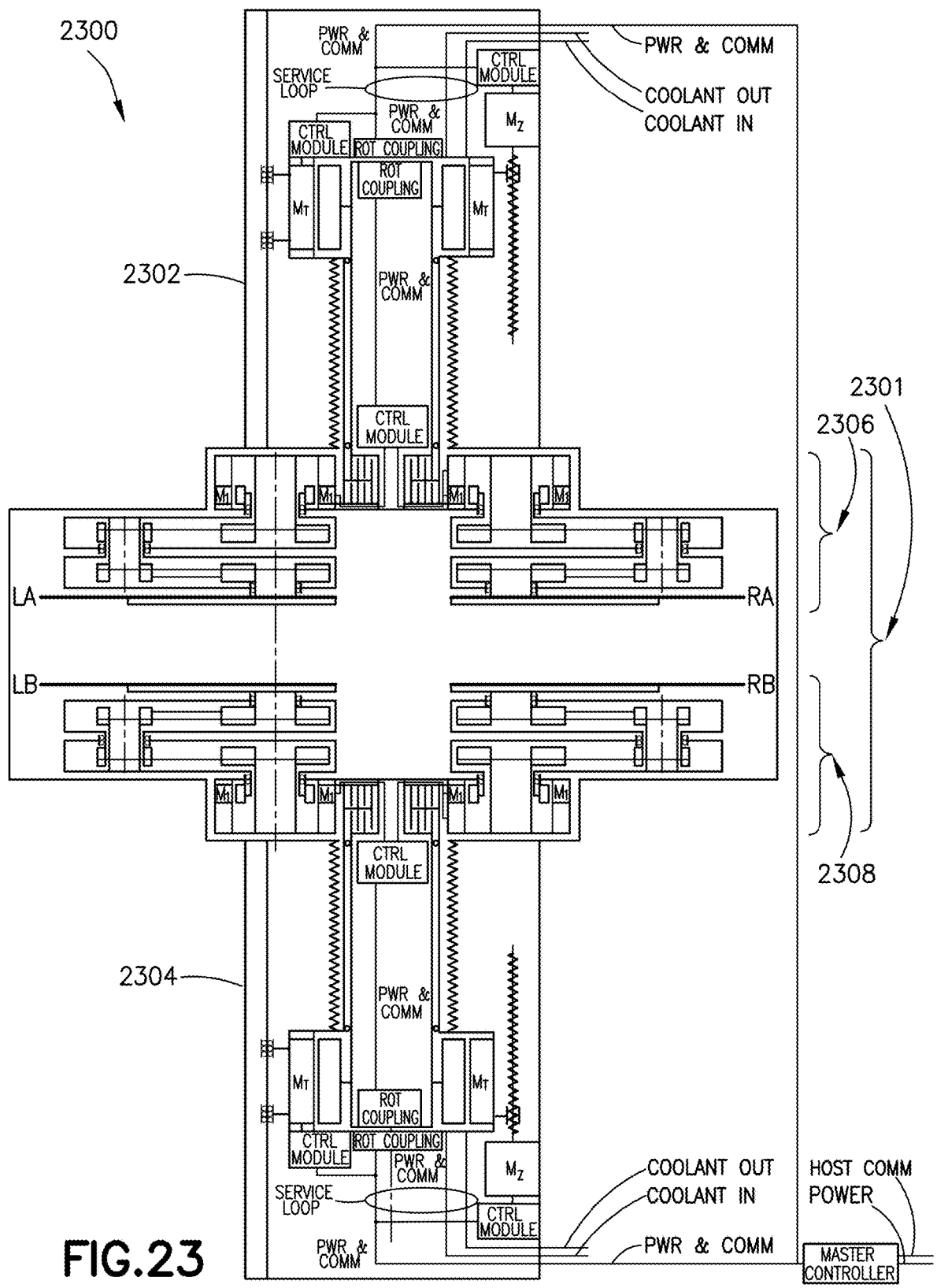
FIG. 23 is a schematic view of an example robot having a first drive and a first arm with a stacked second drive and second arm in an inverted configuration.

Referring to both FIGS. 2A and 23, the robot arm 202 comprises a left linkage 208 and a right linkage 210. The left linkage 208 comprises a left upper arm 212, a left forearm 214, and a left wrist 216 with a left end-effector 218 configured to carry a payload $P_L$. The left upper arm 212 is connected to an outer shaft 220 of the drive unit 204. The left forearm 214 is connected to the left upper arm 212 via a rotary joint 222 (left elbow joint) and is coupled to a middle shaft 224 of the drive unit 204 via a transmission arrangement 226, such as a belt, band, or cable drive. In the example of FIGS. 2A and 2B, the belt, band, or cable drive comprises a left shoulder pulley 221 attached to the middle shaft 224 of the drive unit 204, a first left elbow pulley 223 attached to the left forearm 214 and a belt, band, or cable between the left shoulder pulley 221 and the first left elbow pulley 223. The belt, band, or cable drive utilizes at least one non-circular pulley, such as the left shoulder pulley 221 being non-circular. The left wrist 216 is connected to the left forearm 214 via another rotary joint 228 (left wrist joint) and is coupled to the left upper arm 212 via another transmission arrangement 230, such as a belt, band, or cable drive. In the example of FIGS. 2A and 2B, the belt, band, or cable drive comprises a second left elbow pulley 227 attached to the left forearm 214, a left wrist pulley 229 attached to the left wrist 216, and a belt, band, or cable between the second left elbow pulley 227 and the left wrist pulley 229. The belt, band, or cable drive utilizes at least one non-circular pulley, such as the left wrist pulley 229 being non-circular. The lateral offset of the left end-effector 218 with respect to the left wrist joint is equal to the difference between the joint-to-joint link length of the left upper arm 212 and the joint-to-joint link length of the left forearm 214.

Similarly, the right linkage 210 comprises a right upper arm 240, a right forearm 242, and a right wrist 244 with a right end-effector 246 configured to carry a payload $P_R$. The right upper arm 240 is connected to an inner shaft 225 of the drive unit 204. The right forearm 242 is connected to the right upper arm 240 via a rotary joint 248 (right elbow joint) and is coupled to the middle shaft 224 of the drive unit 204 via a transmission arrangement 250, such as a belt, band, or cable drive. In the example of FIGS. 2A and 2B, the belt, band, or cable drive comprises a right shoulder pulley 270 attached to the middle shaft 224 of the drive unit 204, a first right elbow pulley 271 attached to the right upper arm 240, and a belt, band, or cable between the right shoulder pulley 270 and the first right elbow pulley 271. The belt, band, or cable drive utilizes at least one non-circular pulley, such as the right shoulder pulley 270 being non-circular. The right wrist 244 is connected to the right forearm 242 via another rotary joint 252 (right wrist joint) and is coupled to the right upper arm 240 via another transmission arrangement 254, such as a belt, band, or cable drive. In the example of FIGS. 2A and 2B, the belt, band, or cable drive comprises a second right elbow pulley 283 attached to the right upper arm 240, a right wrist pulley 285 attached to the right wrist 244, and a belt, band, or cable between the second right elbow pulley 283 and the right wrist pulley 285. The belt, band, or cable drive utilizes at least one non-circular pulley, such as the right wrist pulley 285 being non-circular. The lateral offset of the right end-effector 246 with respect to the right wrist joint is equal to the difference between the joint-to-joint link length of the right upper arm 240 and the joint-to-joint link length of the right forearm 242.

The drive unit 204 houses all of the actuators of the example robot 200. The drive unit 204 includes a spindle assembly 256 and a Z-axis mechanism 258. The Z-axis mechanism 258 is configured to move the spindle assembly 256 up and down using motor $M_Z$ 260. The spindle assembly 256 features three coaxial shafts and three motors, each configured to actuate one of the three shafts 220, 224, 225. As explained earlier, the outer shaft 220 is connected to the left upper arm 212, and the outer shaft 220 is actuated by a motor Min 262. The middle shaft 224 is connected to the pulleys coupled to the forearms 214, 242 and is actuated by motor $M_{T2}$ 264. The inner shaft 225 is connected to the right upper arm 240 and is actuated by a motor $M_{T3}$ 266.

The example robot 200 comprises a bellows 265 and a cylindrical barrier between the stators and rotors of motors $M_{T1}$, $M_{T2}$, and $M_{T3}$ to contain the vacuum environment in which the robot arm 202 operates. The bellows 265 is configured to accommodate the up and down motion of the spindle assembly 256.

The control system 206 receives external inputs, for example, from the user or a host system, reads positions of individual motion axes (motors) from position encoders (not shown in FIG. 2A for simplicity), and processes the information to apply voltages to the motors to perform the desired motion and/or achieve the desired position.

Figure 3D:
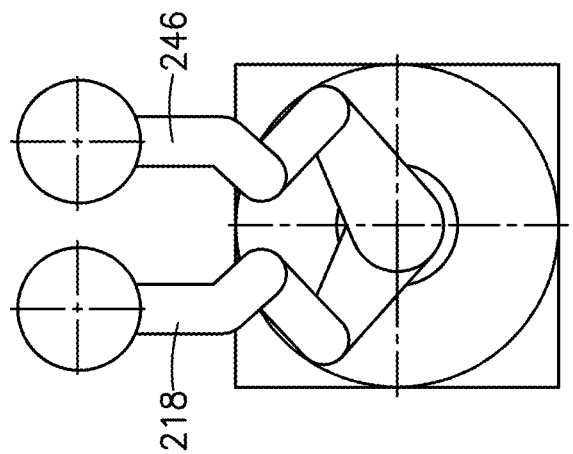
FIGS. 3A-3D are diagrammatic top views of operations of the robot of FIG. 2A.
Figure 3C:
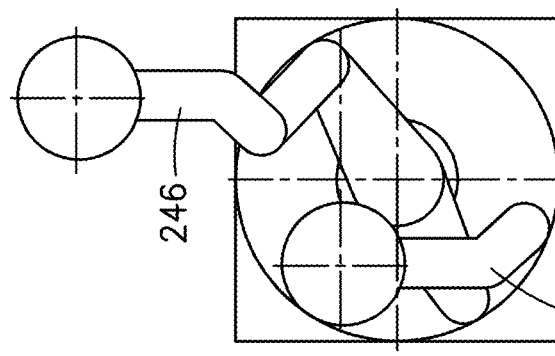
Figure 3B:
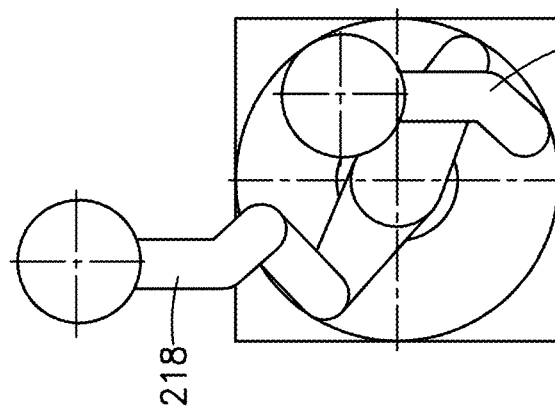
Figure 3A:
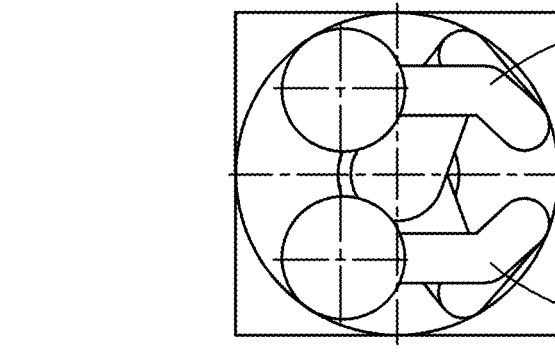

The operation of the example robot 200 of FIGS. 2A and 2B is illustrated in the four diagrams FIG. 3A-3D. As shown in FIG. 3A, both end-effectors 218, 246 are retracted; FIG. 3B shows left end-effector 218 extended; FIG. 3C shows right end-effector 246 extended; and FIG. 3D shows both end-effectors 218, 246 extended simultaneously.

The example robot of FIGS. 2A and 2B employs a number of complex mechanical arrangements, such as multi-stage belt, band, or cable drives with bearings and pulleys necessary to actuate various components of the robot arm 202 by the motors located centrally in the drive unit 204. This limits scalability to configurations with more axes of motion which are needed, for example, for additional linkages to support the operations described with respect to FIGS. 1A-1M. Furthermore, complex mechanical arrangements, such as multi-stage belt, band, or cable drives, limit the performance (such as positioning accuracy and repeatability) of the robot 200.

One example of a distributed-architecture robot comprises features as described herein and may be provided with a robot arm having multiple linkages where actuators (motors) are distributed throughout the structure of the robot, including the robot arm. This may be used to enable robot arm configurations with more linkages and allows for additional motion axes necessary to support the linkages while minimizing the mechanical complexity and improving performance.

Figure 4A:
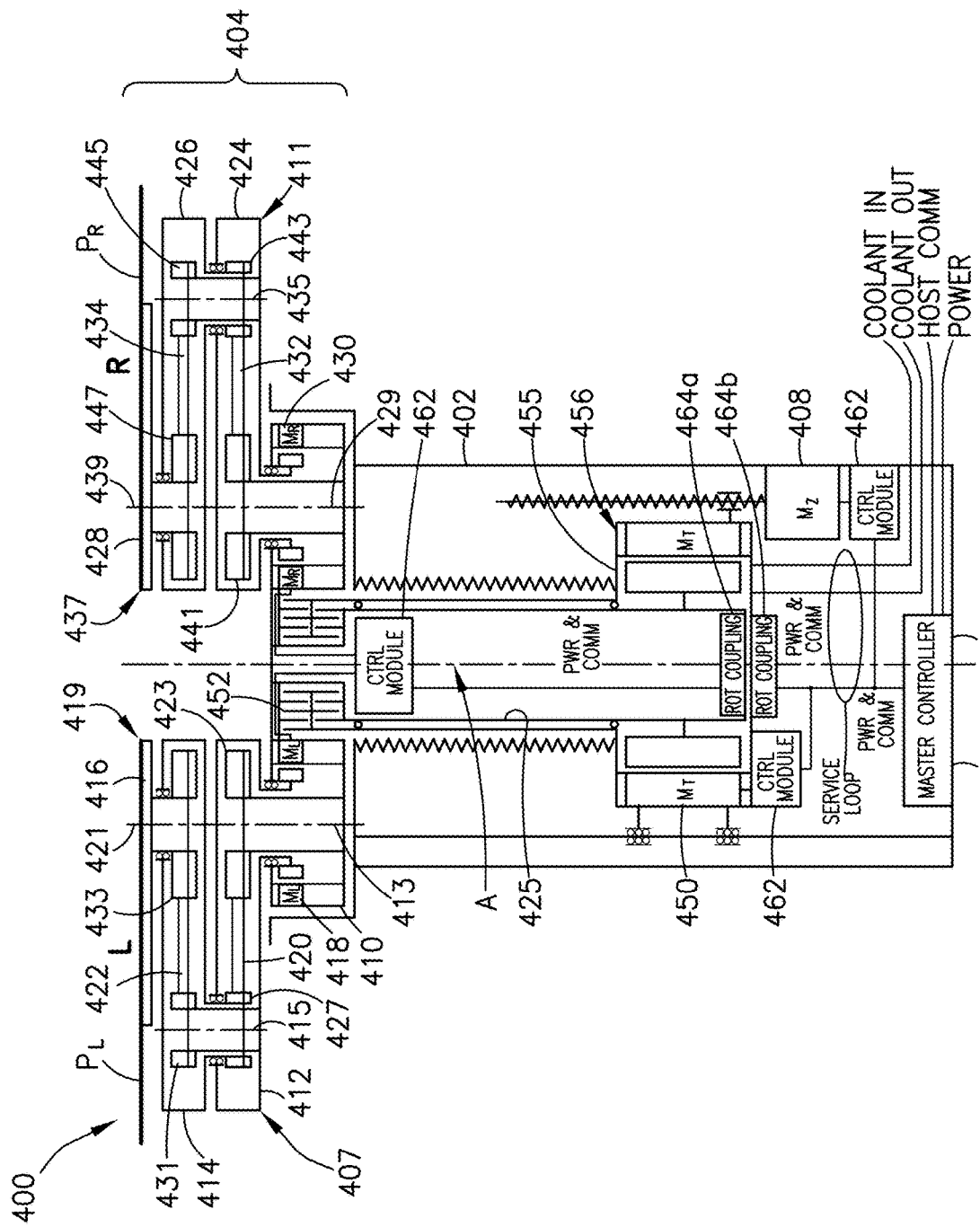
FIG. 4A is a schematic view of one example of a material-handling vacuum-environment robot with actuators in a distributed architecture.
Figure 4B:
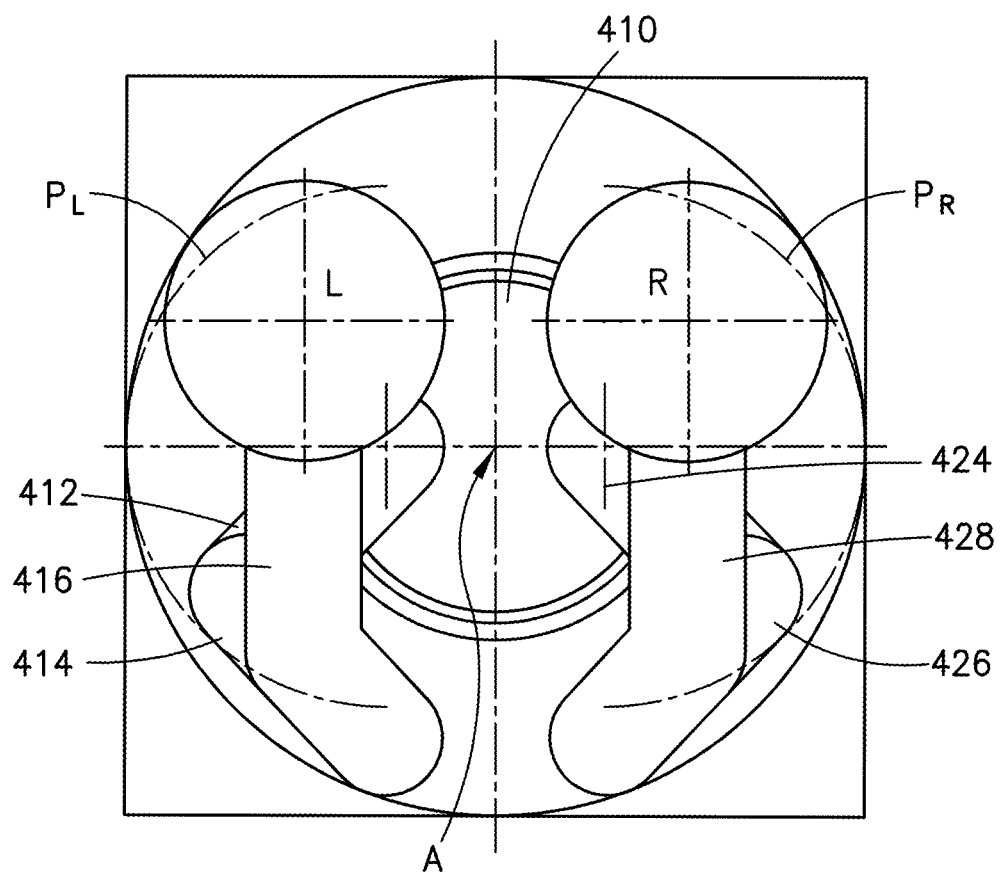
FIG. 4B is a diagrammatic top view of the robot of FIG. 4A.

Referring to FIG. 4A, one example embodiment of a robot 400 using a distributed architecture with regard to actuators may comprise a drive unit 402, a robot arm 404, and a control system 406. For example, the distributed architecture of the robot 400 with regard to the actuators may be the distribution or arrangement of various motors throughout the drive unit and/or robot arm 404 (including the various links) of the robot 400. As depicted in FIG. 4A, a simplified cross-sectional view of the robot 400 with end-effectors 416, 428 of the robot arm 404 in the retracted position is shown. FIG. 4B shows a top view thereof.

The drive unit 402 may include a spindle assembly 456 configured to rotate the robot arm 404 or various portions of the robot arm 404. The spindle assembly 456 may comprise a spindle housing 455, one or more motors 450 ($M_T$), and one or more drive shafts 425. If so desired, the drive unit 402 may further include a vertical lift mechanism 408. The vertical lift mechanism 408 may comprise one or more linear rail-bearing arrangements and a motor-driven ball-screw configured to lift the spindle assembly 456 up or down in the vertical direction.

Considering that the robot arm 404 may operate in a vacuum environment, the spindle assembly 456 of the drive unit 402 may include sealing features and other features that may allow the drive shaft(s) 425 or upper portions of the drive shaft(s) 425 to be in a vacuum environment. As an example, a substantially cylindrical separation barrier between the rotor(s) of the motor(s) and the stator(s) of the motor(s) may be utilized to contain an external atmospheric environment on the stator side (outer side) of the separation barrier and a vacuum environment on the rotor side (inner side) of the separation barrier, in which case the drive shaft(s) 425 may reside in a vacuum environment in their entirety. Alternative sealing arrangements can be found in U.S. Patent Publication No. 2021/0245372, which is hereby incorporated by reference in its entirety.

The robot arm 404 may comprise a pivoting base 410 connected to the drive shaft 425 of the drive unit 402, a left linkage 407, and a right linkage 411. The pivoting base 410 may further include motors configured to drive the left linkage 407 and the right linkage 411, as explained below. In some embodiments, the pivoting base 410, which may be a base pivotally mounted on the drive unit at an axis A, may be circular in cross-section and coaxially aligned with the drive unit 402, which may also be circular in cross-section.

Figure 7:
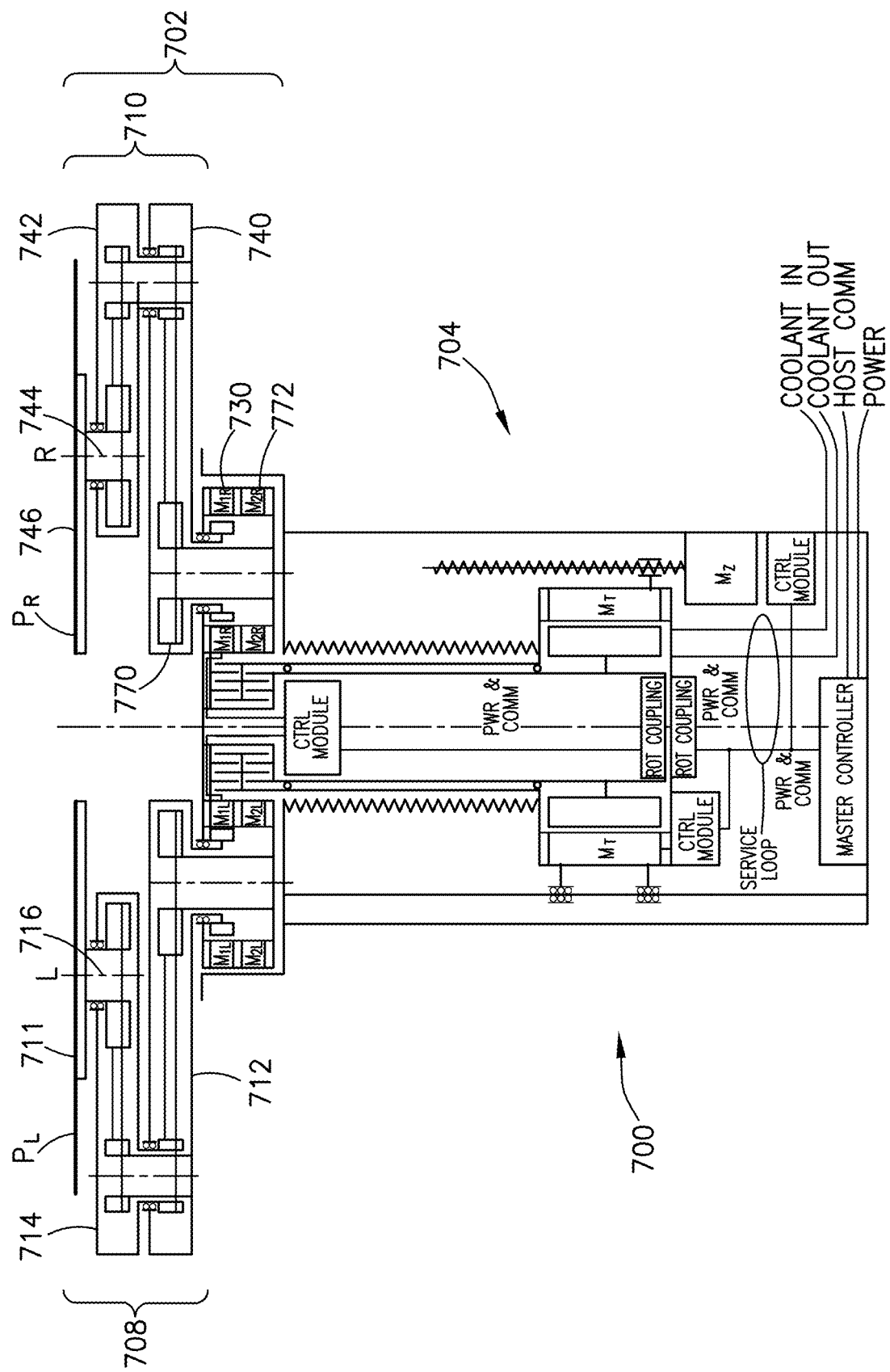
FIGS. 7 and 8A are schematic views of another example of a material-handling vacuum-environment robot having arms in a link-over-link position and with actuators in a distributed architecture.

The left linkage 407 may comprise a first link 412 (left upper arm) coupled to the pivoting base 410 via a rotary joint 413 (left shoulder joint), a second link 414 (left forearm) coupled to the first link 412 (left upper arm) via another rotary joint 415 (left elbow joint), and a third link 419 (left wrist) coupled to the second link 414 via yet another rotary joint 421 (left wrist joint). As shown in FIG. 4A, the joint-to-joint length of the first link 412 may be substantially equal to the joint-to-joint length of the second link 414. Alternatively, the joint-to-joint length of the first link 412 may be less or greater than the joint-to-joint length of the second link 414 (an example arm with unequal link lengths is shown in FIG. 7). The third link 419 may carry or comprise an end-effector (left end-effector 416) configured to receive a payload $P_L$.

The first link 412 of the left linkage 407 may be driven by an actuator, for example, an electric motor 418 (motor $M_L$), attached to the pivoting base 410 of the arm 404.

The second link 414 of the left linkage 407 may be actuated via a transmission arrangement 420 between the pivoting base 410 and the second link 414, which may be configured so that the left wrist joint moves along a straight line (in particular a line radial with respect to the rotary joint 413 (left shoulder joint) or parallel to such a radial line) when the first link 412 rotates around the rotary joint 413 (left shoulder joint). As an example, the transmission arrangement 420 may comprise a left shoulder pulley 423 attached to the pivoting base 410, a first left elbow pulley 427 attached to the second link 414, and a belt, band, or cable between the two pulleys. Considering the example where the joint-to-joint lengths of the first link 412 and the second link 414 are substantially equal, the two pulleys may have substantially circular profiles, and the effective radius of the left shoulder pulley 423 may be twice the effective radius of the first left elbow pulley 427. Alternatively, if the joint-to-joint lengths of the first link 412 and the second link 414 are not equal, at least one of the pulleys, for example the left shoulder pulley 423, may feature a non-circular profile.

The motion of the third link 419 of the left linkage 407 may be constrained via a transmission arrangement 422 between the first link 412 and the third link 419, which may be configured to maintain a constant orientation, for example, radial orientation, of the third link 419 when the first link 412 and second link 414 rotate. As an example, the transmission arrangement may comprise a second left elbow pulley 431 attached to the first link 412, a left wrist pulley 433 attached to the third link 419, and a belt, band, or cable between the two pulleys. Considering the example where the joint-to-joint lengths of the first link 412 and second link 414 are substantially equal, the two pulleys may have substantially circular profiles, and the effective radius of the left wrist pulley 433 may be twice the effective radius of the second left elbow pulley 431. Alternatively, if the joint-to-joint lengths of the left upper arm (first link 412) and left forearm (second link 414) are not equal, at least one of the pulleys, for example the left wrist pulley 433 may feature a non-circular profile. Examples of robot arms with unequal link lengths and non-circular pulleys are shown and described in U.S. Pat. Nos. 9,149,936 and 10,224,232, which are hereby incorporated by reference in their entireties.

Similar to the left linkage 407, the right linkage 411 may comprise a first link 424 (right upper arm) coupled to the pivoting base 410 via a rotary joint 429 (right shoulder joint), a second link 426 (right forearm) coupled to the first link 424 via another rotary joint 435 (right elbow joint), and a third link 437 (right wrist) coupled to the second link 426 via another rotary joint 439 (right wrist joint). As shown in FIG. 4A, the joint-to-joint length of the first link 424 may be substantially equal to the joint-to-joint length of the second link 426. Alternatively, the joint-to-joint length of the first link 424 may be less or greater than the joint-to-joint length of the second link 426. The third link 437 may also carry or comprise an end-effector (right end-effector 428) configured to receive a payload $P_R$.

The first link 424 of the right linkage 411 may be driven by an actuator, for example, an electric motor (motor $M_R$) 430, attached to the pivoting base 410 of the arm 404.

The second link 426 of the right linkage 411 may be actuated via a transmission arrangement 432 between the pivoting base 410 and the second link 426, which may be configured so that the right wrist joint moves along a straight line (in particular a line radial with respect to the right shoulder joint or parallel to such a radial line) when the first link 424 rotates around the right shoulder joint. As an example, the transmission arrangement 432 may comprise a right shoulder pulley 441 attached to the pivoting base 410, a first right elbow pulley 443 attached to the second link 426, and a belt, band, or cable between the two pulleys. Considering the example where the joint-to-joint lengths of the first link 424 and the second link 426 are substantially equal, the two pulleys may have substantially circular profiles, and the effective radius of the right shoulder pulley 441 may be twice the effective radius of the first right elbow pulley 443. Alternatively, if the joint-to-joint lengths of the first link 424 and second link 426 are not equal, at least one of the pulleys, for instance the left shoulder pulley, may feature a non-circular profile. Examples of robot arms with unequal link lengths and non-circular pulleys are shown and described in U.S. Pat. Nos. 9,149,936 and 10,224,232, which are hereby incorporated by reference in their entireties.

The motion of the third link 437 of the right linkage 411 may be constrained via a transmission arrangement 434 between the first link 424 and the third link 437, which may be configured to maintain a constant orientation, for example, radial orientation, of the third link 437 when the first link 424 and second link 426 rotate. As an example, the transmission arrangement may 434 comprise a second right elbow pulley 445 attached to the first link 424, a right wrist pulley 447 attached to the third link 437, and a belt, band, or cable between the two pulleys. Considering the example where the joint-to-joint lengths of the first link 424 and second link 426 are substantially equal, the two pulleys may have substantially circular profiles, and the effective radius of the right wrist pulley may be twice the effective radius of the second right elbow pulley. Alternatively, if the joint-to-joint lengths of the first link 424 and second link 426 are not equal, at least one of the pulleys, for instance the right wrist pulley, may feature a non-circular profile. Examples of robot arms with unequal link lengths and non-circular pulleys are shown and described in U.S. Pat. Nos. 9,149,936 and 10,224,232, which are hereby incorporated by reference in their entireties.

The entire robot arm 404 can be rotated by moving the drive shaft 425 of the drive unit 402 using motor $M_T$ 450. The end-effector of the left linkage 407 (left end-effector 416) can be extended along a substantially straight line by moving the first link 412 of the left linkage 407 using motor $M_L$ 418. The end-effector of the right linkage 411 (right end-effector 428) can be extended along a substantially straight line by moving the first link 424 of the right linkage 411 using motor $M_R$ 430.

In order to remove heat from the pivoting base 410 of the robot arm 404, including the heat generated by the actuators attached to the pivoting base 410, a rotary thermal coupling 452 may be utilized between the pivoting base 410 of the robot arm 404 and the housing 455 of the spindle assembly 456 of the drive unit 402.

Figure 35B:
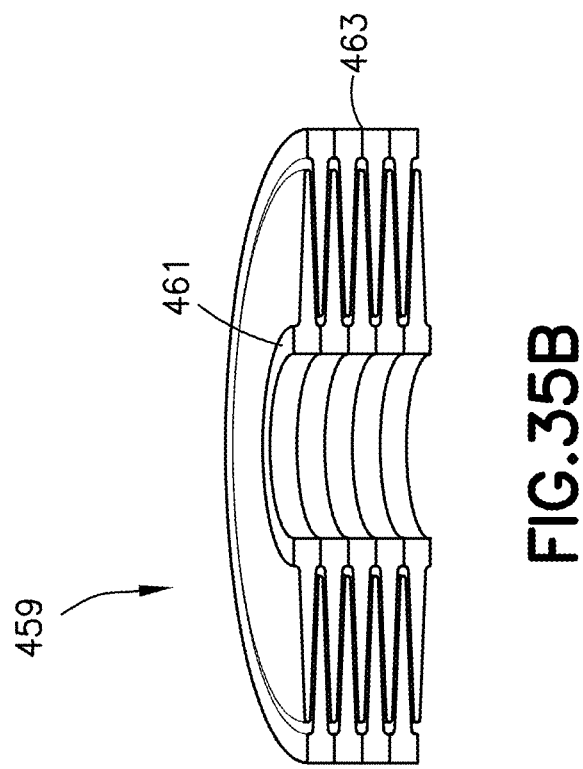
FIGS. 35A and 35B are example embodiments of rotary thermal couplings.
Figure 35A:
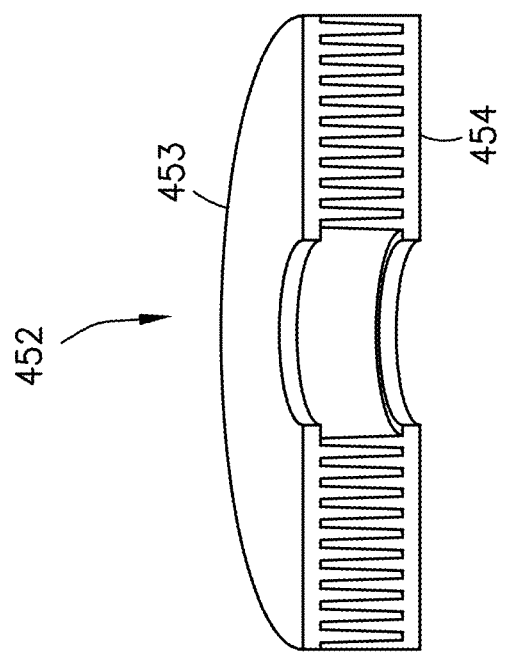

Referring now to FIG. 35A, one example of a rotary thermal coupling 452 may comprise a first portion 453 and a second portion 454, each of the first portion 453 and the second portion 454 comprising one or more substantially cylindrical surfaces aligned coaxially with the corresponding rotary joint and arranged so that a cylindrical surface on one portion of the rotary thermal coupling 452 faces an opposing cylindrical surface on the other portion of the rotary thermal coupling 452. The opposing cylindrical surfaces may be configured to transfer heat via radiation across a gap between the opposing substantially cylindrical surfaces of the rotary thermal coupling 452. The radiation mechanism may be supplemented by convection/conduction through the environment between the opposing substantially cylindrical surfaces of the rotary thermal power coupling 452 if residual gases are present in the vacuum environment.

As illustrated in the example of FIG. 35A, in order to increase the effective area and minimize the volume occupied by the example rotary thermal coupling 452, an array of substantially cylindrical features, fins, or similar structures may be provided on each of the first portion 453 and the second portion 454 of the rotary thermal coupling 452, and the two arrays may be arranged in an interleaving manner.

Alternatively, as depicted in the example of FIG. 35B showing another example embodiment of a rotary thermal coupling at 459, a first portion 461 and a second portion 463 of the rotary thermal coupling 459 may provide opposing disk-shaped features configured for contactless heat transfer across a gap between the first portion 461 and the second portion 463. As another alternative, any other suitable shape of the effective features of the rotary thermal coupling 459, including but not limited to conical shapes, spherical shapes, fins, and combinations thereof may be utilized.

The effective surfaces of the example rotary thermal coupling 452 of FIG. 35A and the example rotary thermal coupling 459 of FIG. 35B may be treated to improve their thermal emissivity. For example, the two portions 453, 454 of the rotary thermal coupling 452, as well as the two portions 461, 463 of the rotary thermal coupling 459, may be made of aluminum and the effective surfaces may be anodized.

In order for the example rotary thermal coupling 452 (or the example rotary thermal coupling 459) to facilitate heat transfer between the pivoting base 410 of the robot arm 404 and the housing 455 of the spindle assembly 456 of the drive unit 402, one portion of the rotary thermal coupling 452 (or the rotary thermal coupling 459) may be attached to the pivoting base 410 of the robot arm 404 and the other portion of the rotary thermal coupling 452 (or the rotary thermal coupling 459) may be attached to the housing 455 of the spindle assembly 456 of the drive unit 402 in an arrangement substantially coaxial with the axis of rotation of the drive shaft(s) 425 of the drive unit 402. Alternatively, the features of the rotary thermal coupling 452 (or the rotary thermal coupling 459) may be incorporated directly into the pivoting base 410 of the robot arm 404 and/or into the housing of the spindle assembly 456 of the drive unit 402.

The housing 455 of the spindle assembly 456 of the drive unit 402 (spindle housing) may be passively or actively (liquid, forced-air) cooled. Alternatively, in particular if the drive unit 402 features a lift mechanism, the surfaces of the housing 455 and the frame of the drive unit 402 that face each other may be configured to facilitate heat transfer from the housing 455 to the frame of the drive unit 402. As an example, the housing 455 and the frame of the drive unit 402 may feature interleaving features, for example, fins, to increase the effective area available for heat transfer while allowing for vertical motion of the spindle assembly 456 with respect to the frame of the drive unit 402. Again, the effective surfaces may be treated to improve their thermal emissivity. For example, the components may be made of aluminum and the effective surfaces may be anodized.

Additional and alternative thermal management arrangements and features can be found in U.S. Pat. No. 10,569,430 and U.S. Patent Publication No. 2021/0245372, filed on Feb. 10, 2021, which are hereby incorporated by reference in their entireties.

Referring back to FIG. 4A, the control system 406 of the example robot 400 may feature a distributed architecture. The control system 406 may include a master controller 460, which may be complemented by various control modules 462 located in the robot arm 404 and/or drive unit 402, each control module 462 being responsible for control of one or more motion axes of the robot 400. For example, the distributed architecture of the control system 406 may be embodied in the distribution or arrangement of the various control modules 462 throughout the robot arm 404 and/or the drive unit 402. The master controller 460 may coordinate the various control modules 462, for example, over a communication network, for example, a high-speed communication network, such as EtherCAT. The master controller 460 may be located in the drive unit 402 of the robot 400, as depicted in the example of FIG. 4A. Alternatively, the master controller 460 may be located outside of the drive unit 402 of the robot 400, as illustrated, for example, in FIG. 28A. As another alternative, a centralized control solution may be utilized.

In order to provide power to the active components in the robot arm 404, for example, the control module 462 located in the pivoting base 410 of the robot arm 404 in the example of FIG. 4A, and to communicate with them, the robot 400 may also employ one or more rotary couplings 464a, 464b. Each rotary coupling 464a, 464b may include a power coupling configured to transmit power through a rotary joint and/or a communication link configured to transmit communication signals through a rotary joint. For example, as indicated in FIG. 4A, the rotary coupling 464a, 464b may be utilized to transmit power from the spindle assembly 456 to the pivoting base 410 of the robot arm 404 and to transmit communication signals between the spindle assembly 456 and the pivoting base 410 of the robot arm 404.

The rotary coupling(s) 464a, 464b may operate on various physical principles and their combinations, including a slip-ring arrangement, which may comprise one or more electrically conductive rings, each in contact with one or more electrically conductive brushes, a slip-ring arrangement wetted by an electrically conductive fluid, such as an ionic liquid, a contactless capacitive coupling, and a contactless inductive coupling.

Figure 36:
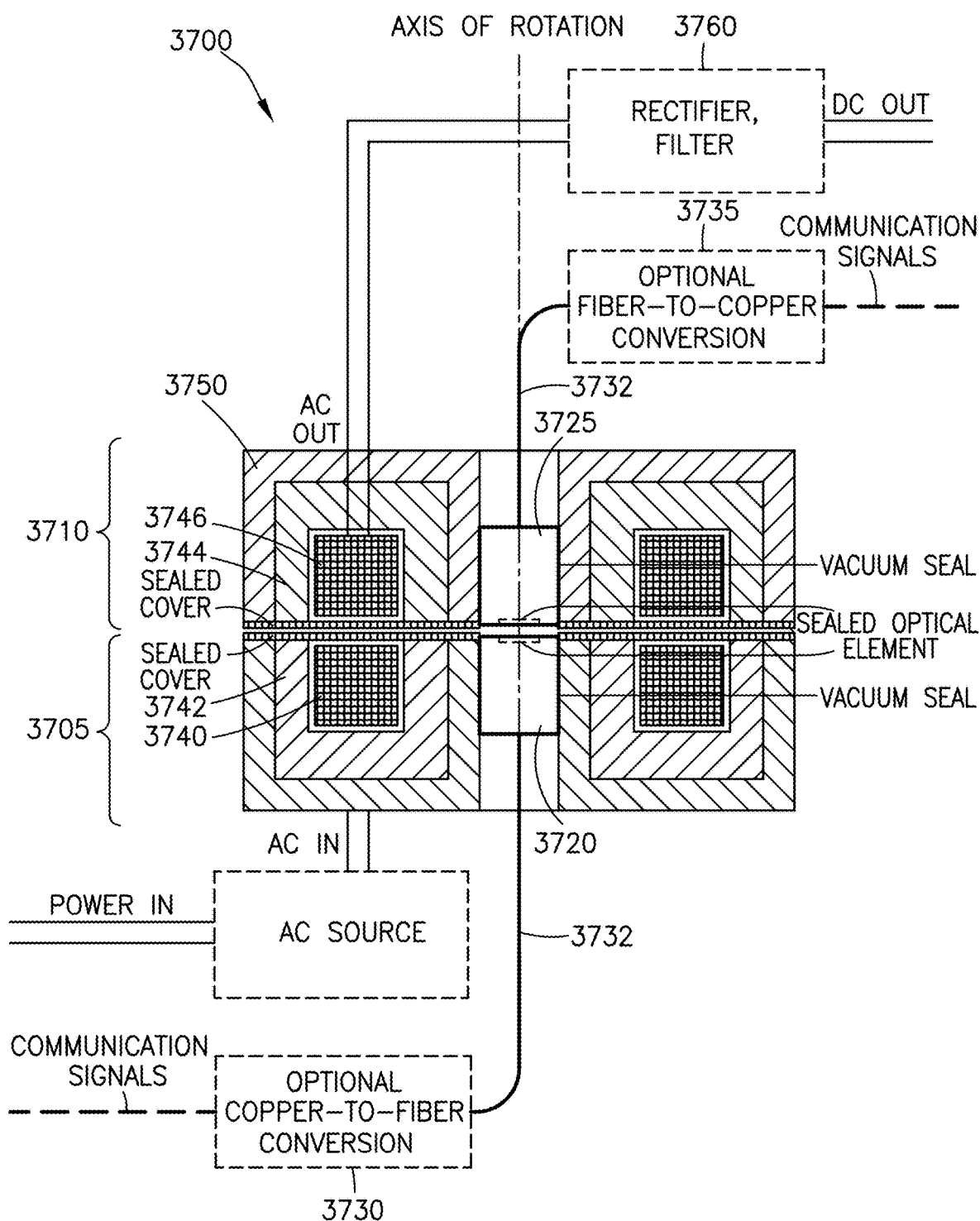
FIG. 36 is a schematic view of one example embodiment of a coupling integrating power and communication functions.

Referring now to FIG. 36, one example of an integrated rotary coupling embodied in the rotary couplings 464a, 464b, which may include an inductive power coupling and an optical communication link, is shown generally at 3700 and is hereinafter referred to as "power coupling 3700." The integrated rotary coupling 3700 may feature two portions, a lower portion 3705 stationary with respect to the housing 455 of the spindle assembly 456 and an upper portion 3710 rotating together with the pivoting base 410 of the robot arm 404.

The power coupling 3700 may operate on an inductive principle, such as described in U.S. Patent Application Publication Nos. 2016/0229296, 2018/0105044, and 2018/0105045, for example, which are hereby incorporated by reference in their entireties. The power coupling 3700 may be utilized to supply electric power to the control module(s) 462 and directly or indirectly to other active devices, such as position encoders and other sensors, in the robot arm 404. For example, power from an AC source may be transmitted through an arrangement of a primary coil 3740 and a primary core 3742 on the stationary lower portion 3705 to a secondary core 3744 and secondary coil 3746 on the upper portion 3710, the coils and cores being contained in a split housing 3750. The power out from the secondary coil 3746 and the secondary core 3744, as AC, may be rectified and filtered in a rectifying filter 3760 and output as DC.

The example communication link of the power coupling 3700 may include two optical communication modules, for example, a first optical communication module 3720 that is stationary with respect to the housing 455 of the spindle assembly 456 and a second optical communication module 3725 that rotates together with the pivoting base 410 of the robot arm 404. Incoming communication signals may be converted to optical signals using a copper-to-fiber conversion unit 3730, the converted optical signals being transmitted to the first optical communication module 3720 using a fiber-optic cable 3732. Once transmitted through the first optical communication module 3720, the optical signals are received into the second optical communication module 3725, transmitted through fiber optic cable 3732, and received into a fiber-to-copper conversion unit 3735 where the optical signals are returned to electrical (non-optical) communication signals. The first optical communication module 3720 and the second optical communication module 3725 provide an optical communication link that may facilitate contactless data transfer between the spindle assembly 456 and the pivoting base 410 of the robot arm 404. As an example, the optical communication link may be incorporated into the communication network of the control system 460 and facilitate bidirectional data transfer to and from the control module(s) 462 located in the robot arm 404.

The two portions 464a, 464b of the integrated rotary coupling may be maintained in alignment utilizing the bearing of the rotary joint of the robot 400, or an additional bearing may be utilized in the integrated rotary coupling 3700 to maintain a high degree of alignment regardless of potential compliance of the structure of the robot 400 under various static and dynamic load conditions.

A more detailed description of the above arrangements that may be utilized to support the architecture with distributed actuators as well as additional and alternative suitable arrangements can be found in U.S. Patent Publication No. 2021/0245372, which is hereby incorporated by reference in its entirety.

Figure 5A:
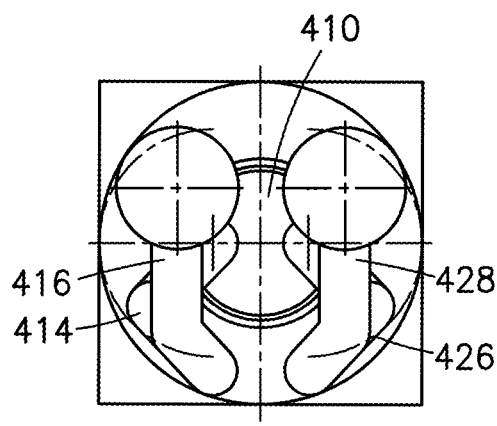
FIGS. 5A-5D are diagrammatic top views of operations of the robot of FIG. 4A.
Figure 5B:
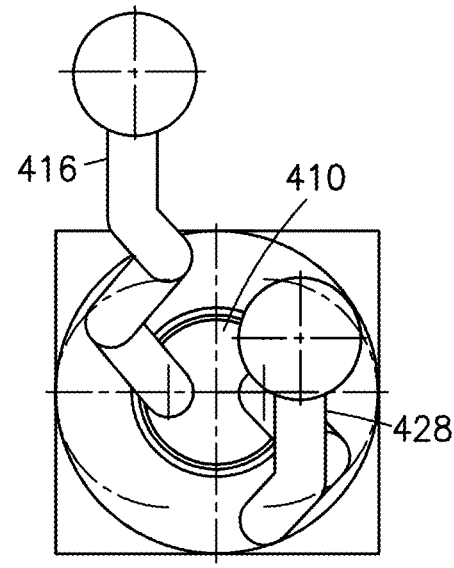
Figure 5C:
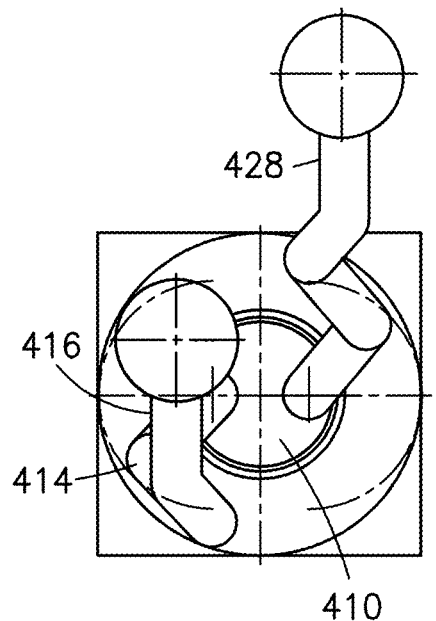
Figure 5D:
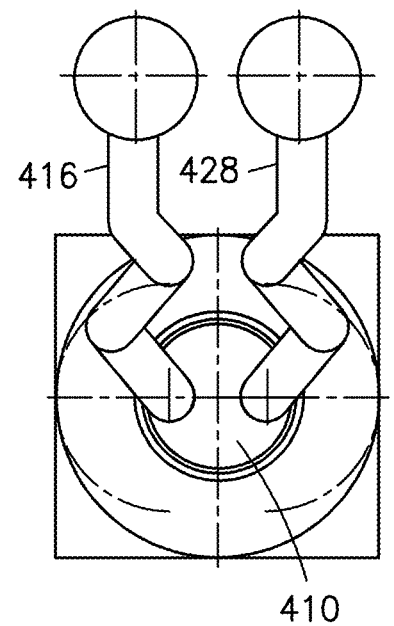

Referring now to FIGS. 5A-5O, the operation of the example robot 400 is shown. FIG. 5A shows both end-effectors 416, 428 retracted; FIG. 5B shows the left end-effector 416 extended; FIG. 5C shows the right end-effector 428 extended; and FIG. 5D shows both end-effectors 416, 428 extended.

Figure 6A:
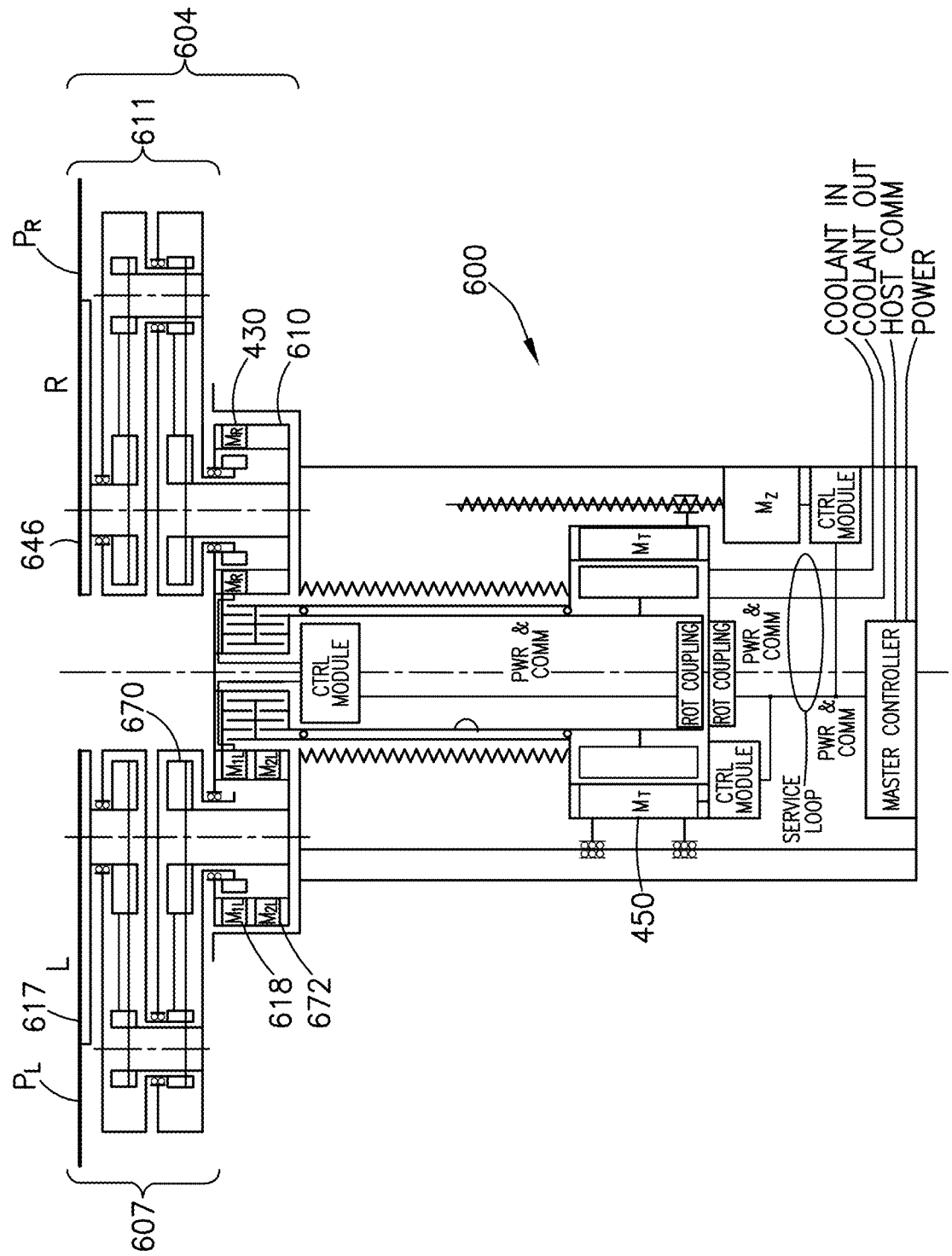
FIG. 6A is a schematic view of another example of a material-handling vacuum-environment robot with actuators in a distributed architecture.
Figure 6B:
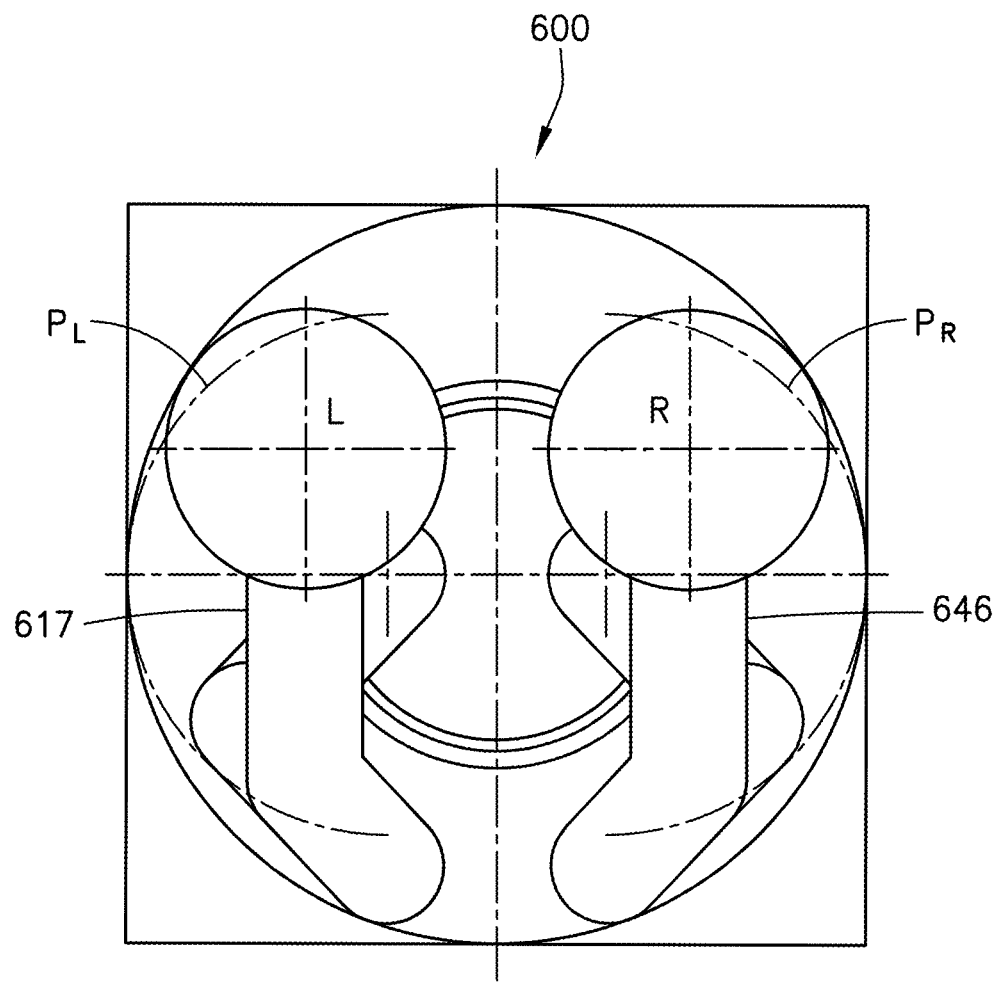
FIG. 6B is a diagrammatic top view of the robot of FIG. 6A.

Referring now to FIGS. 6A and 6B, another example embodiment of the robot according to the present invention is shown as "robot 600." The example embodiment of FIGS. 6A and 6B may be substantially the same as the example embodiment of FIGS. 4A and 4B except that the left shoulder pulley 670 may not be attached directly to a pivoting base 610 of a robot arm 604. Instead, the left shoulder pulley 670 may be actuated with respect to the pivoting base 610 of the robot arm 604 by an additional motor (motor $M_{2L}$) 672, which may be attached to the pivoting base 610 of the robot arm 604 and arranged coaxially with motor $M_{1L}$ 618.

An entire left linkage 607 of the robot arm 604 can be rotated by moving motors $M_{1L}$ 618 and $M_{2L}$ 672 in synchronization by the desired amount of rotation. This can be used, for example, to adjust the direction in which the end-effector of the left linkage 607 (and a left end-effector 617) may be extended. The left end-effector 617 then can be extended in a given direction along a substantially straight line by moving the first link of the left linkage using motor $M_{1L}$ 618 while keeping motor $M_{2L}$ 672 stationary.

It should be noted that the additional motor (motor $M_{2L}$) 672 may provide another degree of freedom that may allow the two end-effectors 617, 646 of the robot arm 604 to be positioned independently (within a certain range) in a horizontal plane. The positions of the two end-effectors 617, 646 in a horizontal plane may be defined by four independent coordinates; for example, Cartesian coordinates $x_L$ and $y_L$ may represent position of the left end-effector 617 and Cartesian coordinates $x_R$ and $y_R$ may represent position of the right end-effector 646. Consequently, four independently controlled axes of motion (degrees of freedom) may be required to position the two end-effectors 617, 646 of the robot arm 604 independently. In the particular example of FIGS. 6A and 6B, motors $M_T$, $M_{1L}$, $M_{2L}$, and $M_R$ may be utilized for this purpose.

The capability of positioning the two end-effectors 617, 646 of the robot arm 604 independently may be conveniently utilized to compensate for misalignment of a payload on the left end-effector 617 and, simultaneously, for misalignment of a payload on the right end-effector 646 when the two payloads are being delivered concurrently to a pair of workstations (such as in FIG. 5D).

Figure 8A:
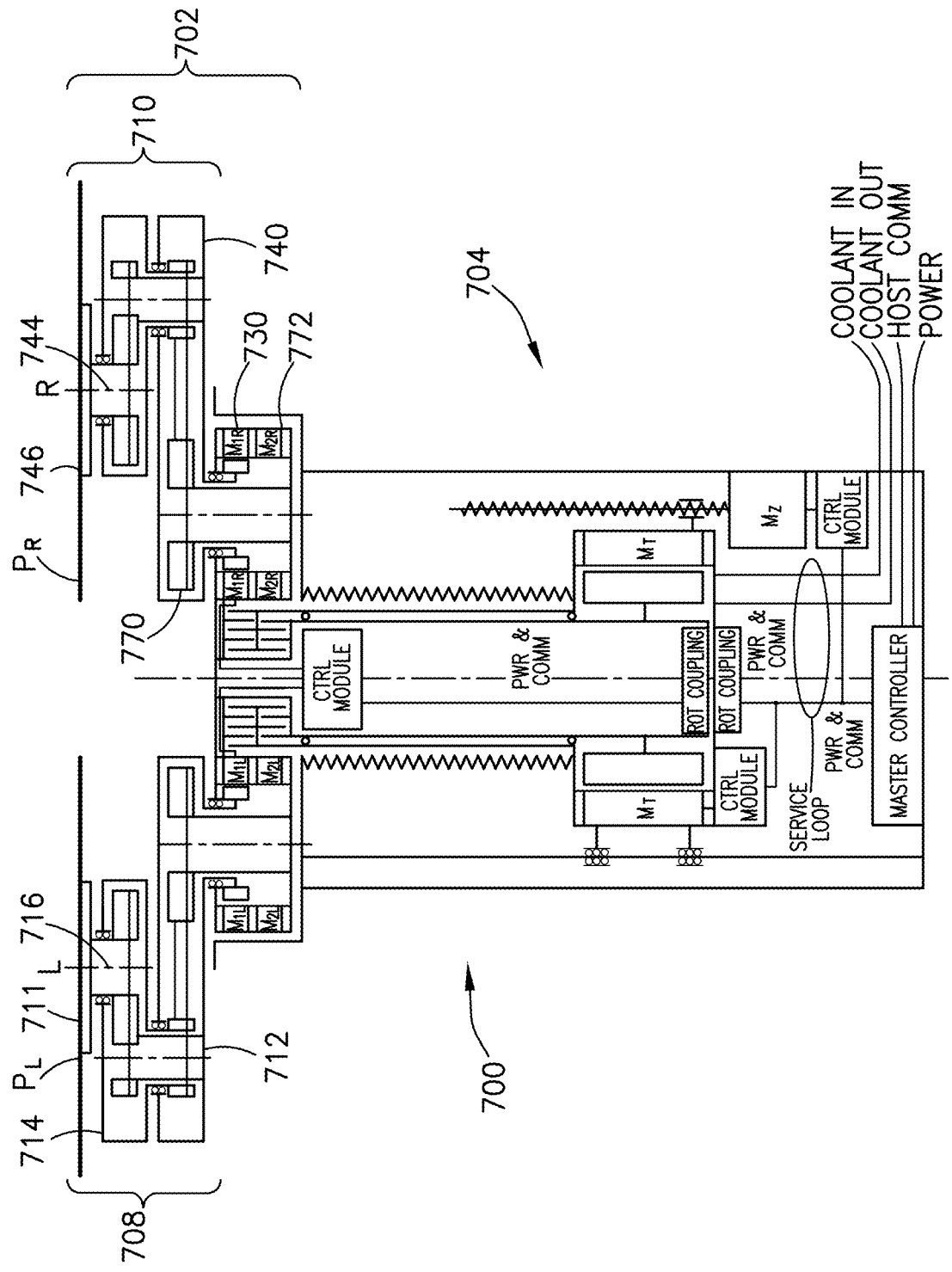
Figure 8B:
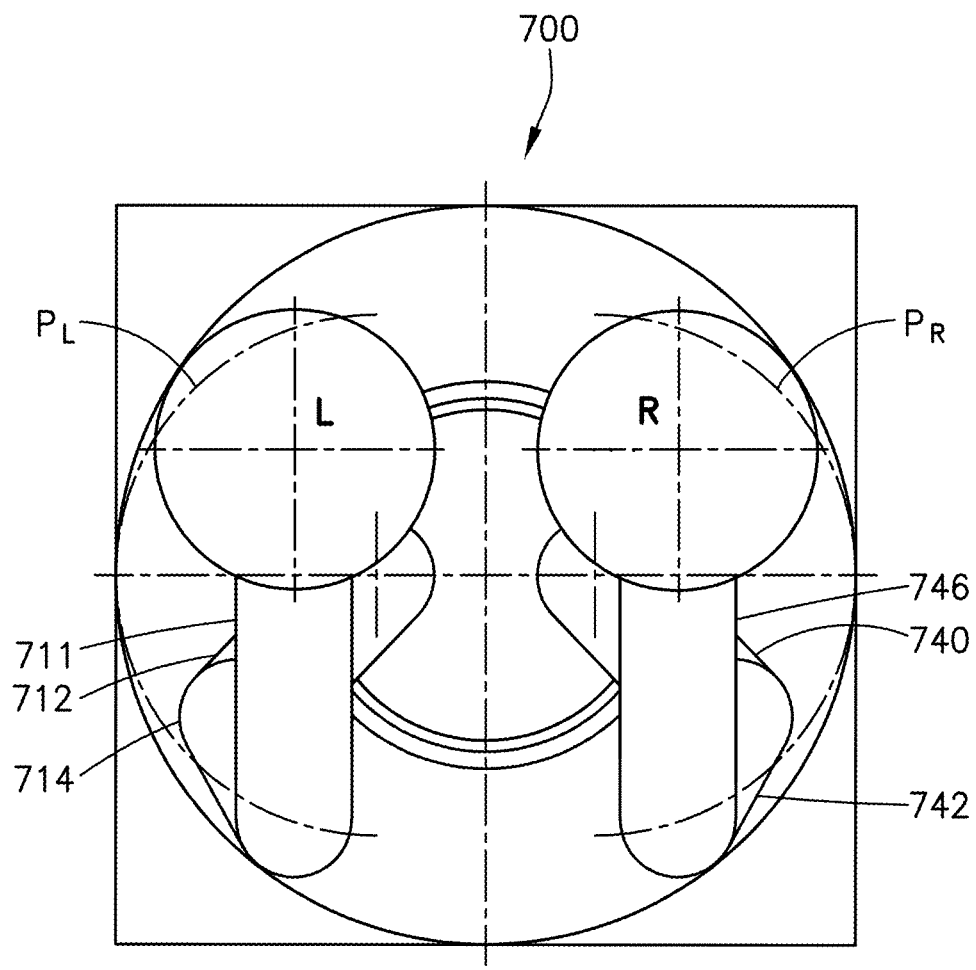
FIG. 8B is a diagrammatic top view of the robot of FIGS. 7 and 8A.

Referring now to FIGS. 7, 8A, and 8B, another example embodiment of robot according to the present invention is shown generally at 700. Robot 700 comprises a drive unit 704 and a robot arm 702 coupled thereto, the robot arm 702 being in a link-over-link position to provide an unobstructed view of the internal components of the robot arm 702. The robot arm 702 comprises a left linkage 708 and a right linkage 710. The left linkage 708 comprises a left upper arm 712, a left forearm 714, and a left wrist 716 with a left end-effector 711 configured to carry a payload $P_L$. Similarly, the right linkage 710 comprises a right upper arm 740, a right forearm 742, and a right wrist 744 with a right end-effector 746 configured to carry a payload $P_R$.

FIGS. 8A and 8B show the robot arm 702 with the end-effectors 711, 746 in the retracted position. The structure of the example embodiment of FIGS. 7, 8A, and 8B may be substantially the same as the example embodiment of FIGS. 6A and 6B except that the right linkage 710 may be configured as a mirror image of the left linkage 708. This means that the right shoulder pulley 770 may no longer be attached directly to the pivoting base 710 of the robot arm 702. Instead, the right shoulder pulley 770 may be actuated with respect to the pivoting base 710 of the robot arm 702 by an additional motor (motor $M_{2R}$) 772, which may be attached to the pivoting base 710 of the robot arm 702 and arranged coaxially with motor $M_{1R}$ 730.

In this configuration, similarly to the left linkage 708 of the robot arm 702, the right linkage 710 can be rotated by moving motors $M_{1R}$ 730 and $M_{2R}$ 772 in synchronization by the desired amount of rotation. This can be used, for instance, to adjust the direction in which the end-effector 746 of the right linkage 710 (right end-effector) may be extended. The right end-effector 746 then can be extended in a given direction along a substantially straight line by moving the first link of the right linkage 710 using motor $M_{1R}$ 730 while keeping motor $M_{2R}$ 772 stationary.

Figure 9A:
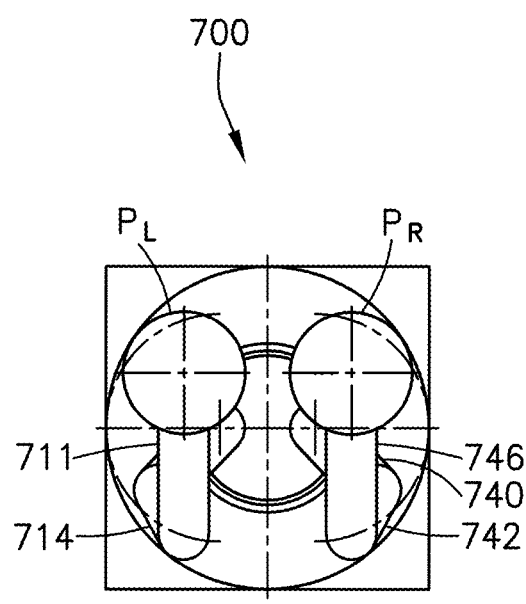
FIGS. 9A-9L are diagrammatic top views of operations of the robot of FIGS. 7 and 8A.
Figure 9B:
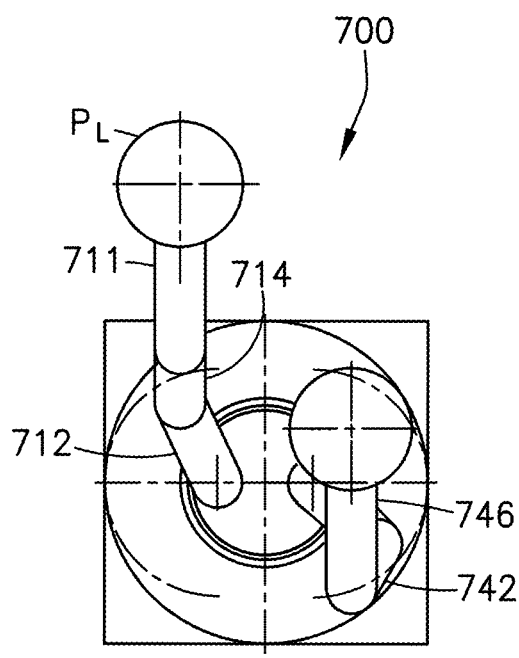
Figure 9C:
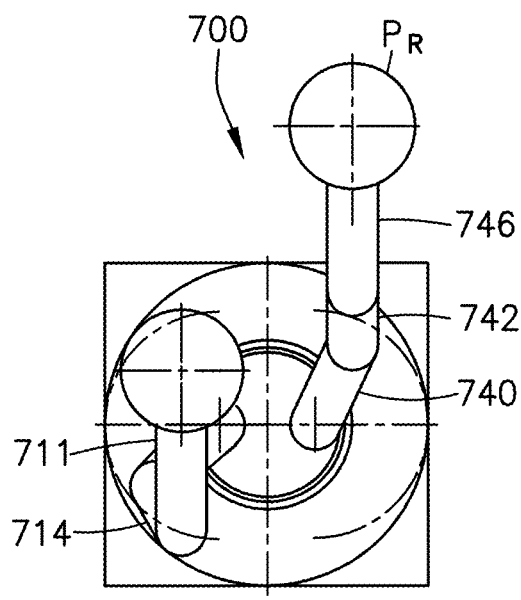
Figure 9D:
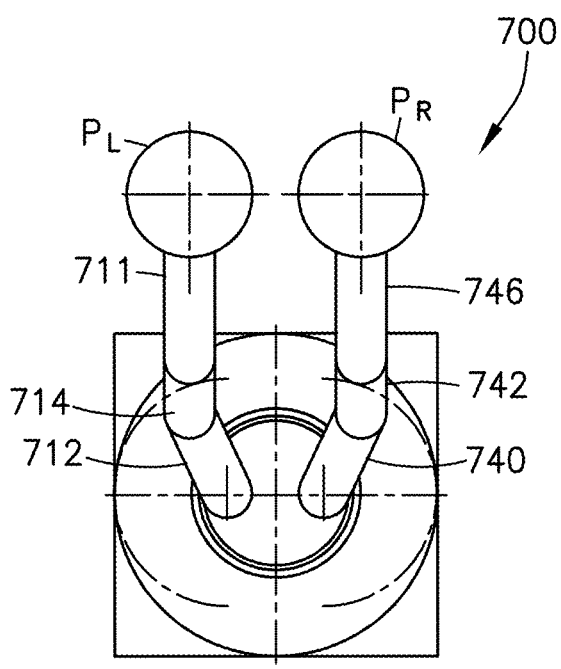
Figure 9E:
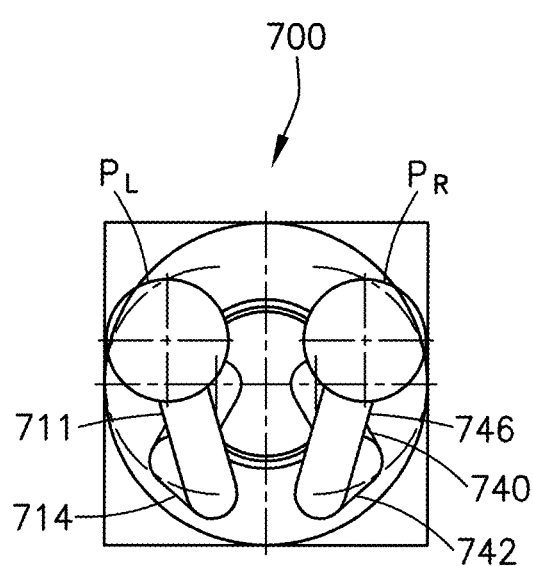
Figure 9F:
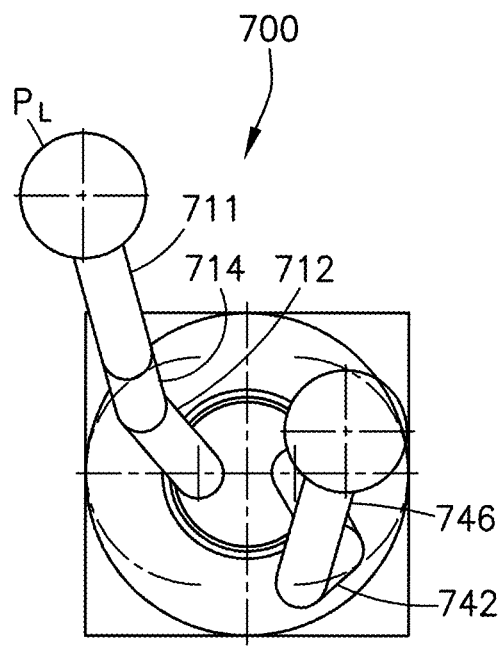
Figure 9G:
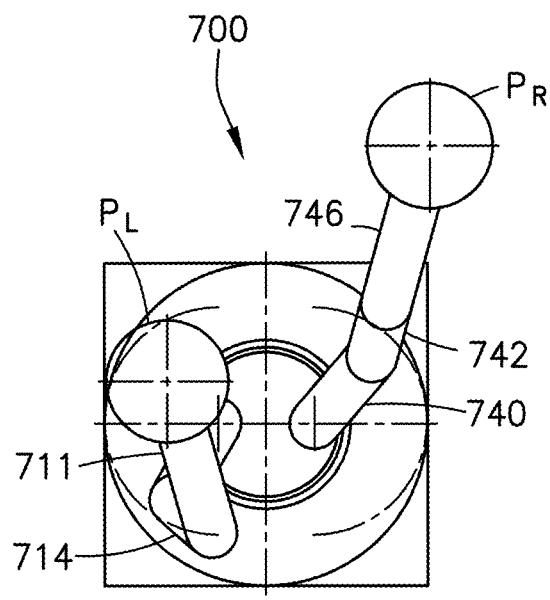
Figure 9H:
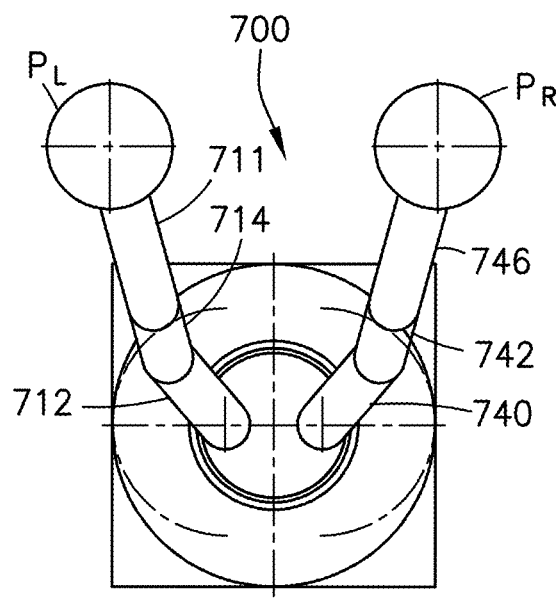
Figure 9I:
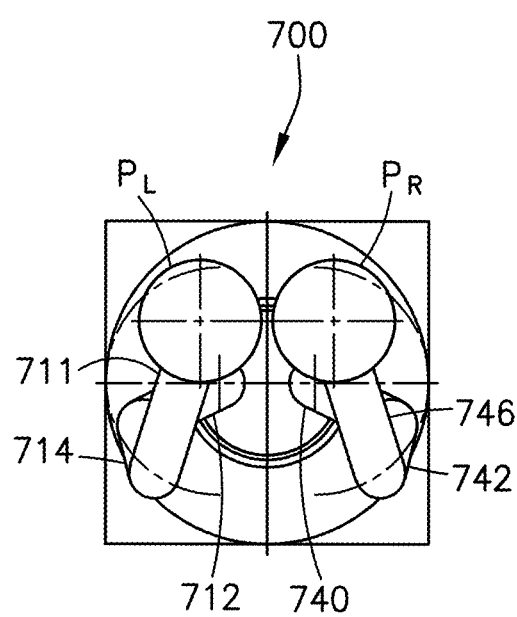
Figure 9J:
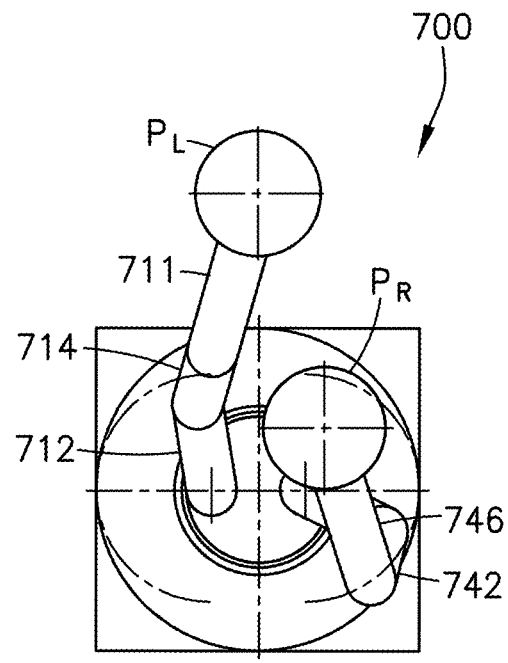
Figure 9K:
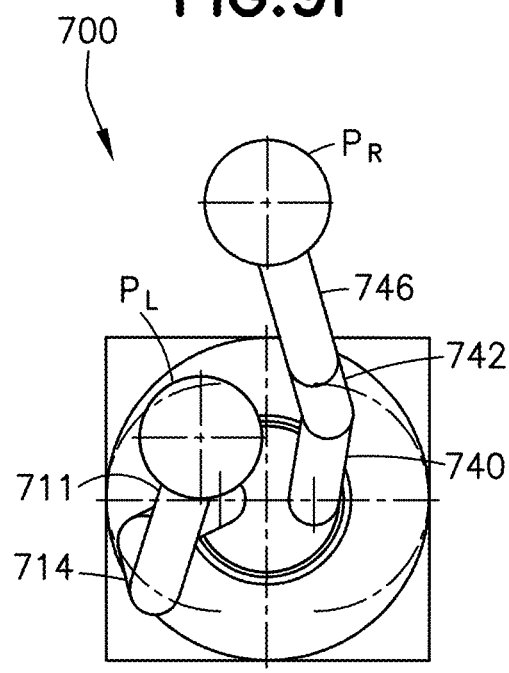
Figure 9L:
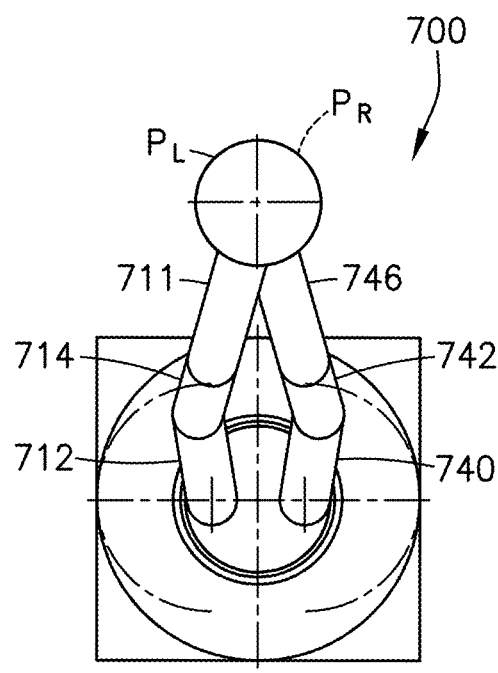

The capability of rotating the left linkage 708 and the right linkage 710 of the robot 700 independently may be used to support additional geometries, locations, and orientations of workstations, as illustrated in FIGS. 9A-9L. FIG. 9A shows the robot arm 702 retracted with end-effectors 711, 746 substantially parallel to each other; FIG. 9B shows the left end-effector 711 extended to an orthogonal workstation offset to the left; FIG. 9C shows the right end-effector 746 extended to an orthogonal workstation offset to the right; FIG. 9D shows both end-effectors 711, 746 extended concurrently to two offset orthogonal workstations with substantially parallel access paths; FIG. 9E shows the robot arm 702 retracted with the linkages 708, 710 and end-effectors 711, 746 rotated toward each other; FIG. 9F shows the left end-effector 711 extended to a non-orthogonal and non-radial workstation offset to the left; FIG. 9G shows the right end-effector 746 extended to a non-orthogonal and non-radial workstation offset to the left; FIG. 9H shows both end-effectors 711, 746 extended concurrently to two offset non-orthogonal and non-radial workstations; FIG. 9I shows the robot arm 702 retracted with the linkages 708, 710 and end-effectors 711, 746 rotated away from each other; FIG. 9J shows the left end-effector 711 extended to a radial workstation; FIG. 9K shows the right end-effector 746 extended to the same radial workstation or a radial workstation located below that workstation; and FIG. 9L shows both end-effectors 711, 746 extended concurrently to the same radial workstation or two vertically stacked workstations.

Figure 10:
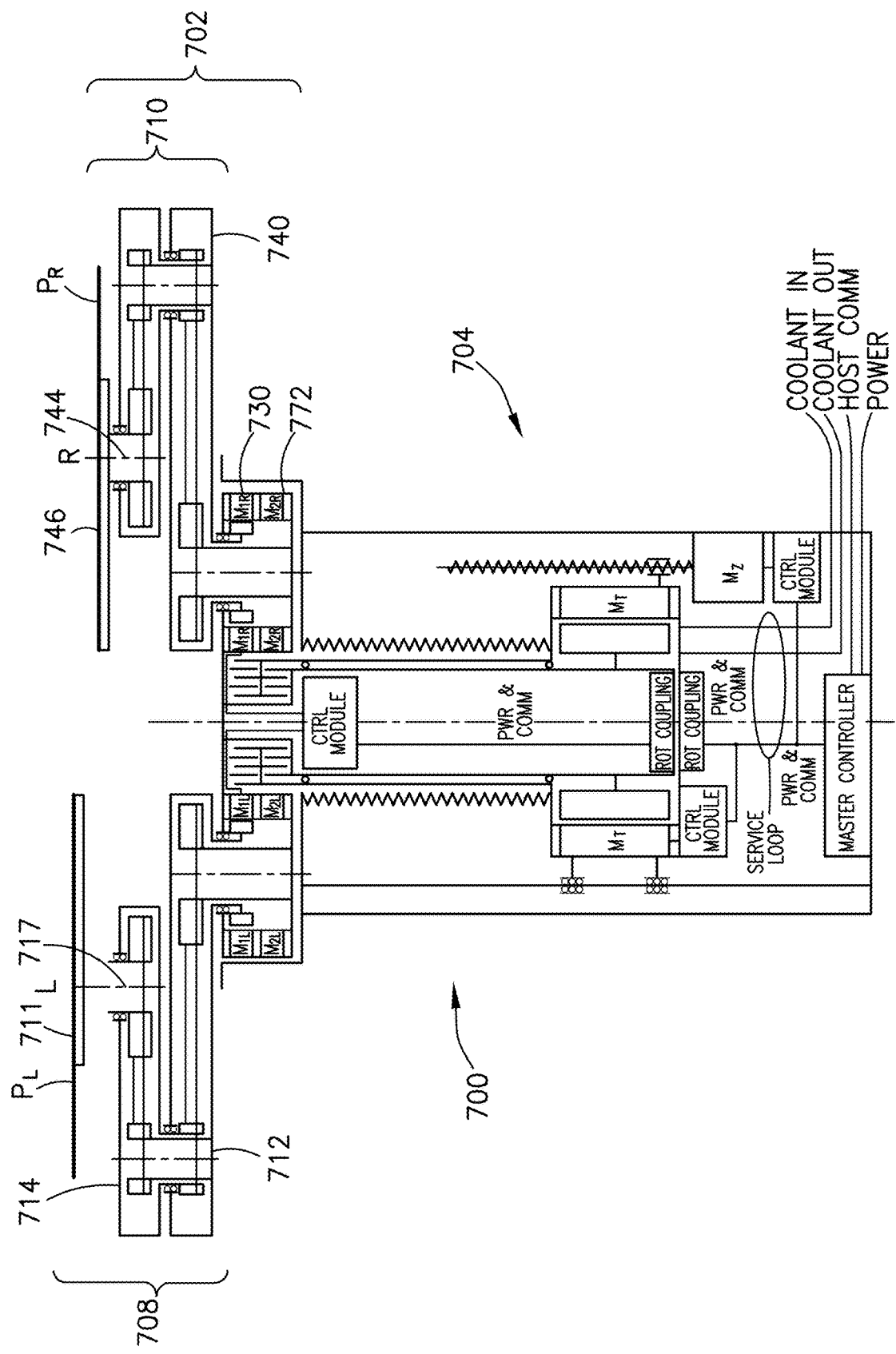
FIG. 10 is a schematic view of the example robot of FIG. 7 in which the end-effectors are offset in height.

In order to access a radial workstation (a workstation orientated radially with respect to the axis of the drive unit 704) or a pair of vertically stacked radial workstations by the left end-effector 711 and the right end-effector 746 concurrently, for example, as illustrated in FIG. 9H, one of the end-effectors, in this particular example the left end-effector 711, may be elevated above the other end-effector 746. An example of such an arrangement is shown in FIG. 10, in which a left wrist 717 is elongated in the vertical direction relative to the right wrist 744, thereby allowing the left end-effector 711 to be offset vertically from the right end-effector 746.

Figure 11:
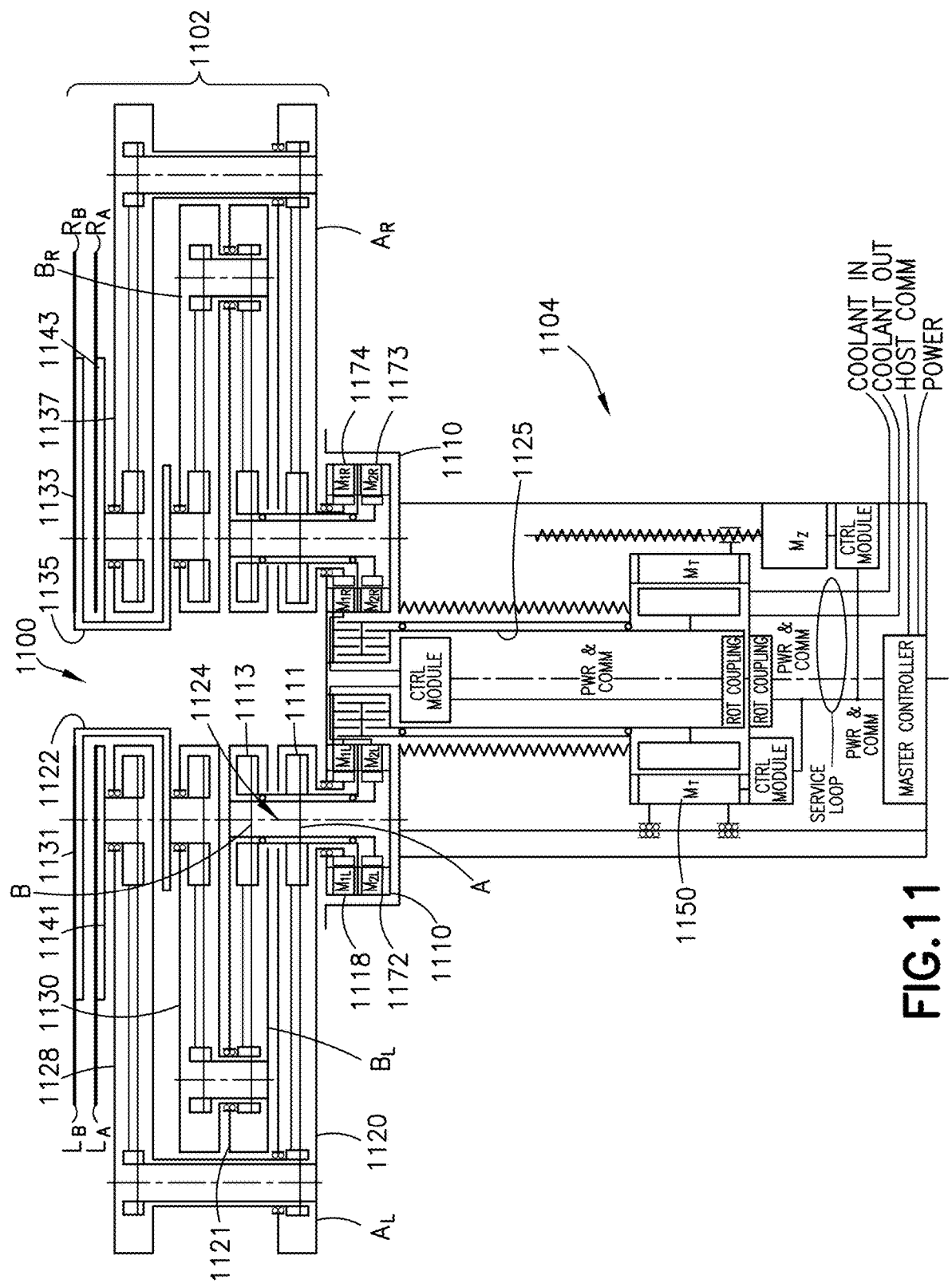
FIG. 11 is a schematic view of another example embodiment of a robot.

Referring now to FIG. 11, another example embodiment of a robot is shown generally at 1100 and is hereinafter referred to as "robot 1100." In robot 1100, a robot arm 1102 may comprise a pivoting base 1110 connected to a drive shaft 1125 of a drive unit 1104, a left linkage $A_L$, a left linkage $B_L$, a right linkage $A_R$, and a right linkage $B_R$. The pivoting base 1110 may further include motors configured to drive the four linkages, as explained below.

Each of the left linkages, for example, the left linkage $A_L$ and the left linkage $B_L$, may feature substantially the same three-link structure and internal arrangements as the left linkage 407 of the example robot 400 described with respect to FIG. 4A. Similarly, each of the right linkages, for example, the right linkage $A_R$ and the right linkage $B_R$, may feature substantially the same three-link structure and internal arrangements as the right linkage 411 of the example embodiment described with respect to FIG. 4A.

A first link 1120 of left linkage $A_L$ may be coupled to the pivoting base 1110 of the robot arm 1102 via a rotary joint (left shoulder joint A) and may be actuated by motor $M_{2L}$ 1172 attached to the pivoting base 1110 of the robot arm 1102. Similarly, a first link 1121 of left linkage $B_L$ may be coupled to the pivoting base 1110 of the robot arm 1102 via a rotary joint (shoulder joint B) and actuated by motor $M_{1L}$ 1118 attached to the pivoting base 1110 of the robot arm 1102. Shoulder pulleys of the two linkages, for example, the left shoulder pulley 1111 of left linkage $A_L$ and the left shoulder pulley 1113 of the left linkage $B_L$, may be connected to the pivoting base 1110 of the robot arm 1102 via a substantially rigid post 1124. As indicated in the example of FIG. 11, the left shoulder joint of the left linkage $A_L$, the left shoulder joint of the left linkage $B_L$, motor $M_{1L}$ 1118, motor $M_{2L}$ 1172, the left shoulder pulley 1111 of the left linkage $A_L$, and the left shoulder pulley 1113 of the left linkage $B_L$ may be arranged in a coaxial manner. Alternatively, the left shoulder joint of the left linkage $A_L$ with motor 1421, and the left shoulder pulley 1111 of the left linkage $A_L$ may be offset from left shoulder joint of the left linkage $B_L$ with motor $M_{1L}$ and the left shoulder pulley 1113 of the left linkage $B_L$.

As further indicated in FIG. 11, the left linkage $A_L$ and the left linkage $B_L$ may be configured, for example, so that the left linkage $A_L$ and the left linkage $B_L$ are nested together. As shown, the upper arm and forearm of the left linkage $B_L$ are nested in the upper arm and forearm of the left linkage $A_L$. In this case, the first link 1120 of left linkage $A_L$ may be below the first link 1121 of the linkage $B_L$, and a second link 1128 of linkage $A_L$ may be above a second link 1130 of the linkage $B_L$. As illustrated in FIG. 11, if the shoulder joints of the two linkages (left shoulder joint of the left linkage $A_L$ and left shoulder join of the left linkage $B_L$) are arranged in a coaxial configuration, the joint-to-joint length of the first link 1120 of the left linkage $A_L$ may be greater than the joint-to-joint length of the first link 1121 of the left linkage $B_L$. Alternatively, if the shoulder joints of the two linkages (left shoulder joint of the left linkage $A_L$ and left shoulder join of the left linkage $B_L$) are offset from each other, the joint-to-joint length of the first link 1120 of the left linkage $A_L$ may be equal to the joint-to-joint length of the first link 1121 of the left linkage $B_L$. As another alternative, any suitable joint-to-joint lengths may be used.

A third link 1131 of the left linkage $B_L$ may feature an optional bridge structure 1122 that may elevate the end-effector of the left linkage $B_L$ (end-effector LB) above a third link 1141 of the left linkage $A_L$ (end-effector LA) coupled to the second link 1128. This may prevent contamination of the payload on the left end-effector LA by potential contaminants emanated from the second link of the left linkage $B_L$ and/or the wrist joint of left linkage $B_L$.

The right linkages of the robot 1100 may be configured as mirror images of the left linkages. Specifically, right linkage $A_R$ may be configured to be substantially a mirror image of left linkage $A_L$, and right linkage $B_R$ may be configured to be substantially a mirror image of left linkage $B_L$. A third link 1133 of the right linkage $B_R$ may feature a bridge structure 1135 to elevate the end-effector RB above a third link 1143 (end-effector RA) coupled to a second link 1137. The first link (upper arm) of the right linkage $A_R$ may be actuated by motor $M_{2R}$ 1173, which may be attached to the pivoting base 1110 of the arm, and the first link (upper arm) of right linkage $B_R$ may be actuated by motor $M_{1R}$ 1174.

Figure 12A:
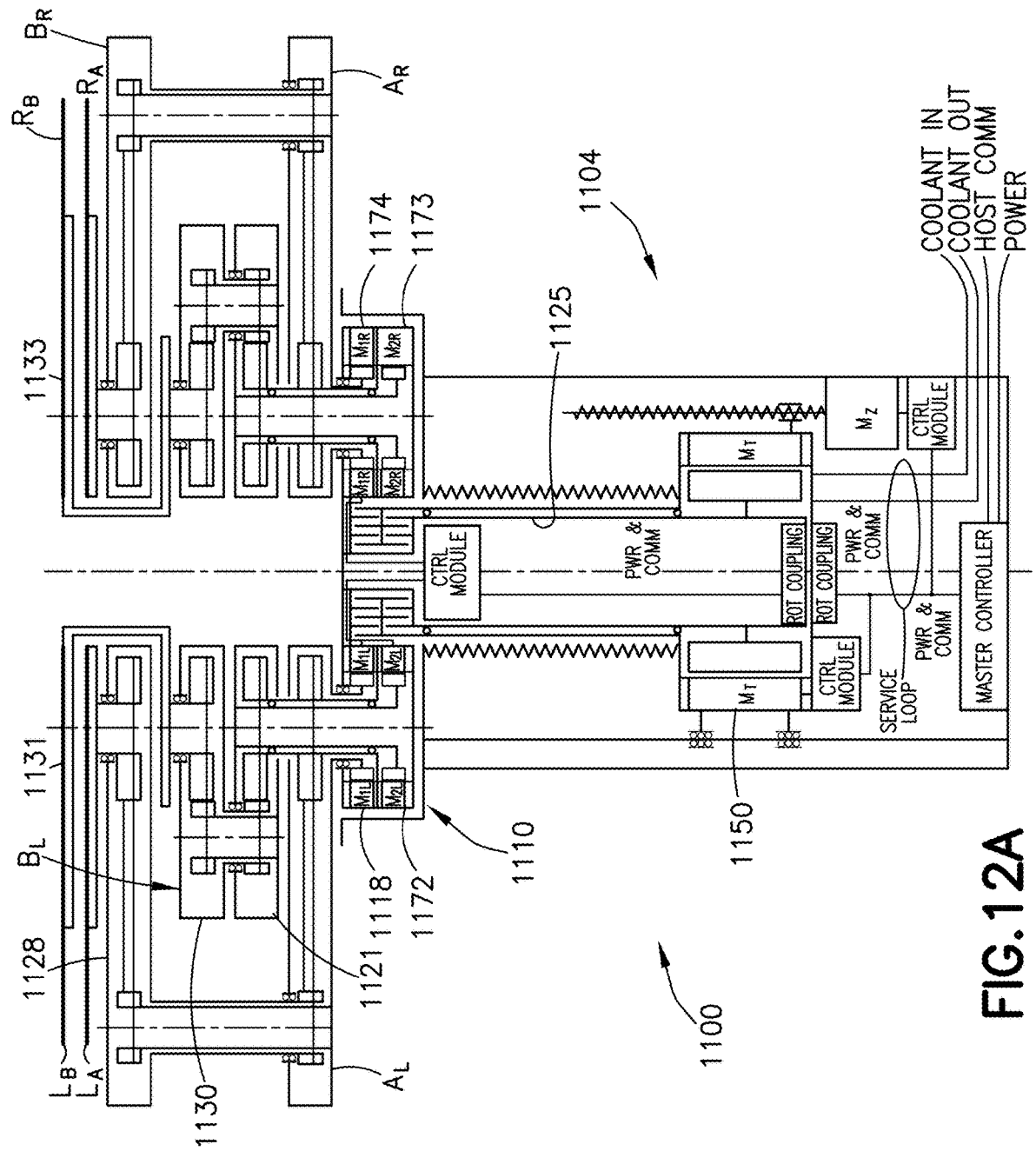
FIG. 12A is a schematic view of the robot of FIG. 11 with the end-effectors in retracted positions.
Figure 12B:
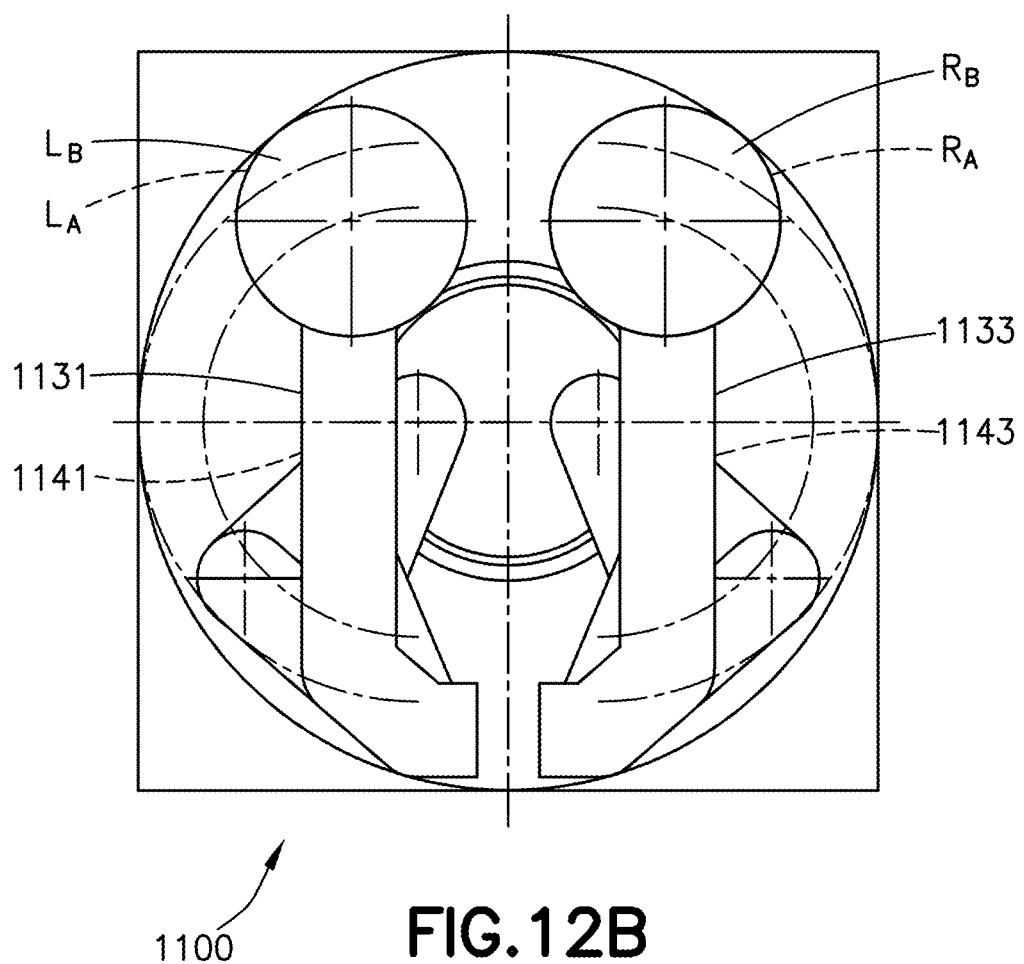
FIG. 12B is a diagrammatic top view of the robot of FIG. 12A.

Referring now to FIGS. 12A and 12B, the robot 1100 is shown with the end-effectors LA, LB, RA, RB retracted (as opposed to the link-over-link position shown in FIG. 11). The entire robot arm 1102 can be rotated by moving the drive shaft 1125 of the drive unit 1104 using motor $M_T$ 1150. The left end-effector LA can be extended from its retracted position along a substantially straight line by moving the first link 1120 of left linkage $A_L$ using motor $M_{2L}$ 1172. The left end-effector LB can be extended along a substantially straight line by moving the first link 1121 of left linkage $B_L$ using motor $M_{1L}$ 1118. The right end-effector RA can be extended along a substantially straight line by moving the first link of the right linkage $A_R$ using motor $M_{2R}$ 1173. And, finally, end-effector RB can be extended along a substantially straight line by moving the first link of the right linkage $B_R$ using motor $M_{1R}$ 1174.

Figure 13A:
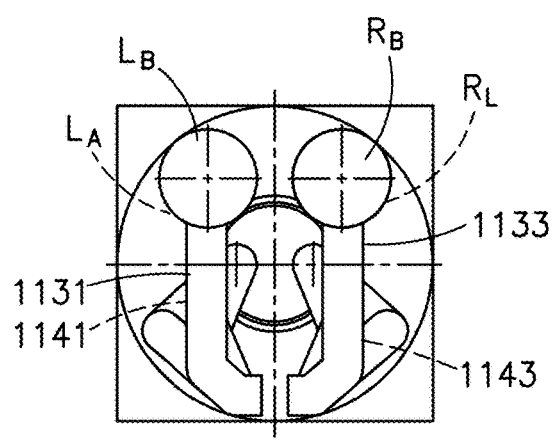
Figure 13B:
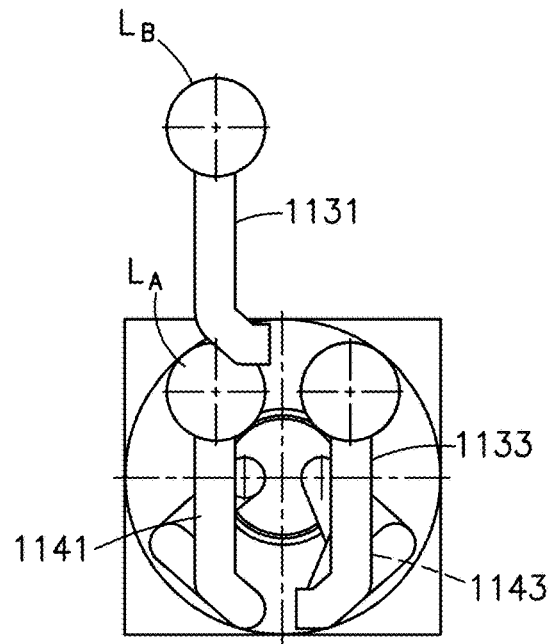
Figure 13C:
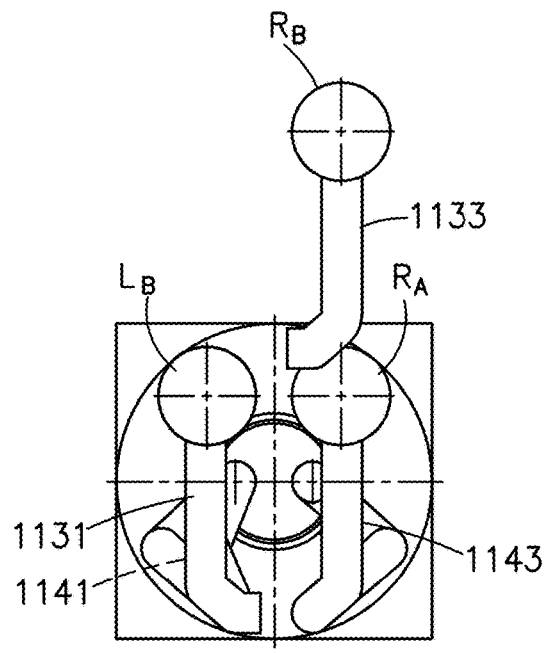
Figure 13D:
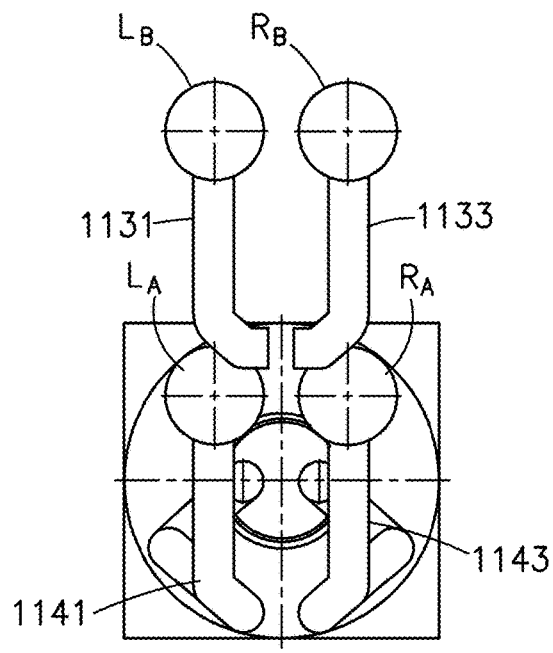
Figure 13G:
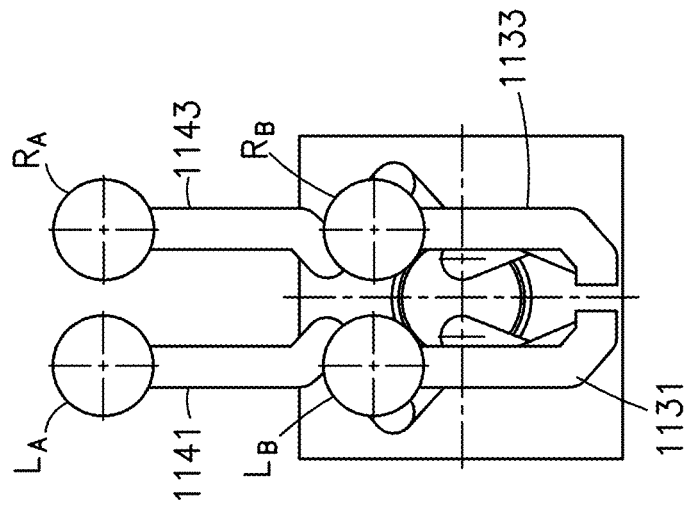
Figure 13F:
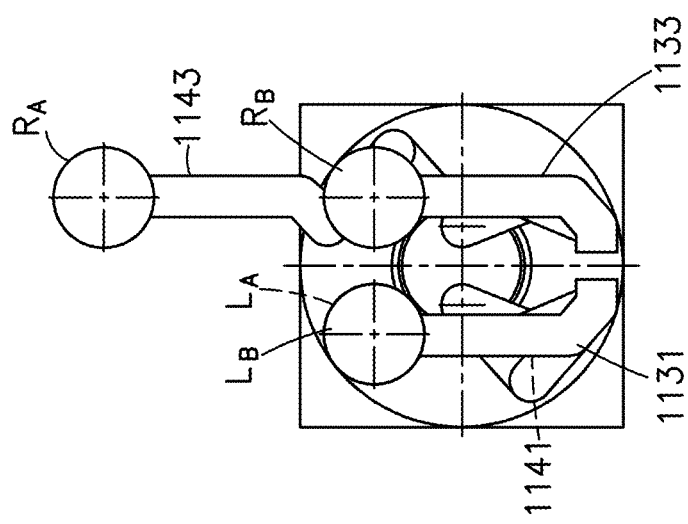
Figure 13E:
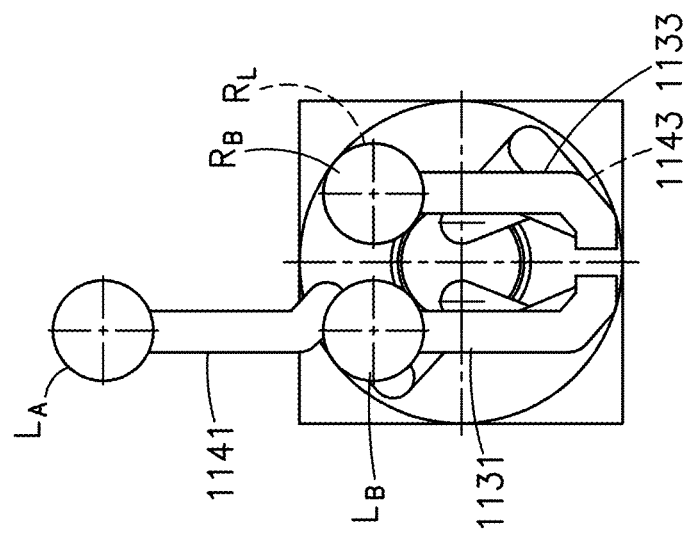

The operation of the example robot 1100 is illustrated in FIGS. 13A-13J. FIG. 13A shows all end-effectors retracted; FIG. 13B shows end-effector LA extended; FIG. 13C shows end-effector RA extended; FIG. 13D shows end-effectors LA and RA extended simultaneously; FIG. 13E shows end-effector LB extended; FIG. 13F shows end-effector RB extended; FIG. 13G shows end-effectors LB and RB extended; FIG. 13H shows end-effectors LA and LB extended; FIG. 13I shows end-effectors RA and RB extended; and FIG. 13J shows all end-effectors (end-effectors LA, RA, LB, and RB) extended simultaneously.

Figure 14:
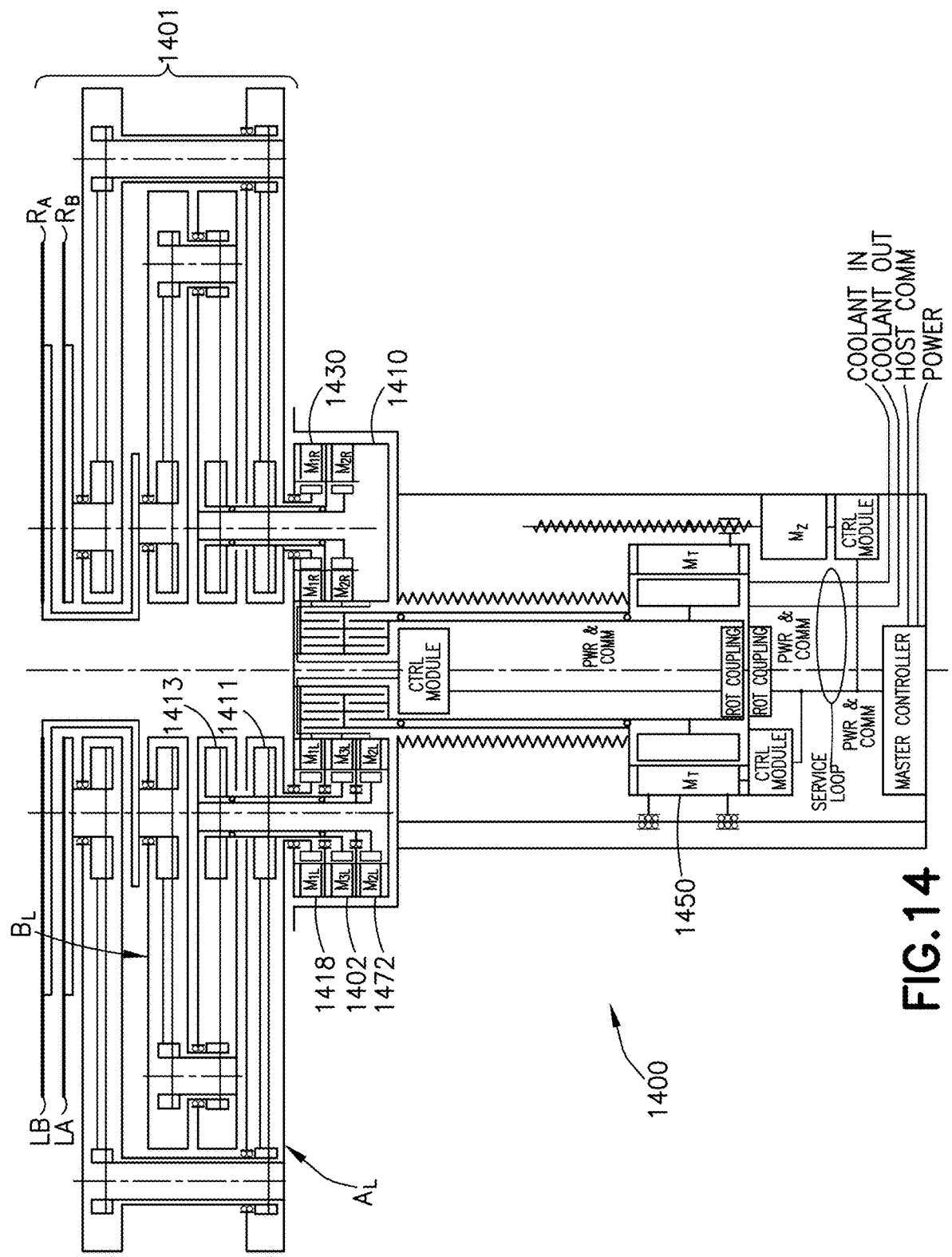
FIGS. 14 and 15 are schematic views of example robots.

Referring now to FIG. 14, another example embodiment of a robot is shown generally at 1400 and is hereinafter referred to as "robot 1400." Robot 1400 may be substantially the same as robot 1100 except that the left shoulder pulleys (left shoulder pulley 1411 of the left linkage $A_L$ and left shoulder pulley 1413 of the left linkage $B_L$) may not be attached directly to a pivoting base 1410 of a robot arm 1401 of the robot 1100. Instead, the left shoulder pulleys 1411, 1413 may be actuated with respect to the pivoting base 1410 of the robot arm 1401 by an additional motor (motor $M_{3L}$) 1402, which may be attached to the pivoting base 1410 of the robot arm 1401 and arranged coaxially with motors $M_{1L}$ 1418 and $M_{2L}$ 1472.

The additional motor (motor $M_{3L}$) 1402 may provide another degree of freedom that may allow the left and right end-effectors, for example the left effector LA and the right end-effector RA, of the robot arm 1401 to be positioned independently (within a certain range) in the horizontal plane. The positions of the two end-effectors in the horizontal plane may be defined by four independent coordinates; for example, Cartesian coordinates $x_{LA}$ and $y_{LA}$ may represent position of left end-effector LA and Cartesian coordinates $x_{RA}$ and $y_{RA}$ may represent position of right end-effector RA. Consequently, four independently controlled axes of motion may be provided to position the two end-effectors of the robot arm 1401 independently. In robot 1400, motors $M_T$ 1450, $M_{1L}$ 1418, $M_{2L}$ 1472, and $M_{1R}$ 1430 may be used for this purpose.

The capability of positioning the left and right end-effectors of the robot arm 1401 independently may be conveniently utilized to compensate for misalignment of a payload on the left end-effector (for example, end-effector LA) and, simultaneously, for misalignment of a payload on the right end-effector (for example, end-effector RA) when the two payloads are being delivered concurrently to a pair of workstations (such as in FIG. 13D).

Figure 15:
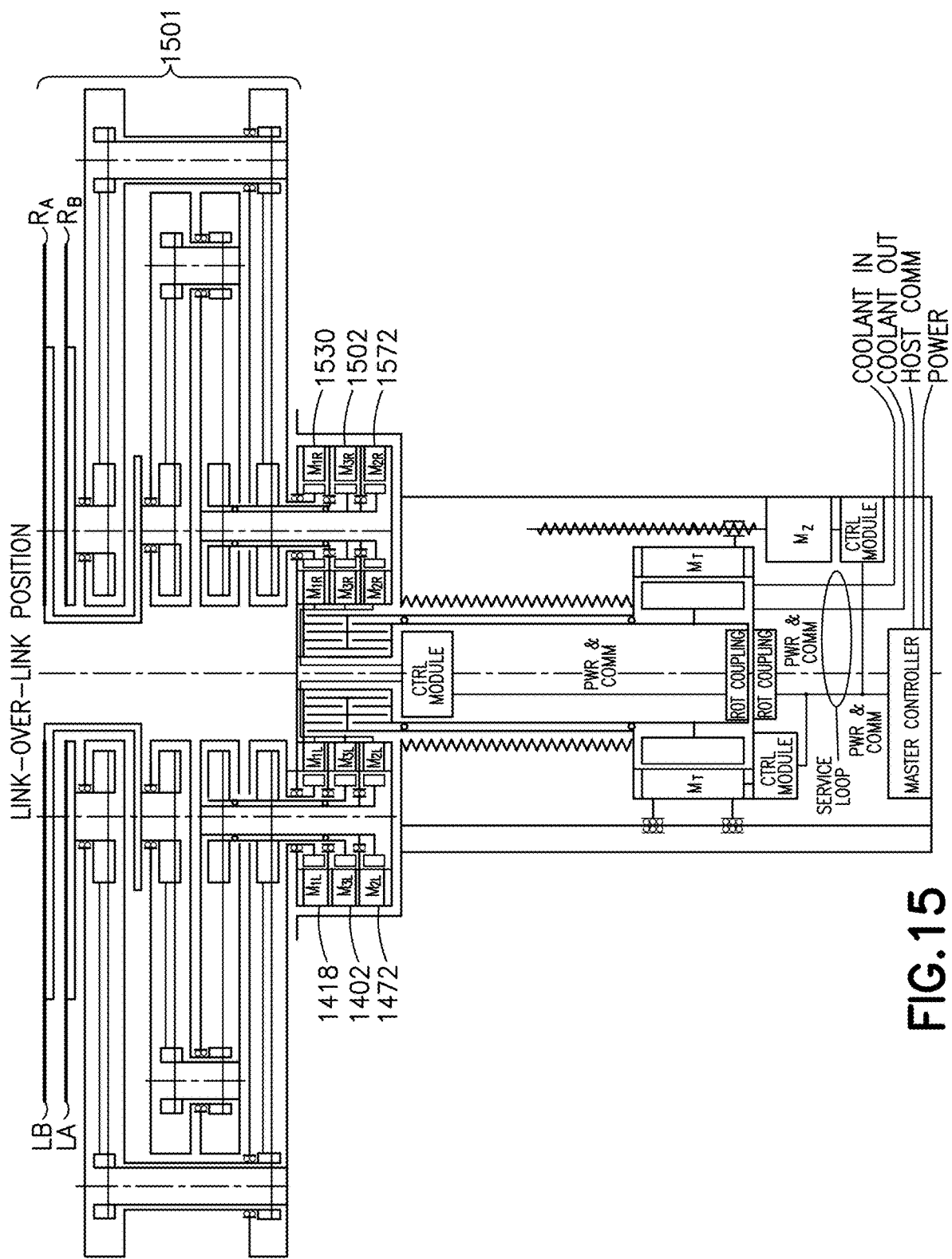

Referring now to FIG. 15, another example embodiment of a robot according to the present invention is shown at 1500 and is hereinafter referred to as "robot 1500." The structure of the example robot 1500 may be substantially the same as the example robot 1400 except that the right shoulder pulleys may no longer be attached directly to a pivoting base 1510 of a robot arm 1501. Instead, the right shoulder pulleys (right shoulder pulley of the left linkage $A_L$ and right shoulder pulley of the left linkage $B_L$) may be actuated with respect to the pivoting base 1510 of the robot arm 1501 by an additional motor (motor $M_{3R}$) 1502, which may be attached to the pivoting base 1510 of the robot arm 1501 and arranged coaxially with motors $M_{1R}$ 1530 and $M_{2R}$ 1572.

In this configuration, similarly to the left linkages of the robot arm 1501, the right linkages can be rotated by moving motors $M_{1R}$ 1530, $M_{2R}$ 1572, and $M_{3R}$ 1502 in synchronization by the desired amount of rotation. This can be used, for example, to adjust the direction in which the end-effectors of the right linkages, for example, right end-effector RA and right end-effector RB, may be extended. Right end-effector RA then can be extended in a given direction along a substantially straight line by moving the first link of right linkage $A_R$ using motor $M_{2R}$ 1572 while keeping motor $M_{3R}$ 1502 stationary. And, similarly, right end-effector RB can be extended in a given direction along a substantially straight line by moving the first link of right linkage $B_R$ using motor $M_{1R}$ 1530 while keeping motor $M_{3R}$ 1502 stationary.

The capability of rotating the left linkages and right linkages of the robot arm 1501 independently may be used to support additional geometries, locations, and orientations of workstations, as described earlier with respect to FIGS. 9A-9L.

Figure 16A:
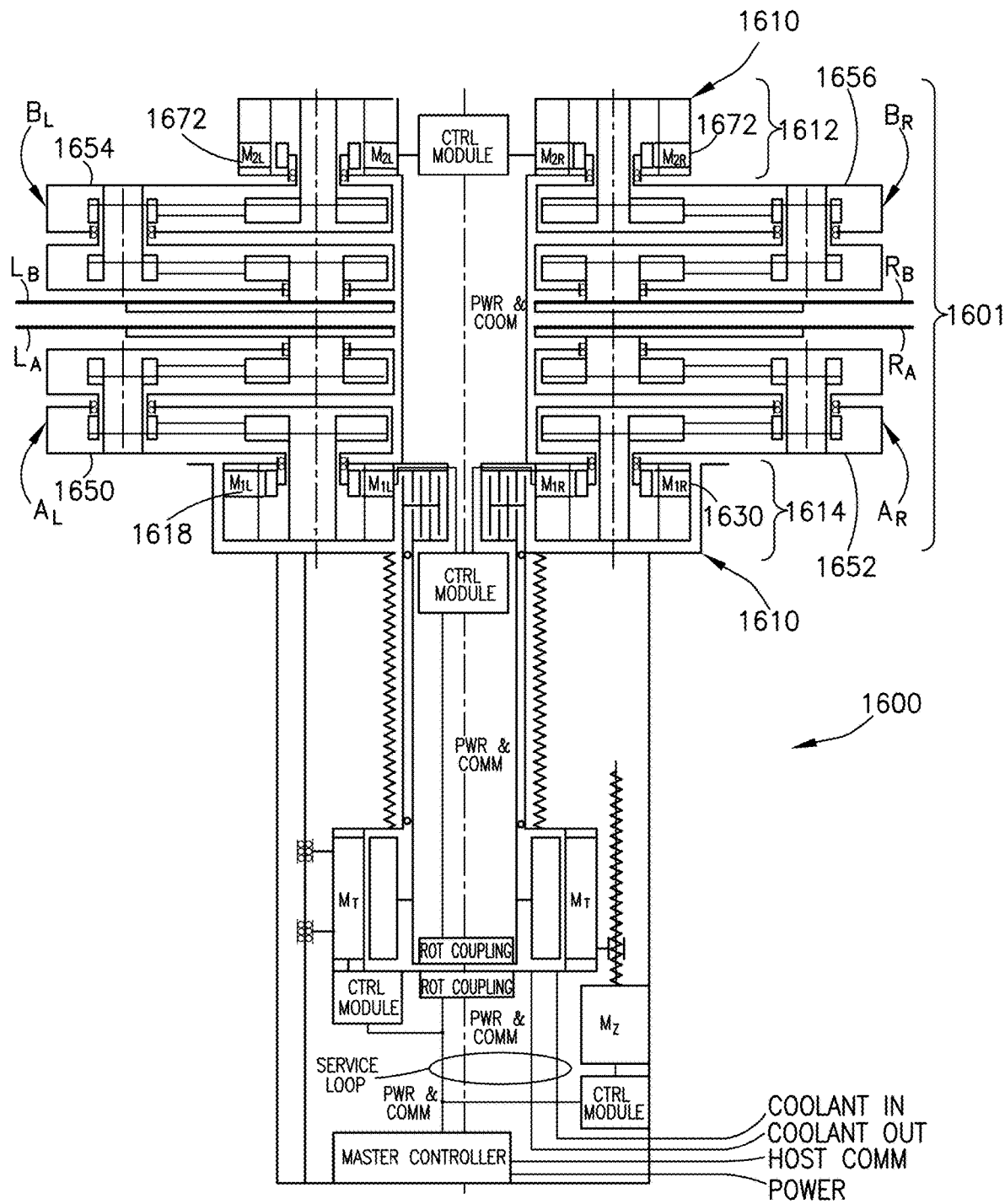
FIG. 16A is a schematic view of an example robot in which a pivoting base is extended vertically above linkages of the robot arm.
Figure 16B:
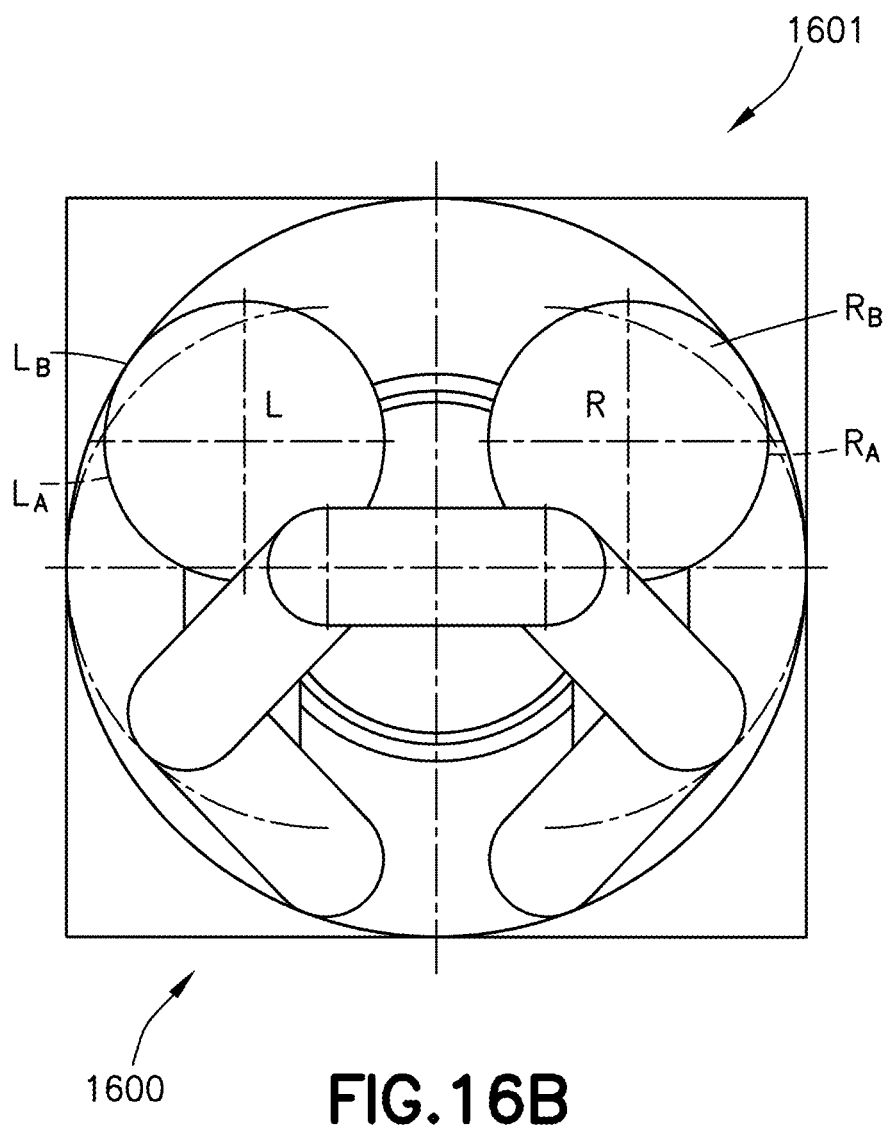
FIG. 16B is a diagrammatic top view of the example robot of FIG. 16A.

Referring now to FIGS. 16A and 16B, in another example embodiment of a robot 1600 according to the present invention, a pivoting base of a robot arm 1601 may be extended vertically above the linkages of the robot arm 1601, forming a pivoting structure 1610 with an upper portion 1612 and a lower portion 1614. In this example embodiment, left linkage $A_L$, and right linkage $A_R$ may be carried by the lower portion 1614 of the pivoting structure while left linkage $B_L$ and right linkage $B_R$ may be suspended from the upper portion 1612 of the pivoting structure 1610. In such an embodiment the carried left linkage $A_L$ and right linkage $A_R$ are the vertically mirrored images of the suspended left linkage $B_L$ and right linkage $B_R$.

The internal arrangements of the linkages of the robot arm 1601 (left linkage $A_L$, right linkage $A_R$, left linkage $B_L$, and right linkage $B_R$) may be substantially the same as described with respect to the robot 400. As depicted in FIG. 16A, a first link 1650 of left linkage $A_L$ may be actuated by motor $M_{1L}$ 1618, which may be attached to the lower portion 1614 of the pivoting structure 1610, a first link 1652 of the right linkage $A_R$ may be actuated by motor $M_{1R}$ 1630, which may also be attached to the lower portion 1614 of the pivoting structure 1610, a first link 1654 of left linkage $B_L$ may be actuated by motor $M_{2L}$ 1672, which may be attached to the upper portion 1612 of the pivoting structure 1610, and a first link 1656 of the right linkage $B_R$ may be actuated by motor $M_{2R}$ 1672, which may also be attached to the upper portion 1612 of the pivoting structure 1610.

Figure 17A:
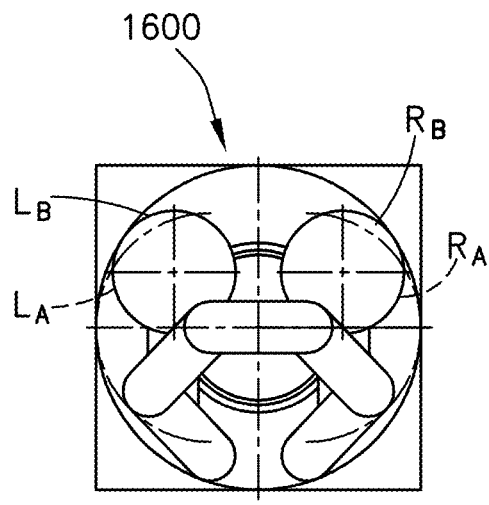
FIGS. 17A-17H are diagrammatic top views of operations of the robot of FIG. 16A.
Figure 17B:
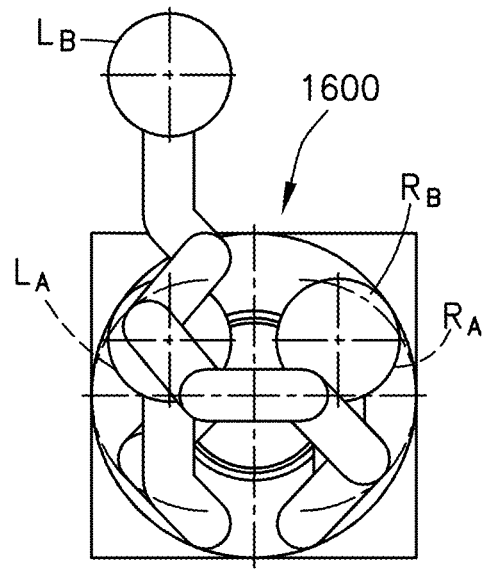
Figure 17C:
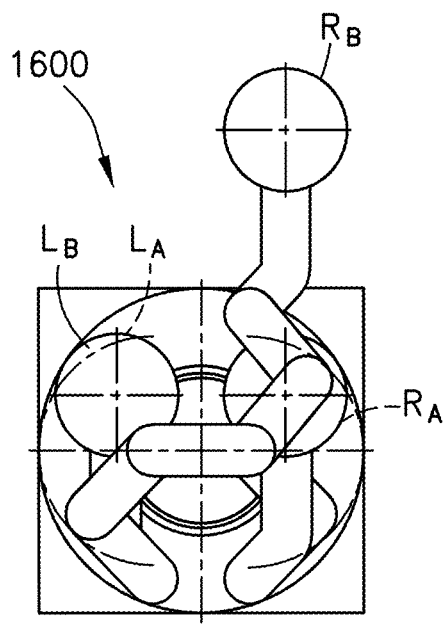
Figure 17D:
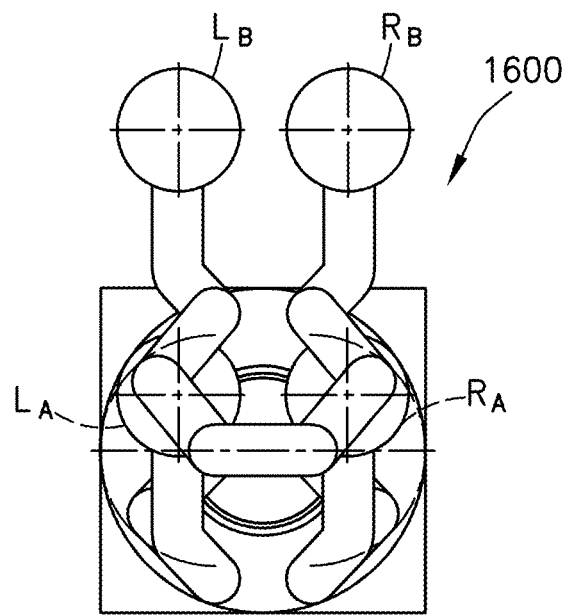
Figure 17E:
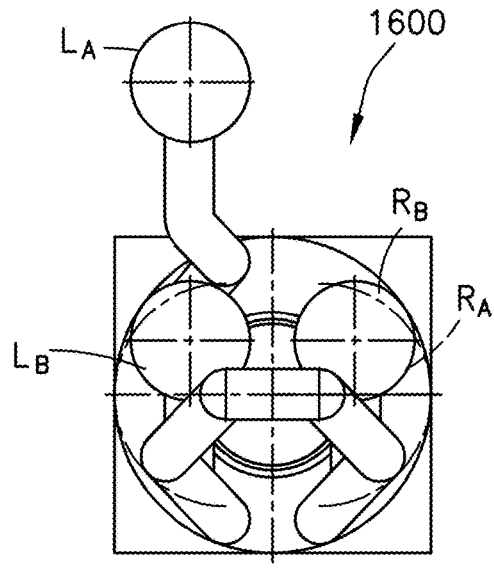
Figure 17F:
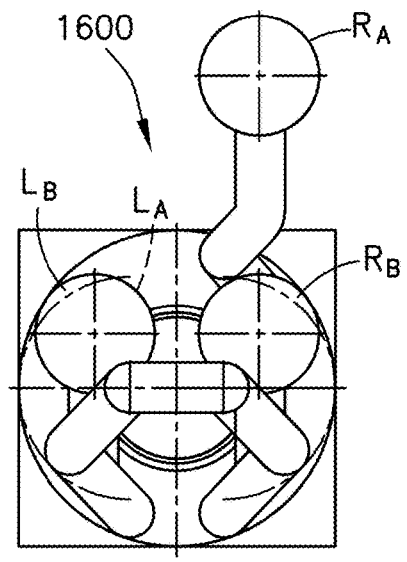
Figure 17G:
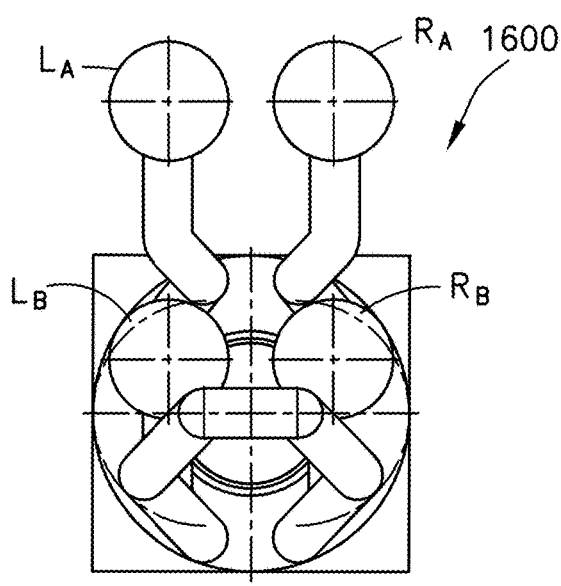
Figure 17H:
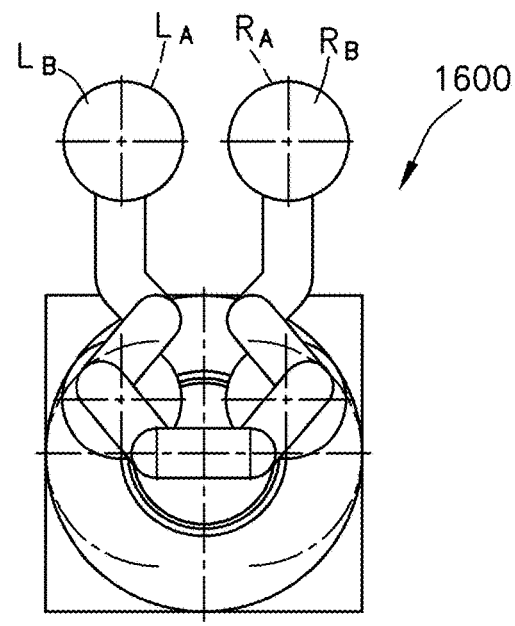

Referring now to FIGS. 17A-17H, the operation of the robot 1600 is shown. FIG. 17A shows all end-effectors retracted; FIG. 17B shows the left end-effector LA extended; FIG. 17O shows right end-effector RA extended; FIG. 17D shows the left and right end-effectors LA and RA extended; FIG. 17E shows left end-effector LB extended; FIG. 17F shows right end-effector RB extended; FIG. 17G shows the left and right end-effectors LB and RB extended; and FIG. 17H shows all end-effectors (end-effectors LA, RA, LB, and RB) extended.

Figure 18A:
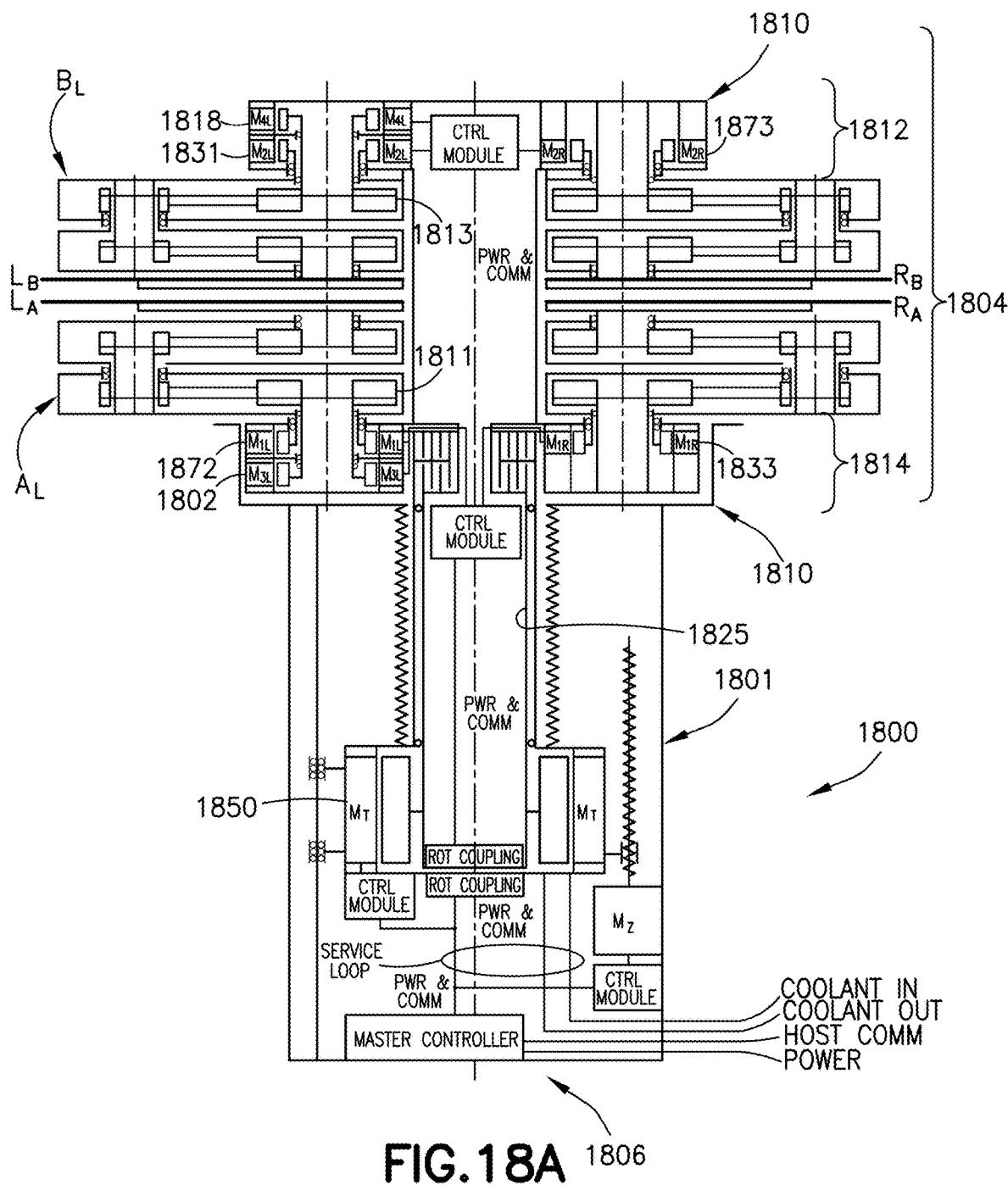
FIG. 18A is another example of a robot showing an alternate attachment of a shoulder pulley.
Figure 18B:
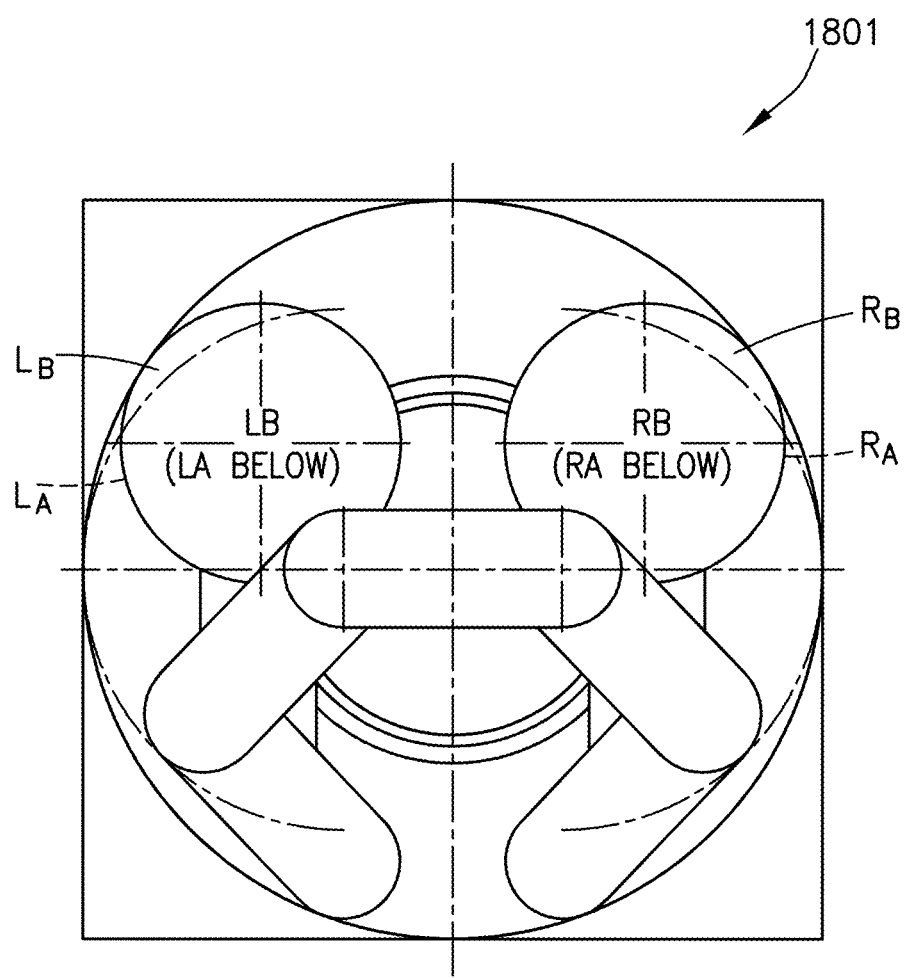
FIG. 18B is a diagrammatic top view of the robot of FIG. 18A.

Referring now to FIGS. 18A and 18B, another example of the robot according to the present invention is shown at 1800 and is hereinafter referred to as "robot 1800." Robot 1800 may comprise a drive unit 1801, a robot arm 1804, and a control system 1806. A pivoting base may be extended vertically above the linkages of the robot arm 1804, forming a pivoting structure 1810, which is connected to a drive shaft 1825 of the drive unit 1801. The pivoting structure 1810 comprises an upper portion 1812 and a lower portion 1814. Robot 1800 may be substantially the same as robot 1600 except that a shoulder pulley 1811 of left linkage $A_L$ may not be attached directly to the pivoting structure 1810 of the robot arm 1804. Instead, the shoulder pulley 1811 of left linkage $A_L$ may be actuated with respect to the pivoting structure 1810 of the robot arm 1804 by an additional motor (motor $M_{3L}$) 1802, which may be attached to the lower portion 1814 of the pivoting structure 1810 of the robot arm 1804 and arranged coaxially with motor MIL 1872. And, similarly, a shoulder pulley 1813 of left linkage $B_L$ may not be attached directly to the pivoting structure 1810 of the robot arm 1804. Instead, the shoulder pulley 1813 of left linkage $B_L$ may be actuated with respect to the pivoting structure 1810 of the robot arm 1804 by an additional motor $M_{4L}$ 1818, which may be attached to the upper portion 1812 of the pivoting structure 1810 of the robot arm 1804 and arranged coaxially with motor $M_{2L}$ 1831.

The entire left linkage $A_L$ can be rotated by moving motors $M_{1L}$ 1872 and $M_{3L}$ 1802 in synchronization by the desired amount of rotation. This can be used, for example, to adjust the direction in which the end-effector of left linkage $A_L$ (end-effector LA) may be extended. End-effector LA then can be extended in a given direction along a substantially straight line by moving the first link of left linkage $A_L$ using motor Mil 1872 while keeping motor $M_{3L}$ 1802 stationary.

Similarly, the entire left linkage $B_L$ can be rotated by moving motors $M_{4L}$ 1818 and $M_{2L}$ 1831 in synchronization by the desired amount of rotation. This can be used, for example, to adjust the direction in which the end-effector of left linkage $B_L$ (end-effector LB) may be extended. End-effector LB then can be extended in a given direction along a substantially straight line by moving the first link of left linkage $B_L$ using motor $M_{2L}$ 1831 while keeping motor $M_{4L}$ 1818 stationary.

It should be noted that motor $M_{3L}$ 1802 may provide an additional degree of freedom that may allow end-effectors LA and RA to be positioned independently (within a certain range) in a horizontal plane. The positions of the two end-effectors in a horizontal plane may be defined by four independent coordinates and, therefore, four independently controlled axes of motion (degrees of freedom) may be used to position the two end-effectors independently. In this particular example, motors $M_T$ 1850, $M_{1L}$ 1872, $M_{3L}$ 1802, and $M_{1R}$ 1833 may be utilized for this purpose.

Similarly, motor $M_{2L}$ 1831 may provide an additional degree of freedom that may allow end-effectors LB and RB to be positioned independently (within a certain range) in a horizontal plane. Again, the positions of the two end-effectors in a horizontal plane may be defined by four independent coordinates and, therefore, four independently controlled axes of motion (degrees of freedom) may be used to position the two end-effectors independently. In this particular example, motors $M_T$ 1850, $M_{2L}$ 1831, $M_{4L}$ 1818, and $M_{2R}$ 1873 may be utilized for this purpose.

The capability of positioning the left and right end-effectors, for example, end-effectors LA and RA or end-effectors LB and RB, of the robot arm 1804 independently in a given horizontal plane may be conveniently utilized to compensate for misalignment of a payload on a left end-effector (for example, end-effector LA) and, simultaneously, for misalignment of a payload on a right end-effector (for example, end-effector RA) when the two payloads are being delivered concurrently to a pair of workstations (such as in FIG. 17D).

Figure 19A:
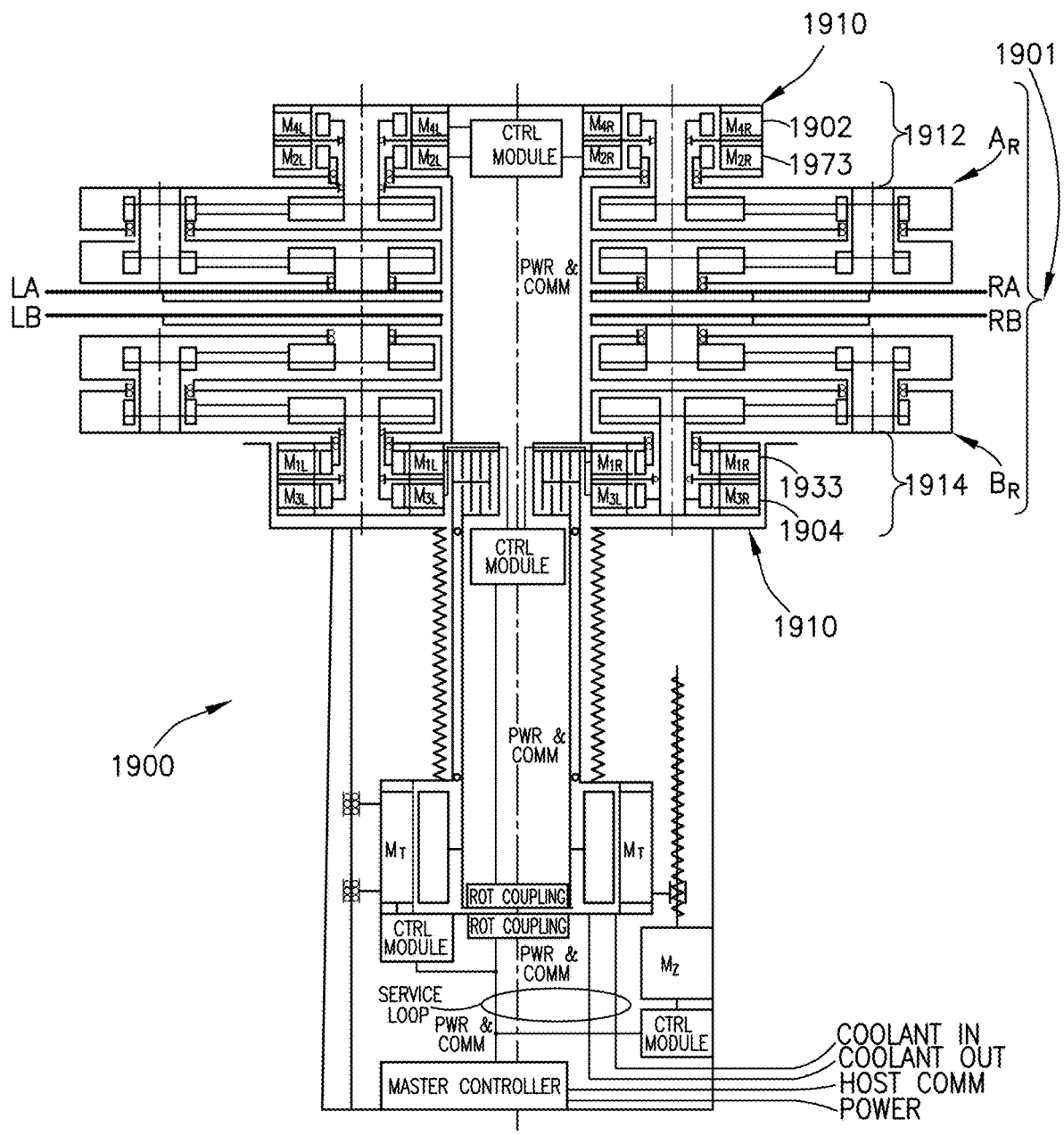
FIG. 19A is a schematic view of an example of a robot showing the incorporation of an additional motor for the actuation of a shoulder pulley.
Figure 19B:
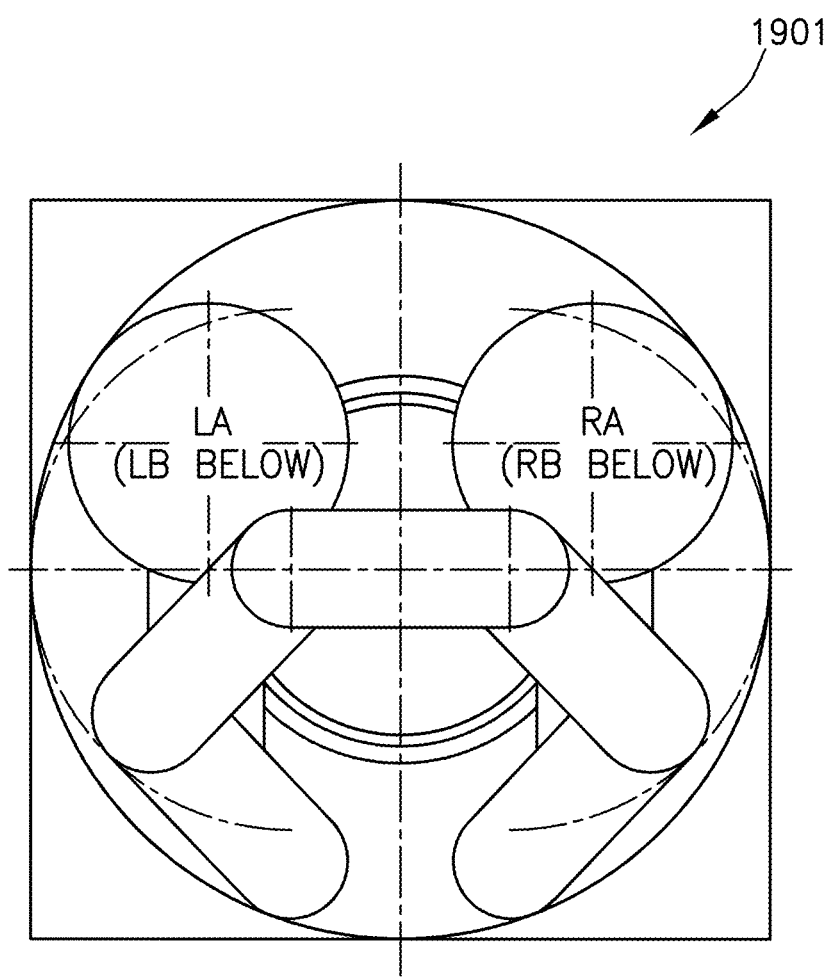
FIG. 19B is a diagrammatic top view of the robot of FIG. 19A.

Another example embodiment of a robot according to the present invention is shown in FIGS. 19A and 19B and is hereinafter referred to as "robot 1900." Robot 1900 may be substantially the same as robot 1800 except that the shoulder pulley of right linkage $A_R$ may not be attached directly to a pivoting structure 1910 of a robot arm 1901. Instead, the shoulder pulley of right linkage $A_R$ may be actuated with respect to the pivoting structure 1910 of the robot arm 1901 by an additional motor (motor $M_{4R}$) 1902, which may be attached to an upper portion 1912 of the pivoting structure 1910 of the robot arm 1901 and arranged coaxially with motor $M_{2R}$ 1973. And, similarly, the shoulder pulley of right linkage $B_R$ may not be attached directly to the pivoting structure 1910 of the robot arm 1901. Instead, the shoulder pulley of right linkage $B_R$ may be actuated with respect to the pivoting structure 1910 of the robot arm 1901 by an additional motor (motor $M_{3R}$) 1904, which may be attached to a lower portion 1914 of the pivoting structure 1910 of the robot arm 1901 and arranged coaxially with motor $M_{1R}$ 1933.

The entire right linkage $A_R$ can be rotated by moving motors $M_{2R}$ 1973 and $M_{4R}$ 1902 in synchronization by the desired amount of rotation. This can be used, for example, to adjust the direction in which the end-effector of right linkage $A_R$ (end-effector RA) may be extended. End-effector RA then can be extended in a given direction along a substantially straight line by moving the first link of right linkage $A_R$ using motor $M_{2R}$ 1973 while keeping motor $M_{4R}$ 1902 stationary.

Similarly, the entire right linkage $B_R$ can be rotated by moving motors $M_{IR}$ 1933 and $M_{3R}$ 1904 in synchronization by the desired amount of rotation. This can be used, for example, to adjust the direction in which the end-effector of right linkage $B_R$ (end-effector RB) may be extended. End-effector RB then can be extended in a given direction along a substantially straight line by moving the first link of right linkage $B_R$ using motor $M_{1R}$ 1933 while keeping motor $M_{3R}$ 1904 stationary.

The capability of rotating the left linkages and right linkages of the robot arm 1901 independently may be used to support additional geometries, locations, and orientations of workstations, including radial workstations and non-orthogonal non-radial workstations, as described earlier with respect to FIGS. 9A-9L.

Furthermore, the capability of positioning the left and right end-effectors, for example, end-effectors LA and RA as well as end-effectors LB and RB, of the robot arm 1901 independently may be conveniently utilized to compensate for misalignment of a payload on a left end-effector (for example, end-effector LA) and, simultaneously, for misalignment of a payload on a right end-effector (for example, end-effector RA) when the two payloads are being delivered concurrently to a pair of workstations (such as in FIG. 17D). Furthermore, this capability may be conveniently utilized to compensate simultaneously for misalignment of a payload on end-effector LA, misalignment of a payload on end-effector RA, misalignment of a payload on end-effector LB, and misalignment of a payload on end-effector RB when the four payloads are being delivered concurrently (such as in FIG. 17H).

Figure 20:
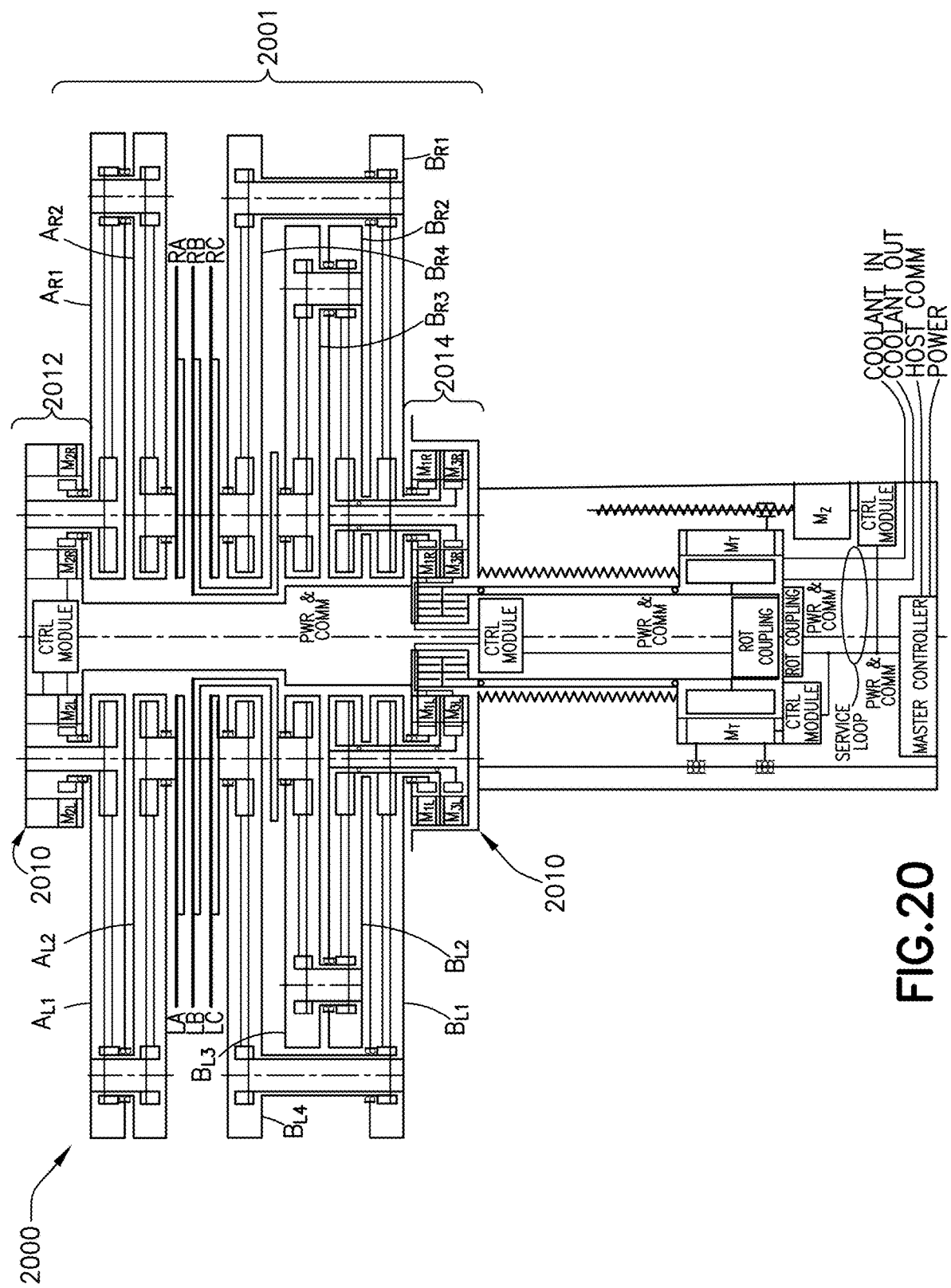
FIGS. 20-22 are schematic views of example robots having arms of multiple linkages and being actuated by various motors.

Referring now to FIG. 20, another example embodiment of a robot is shown at 2000 and is hereinafter referred to as "robot 2000." Robot 2000 comprises at least one arm, each arm having six linkages, each linkage having an end-effector configured to carry a payload, and six motors, each motor configured to actuate one of the linkages (of each arm). As shown, a pivoting base of a robot arm 2001 may be extended vertically above the linkages of the robot arm 2001, forming a pivoting structure 2010 with an upper portion 2012 and a lower portion 2014. In this example embodiment, left linkages $A_{L1}$ and $A_{L2}$ and right linkages $A_{R1}$ and $A_{R2}$ may be suspended from the upper portion 2012 of the pivoting structure 2010 while left linkages $B_{L1}$, $B_{L2}$, $B_{L3}$, and $B_{L4}$ and right linkages $B_{R1}$, $B_{R2}$, $B_{R3}$, and $B_{R4}$ may be carried by the lower portion 2014 of the pivoting structure 2010. Using the corresponding motor, each of the end-effectors of the robot arm 2001, for example, end-effector LA, LB, LC, RA, RB, or RC, can be independently extended with respect to the pivoting structure of the robot arm along a substantially straight line.

Figure 21:
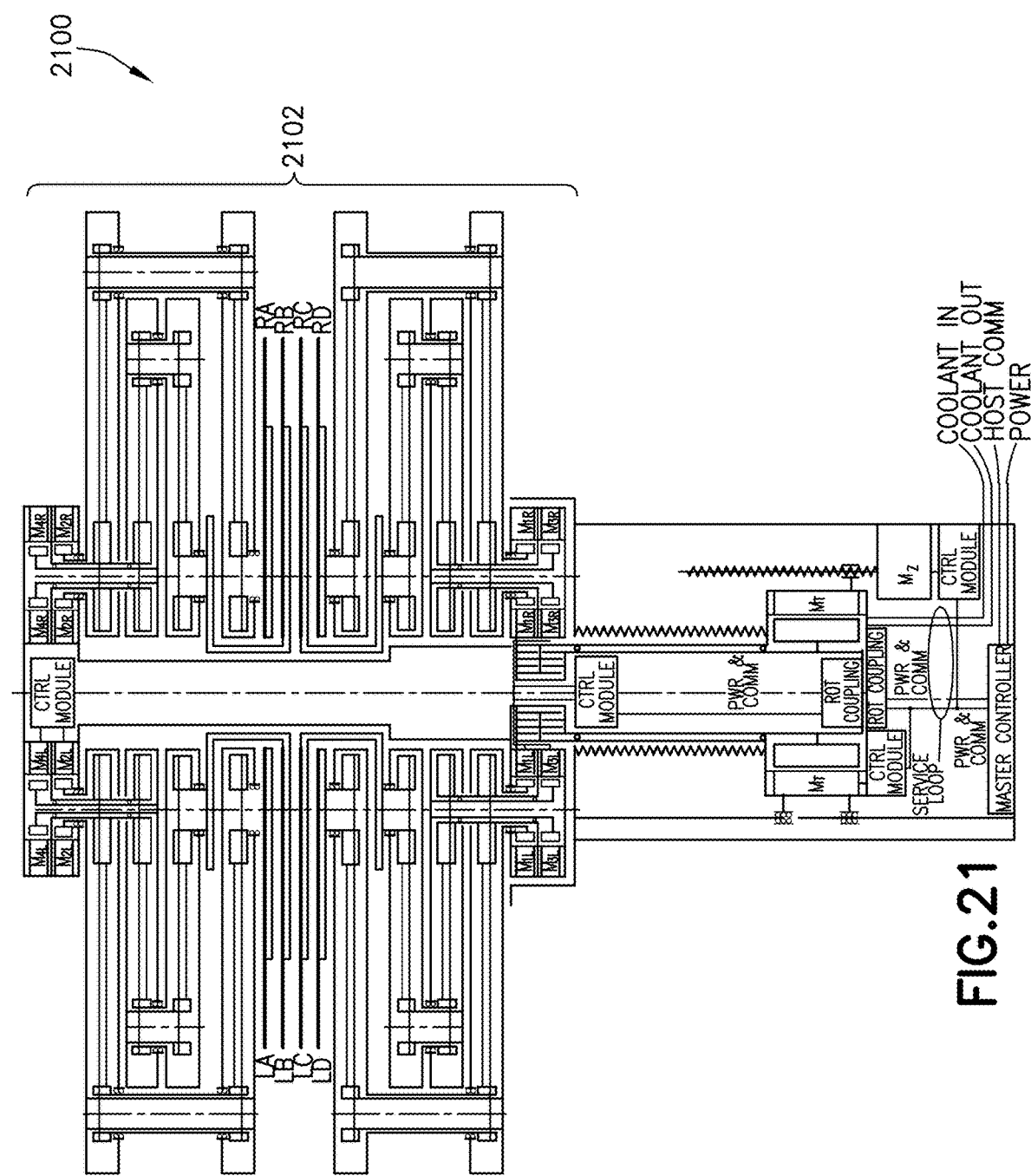

Referring now to FIG. 21, another example of a robot 2100 may comprise an arm 2102 having eight linkages. Each linkage has an end-effector configured to carry a payload, and eight motors, each motor configured to actuate one of the linkages. Using the corresponding motor, each of the end-effectors of the robot arm 2102, for example, end-effector LA, LB, LC, LD, RA, RB, RC, or RD, can be independently extended with respect to a pivoting structure 2110 of the robot arm 2102 along a substantially straight line in a direction fixed with respect to the pivoting structure 2102 of the robot arm 2102.

Figure 22:
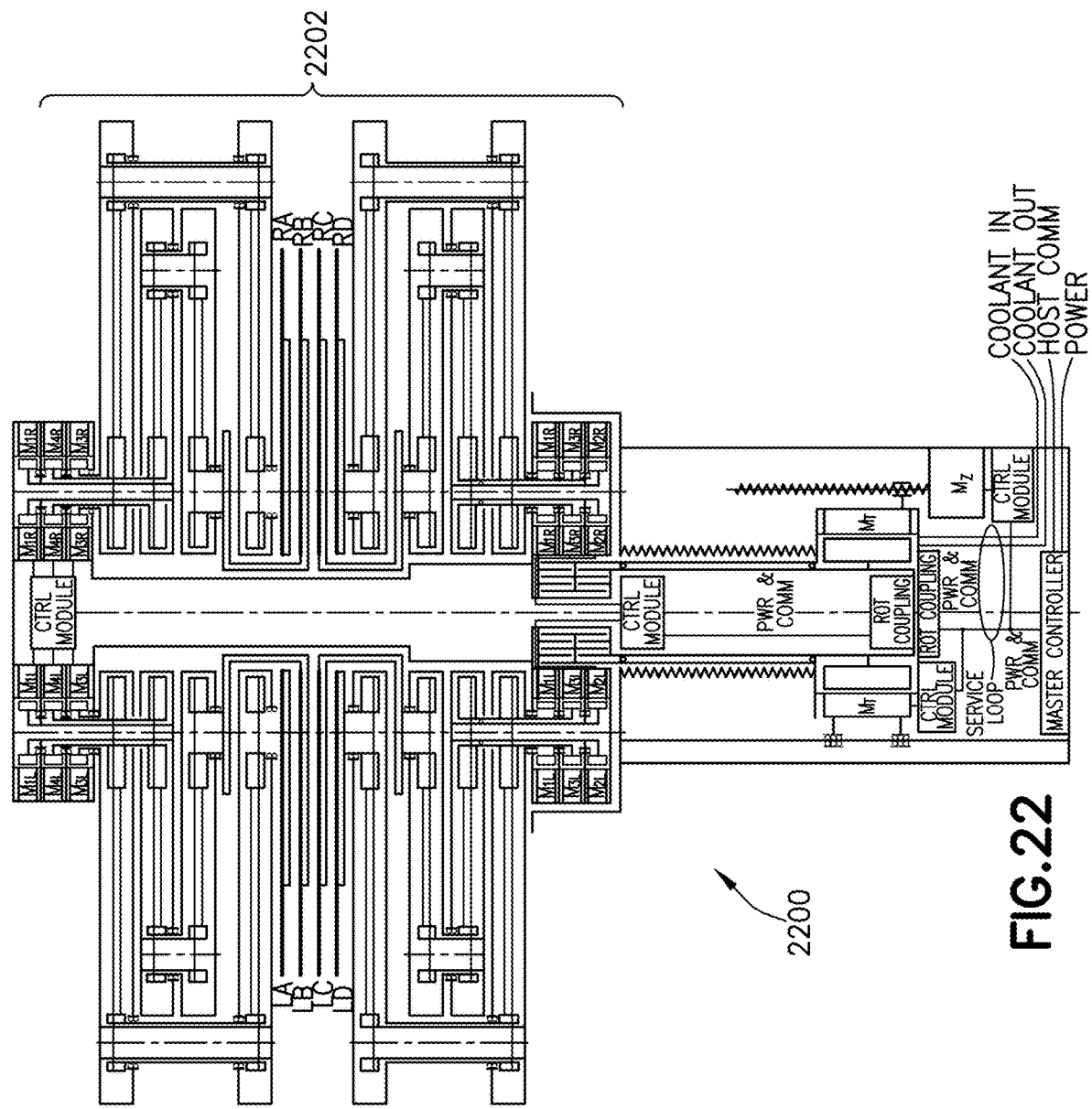

Referring now to FIG. 22, another example embodiment of a robot 2200 may comprise an arm 2202. The example robot 2200 is the same as the example robot 2100 of FIG. 21 except that an additional four motors may be utilized in order to provide adjustment of the direction of motion of the end-effectors of the robot arm 2202, for example, end-effectors LA, LB, LC, LD, RA, RB, RC, and RD, with respect to a pivoting structure 2110 of the robot arm 2202. In the particular example of FIG. 22, direction of motion of end-effectors LA and LB, direction of motion of end-effectors LC and LD, direction of motion of end-effectors RA and RB, and direction of motion of end-effectors RC and RD can be independently adjusted.

Referring now to FIG. 23, another example embodiment of a robot 2300 may comprise two arms coupled to a pivoting structue 2301. In robot 2300, two drive units 2302, 2304, each having a robot arm 2306, 2308, may be utilized. In particular, a first (lower) drive unit 2304 with a first (lower) robot arm 2308 may be used in a right-side-up configuration and a second (upper) drive unit 2302 with a second (upper) robot arm 2306 may be used in an inverted configuration above the first (lower) drive unit 2304 with the first (lower) robot arm 2308.

Although each robot arm (the first (lower) robot arm 2308 and the second (upper) robot arm 2306) features two linkages, each having a single end-effector, any suitable number of linkages and effectors may be used. As an example, the upper robot arm 2306 may feature two linkages with end-effectors LA and RA, and the lower robot arm 2308 may feature four linkages with end-effector LB, LC, RB, and RC. As another example, the upper robot arm 2306 may feature four linkages with end-effectors LA, LB, RA, and RB, and the lower robot arm 2308 may feature four linkages with end-effector LC, LD, RC, and RD.

Figure 24B:
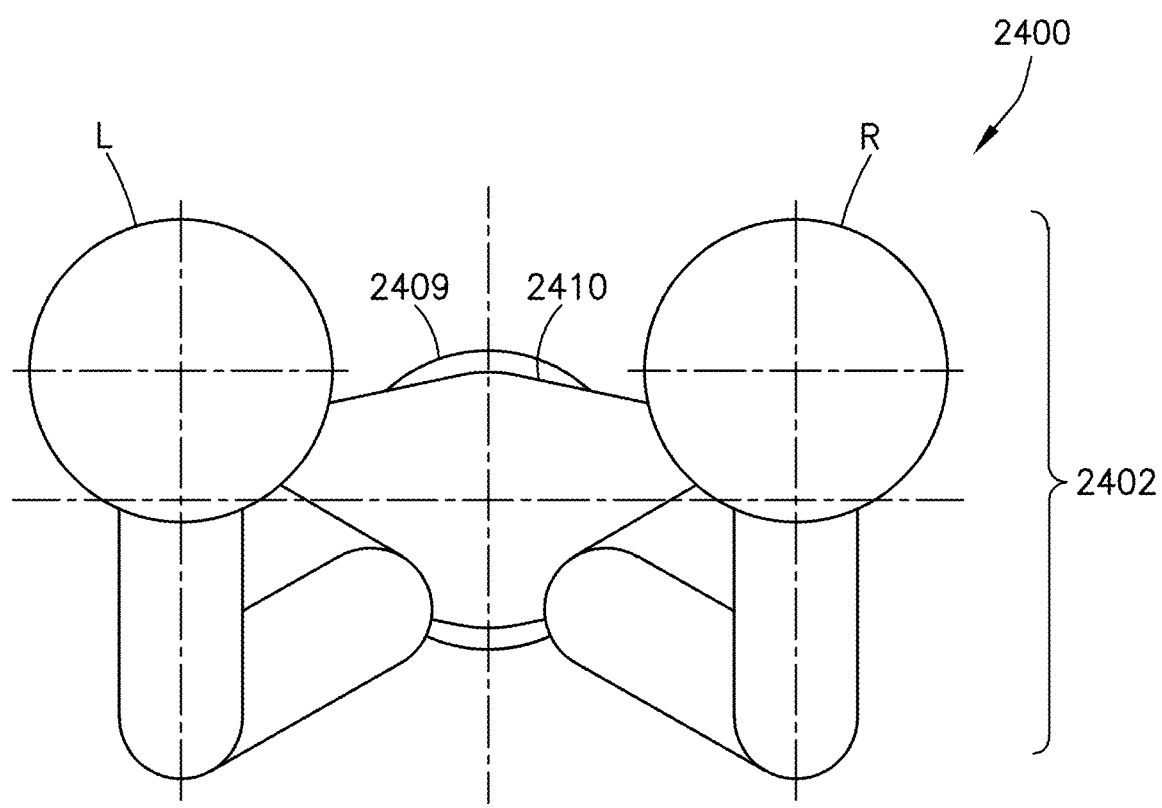
FIGS. 24A-29I are schematic and diagrammatic top views of additional example embodiments of robots and their operations.

Referring now FIGS. 24A-29J, additional example embodiments of robots are disclosed. In FIGS. 24A and 24B, a robot 2400 comprises a drive unit 2409 with a robot arm 2402 on a pivoting base 2410. The robot arm 2402 may be extended laterally to form a beam-like structure that may support the linkages of the robot arm 2402 and house the motors that actuate them. Robot 2400 may provide functionality similar to the example embodiment described with respect FIGS. 4A and 4B.

Figure 25A:
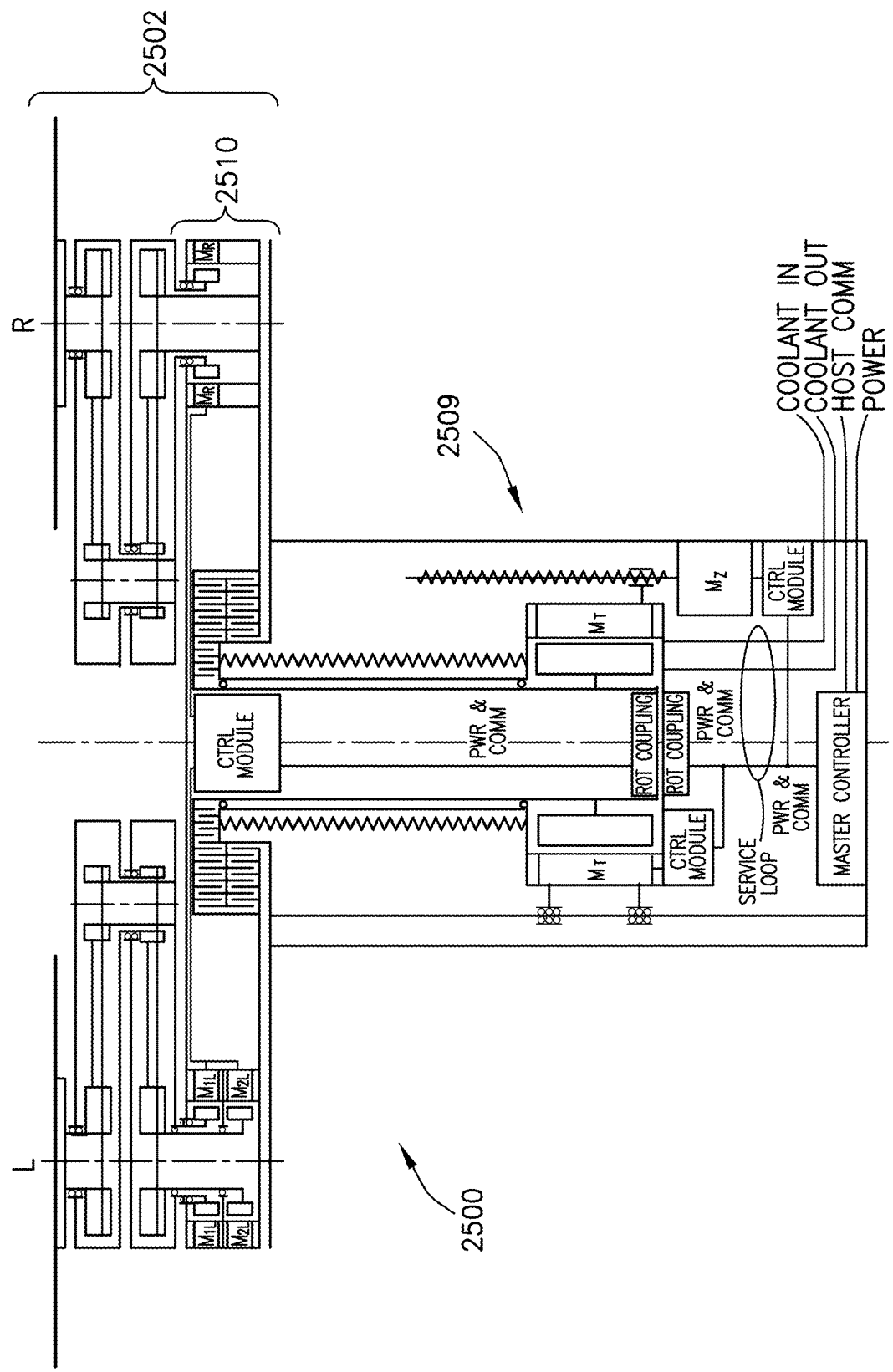
Figure 25B:
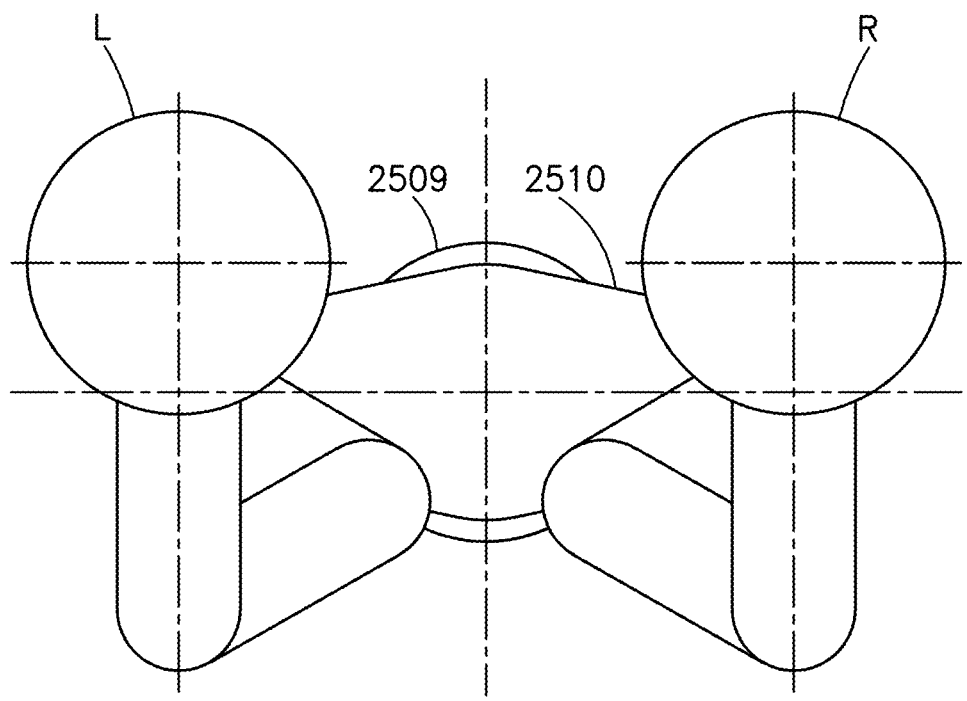

In FIGS. 25A and 25B, a robot 2500 comprises a drive unit 2509 with a pivoting base 2510 having a robot arm 2502. Robot 2500 may provide functionality similar to the example embodiment described with respect to FIGS. 6A and 6B.

Figure 26B:
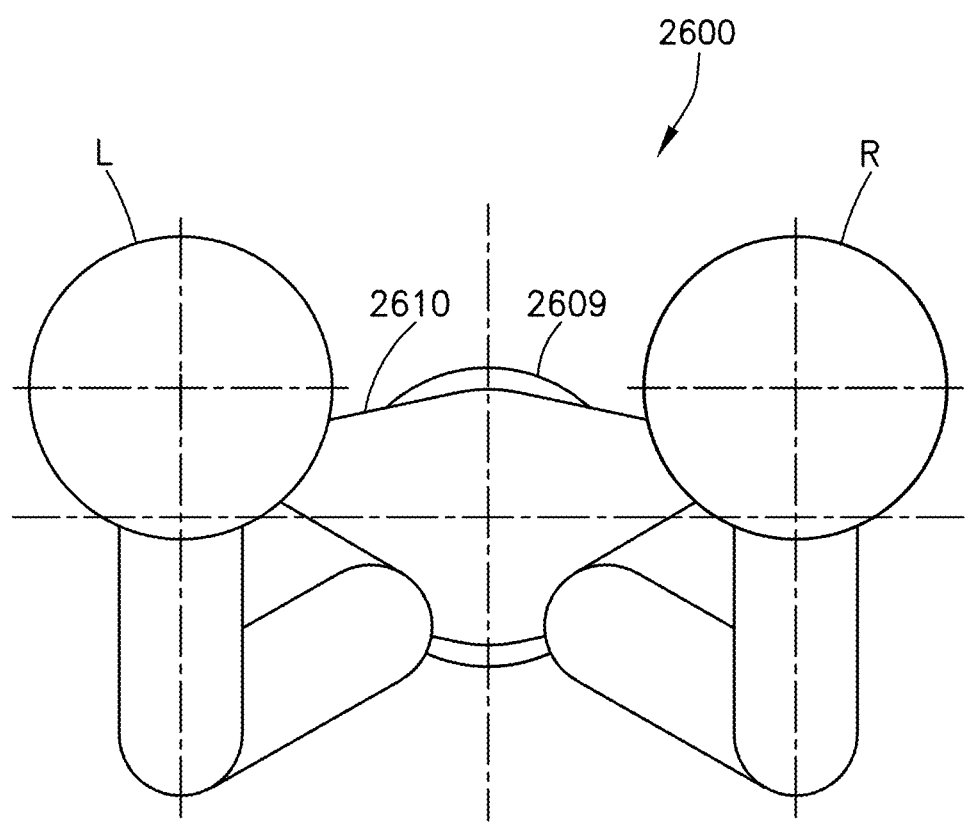

In FIGS. 26A and 26B, a robot 2600 comprises a drive unit 2609 having a robot arm 2602 on a pivoting base 2610. The example of robot 2600 may provide functionality similar to the example embodiment described with respect to FIG. 7.

Figure 27A:
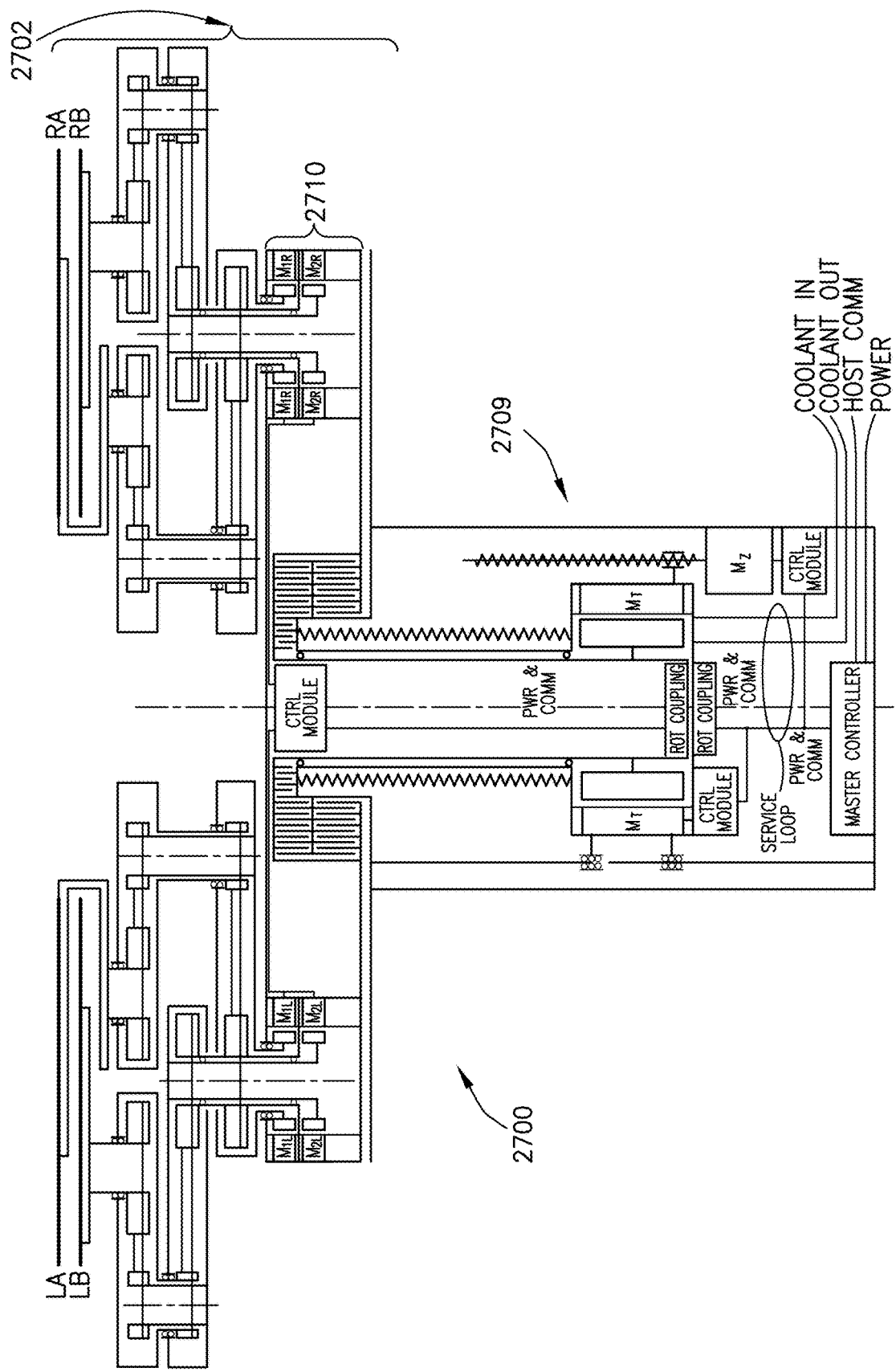
Figure 27B:
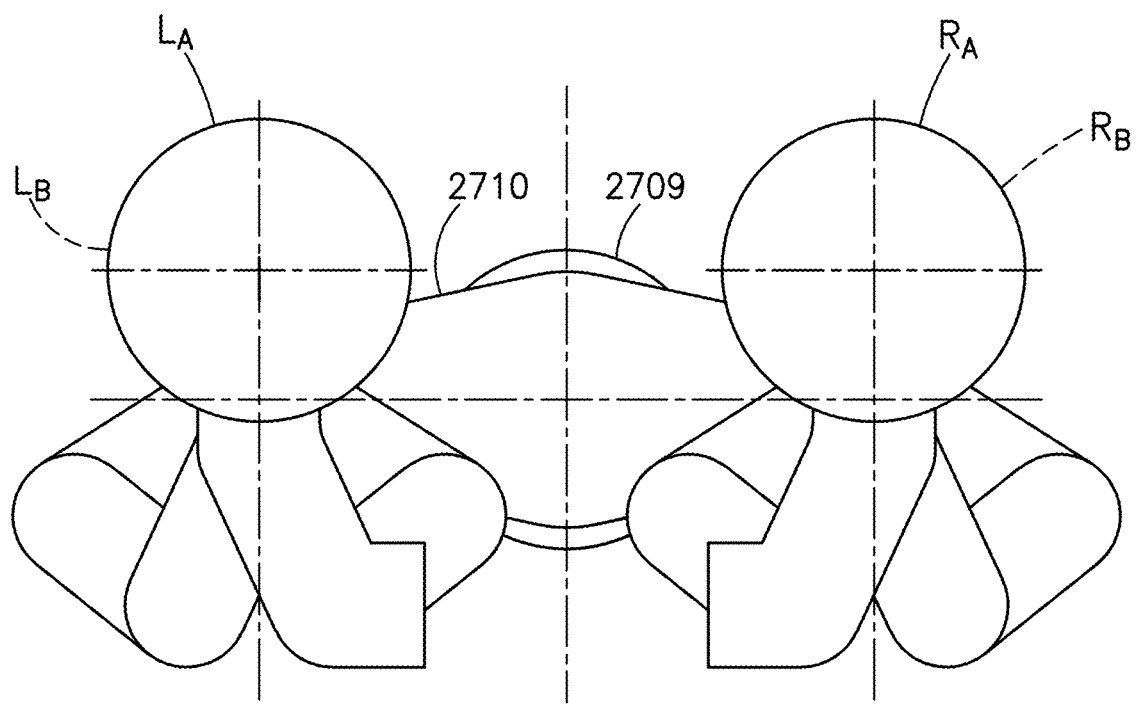

In FIGS. 27A and 27B, a robot 2700 comprises a drive unit 2709 having a robot arm 2702 on a pivoting base 2710. The example robot 2700 may provide functionality similar to the example embodiment described with respect to FIG. 11.

Figure 28A:
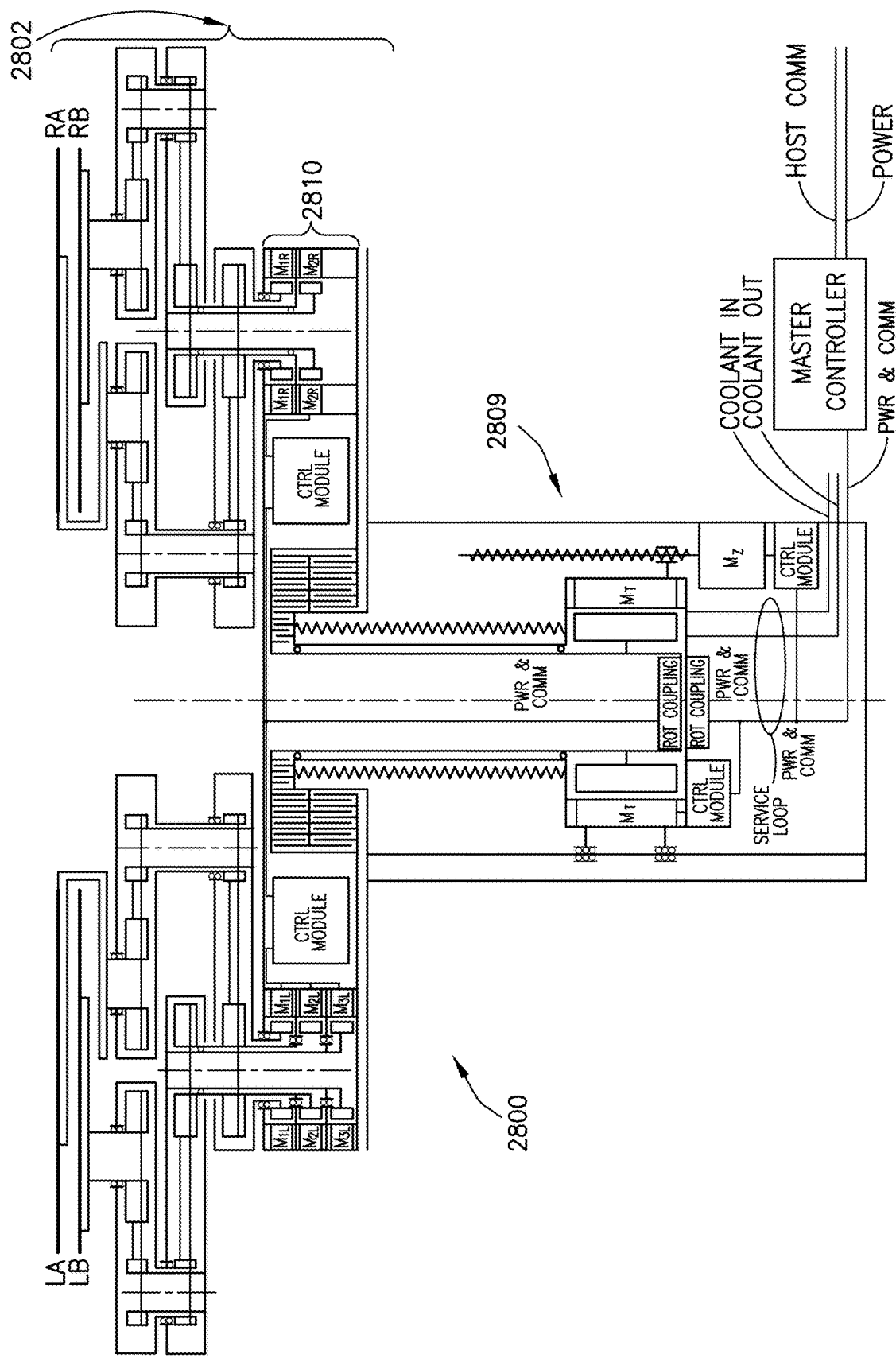
Figure 28B:
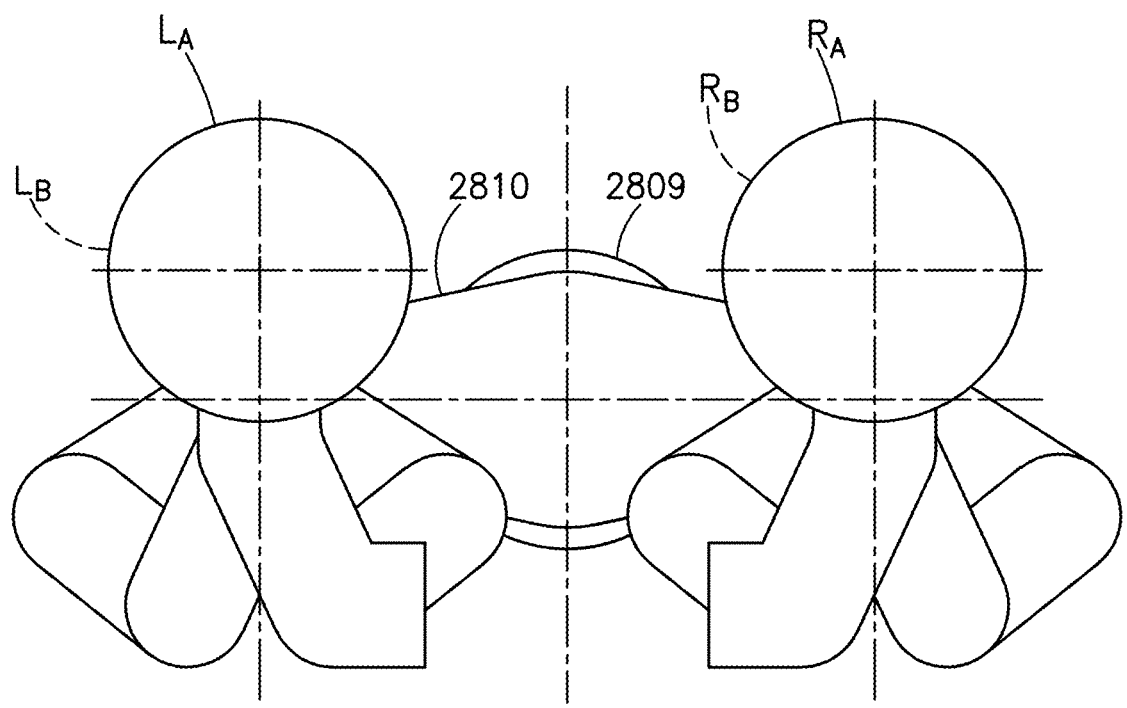

In FIGS. 28A and 28B, a robot 2800 comprises a drive unit 2809 on which a pivoting base 2810 having a robot arm 2802 is mounted. The example robot 2800 may provide functionality similar to the example embodiment described with respect to FIG. 14.

In FIGS. 29A-29I, a robot 2900 comprises a drive unit 2909 on which a pivoting base 2910 having a robot arm 2902 is mounted. The example robot 2900 may provide functionality similar to the example embodiment described with respect to FIG. 15.

Figure 29A:
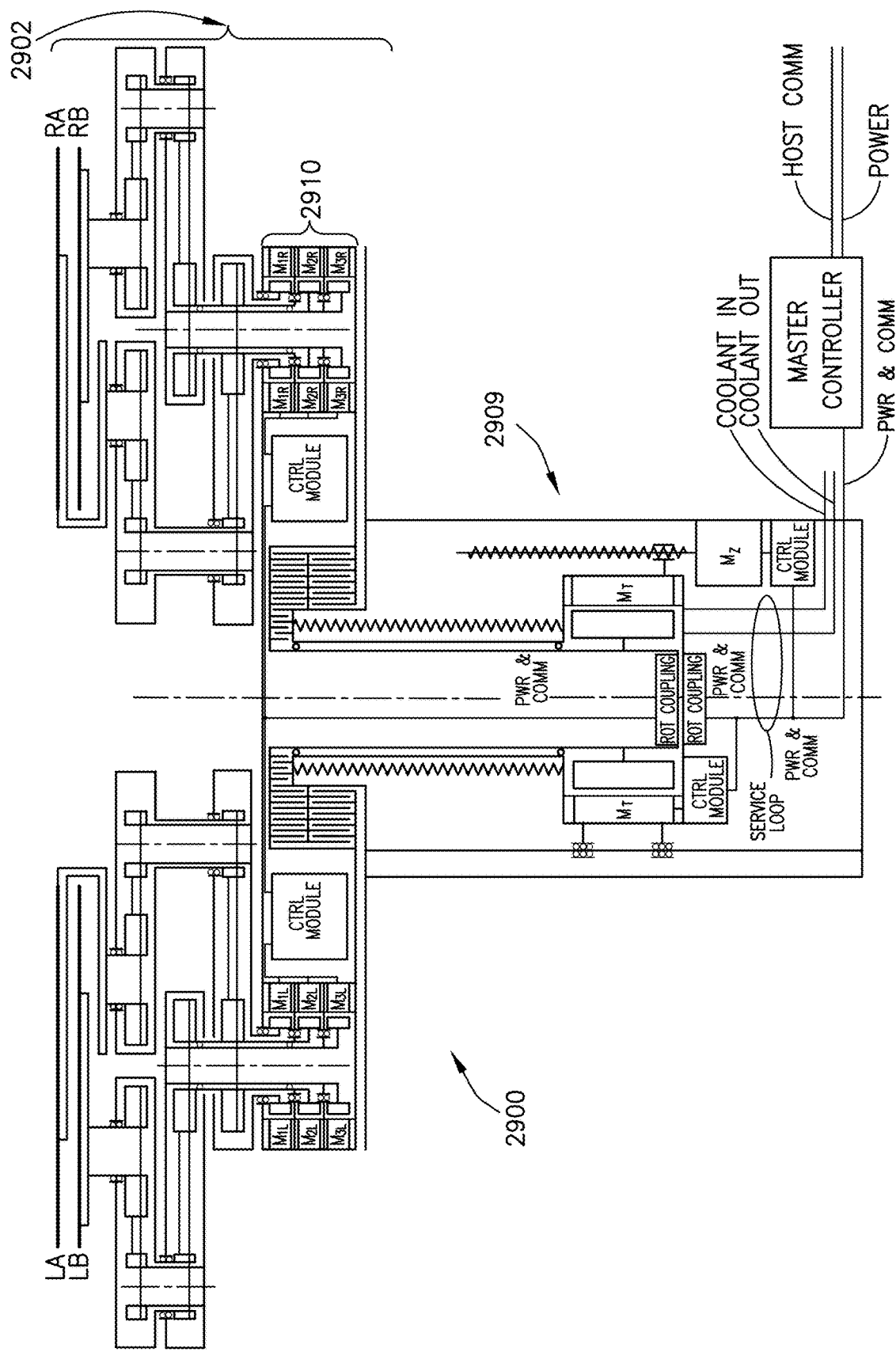
Figure 29B:
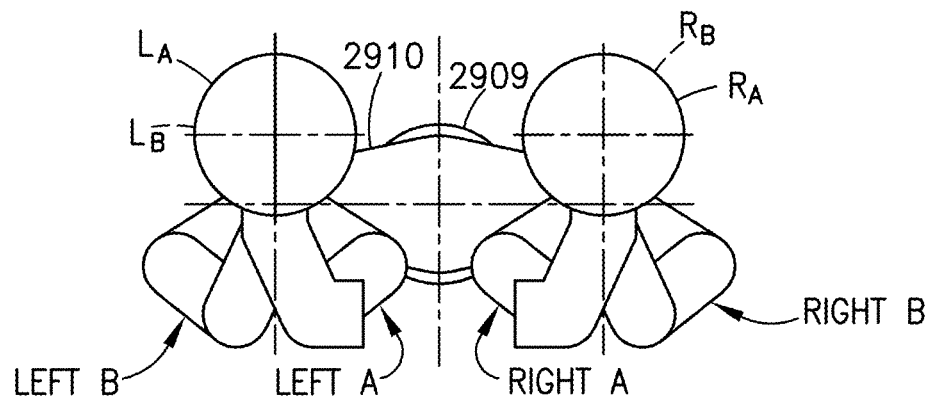
Figure 29C:
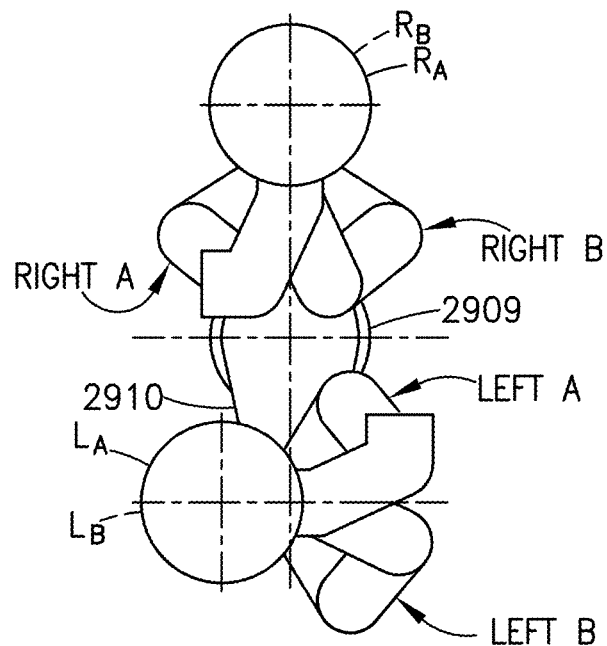

In addition, in the example embodiment of FIGS. 29A-29I, the robot 2900 according to the present invention may be capable of accessing radial workstations along a substantially radial path. For instance, the pivoting beam-like structure, right linkage A and right linkage B can be rotated to position right linkage A and right linkage B in front of a radial station so that the direction of extension of right linkage A and right linkage B is substantially radial, as illustrated diagrammatically in FIGS. 29B and 29C. In these Figures, FIG. 29B shows the robot arm 2902 in the initial position readily suitable for access of orthogonal side-by-side workstations, and FIG. 29C depicts the robot arm 2902 repositioned so that right linkage A and right linkage B can extend and retract radially.

Figure 29D:
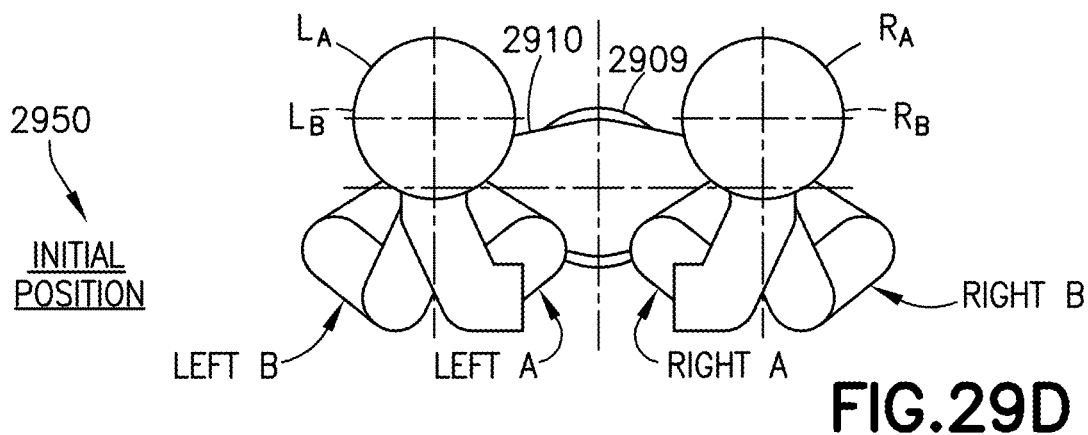
Figure 29E:
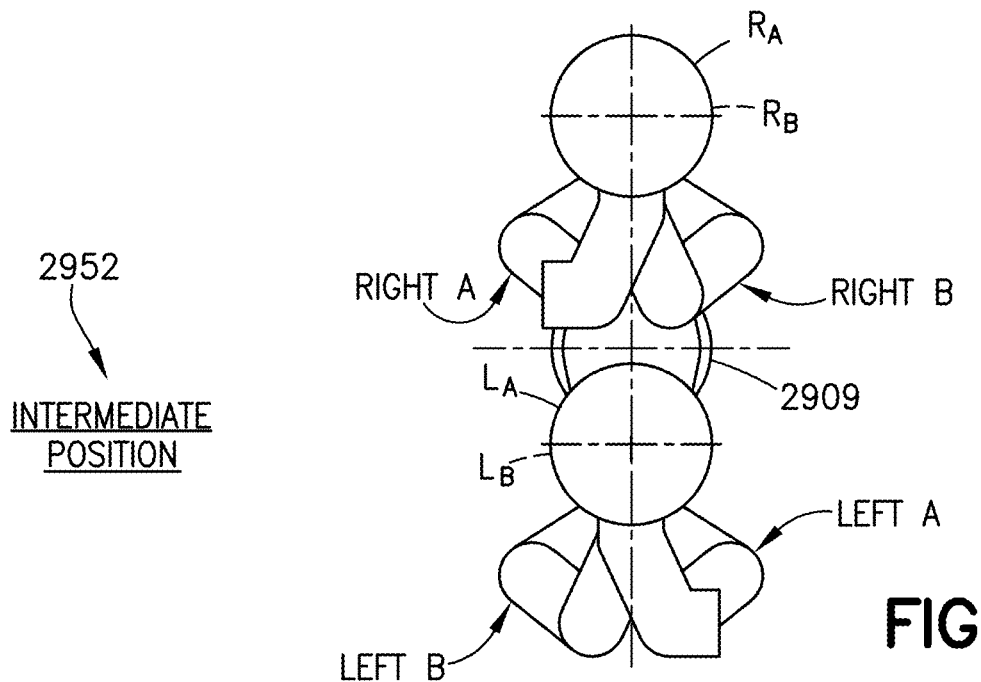
Figure 29F:
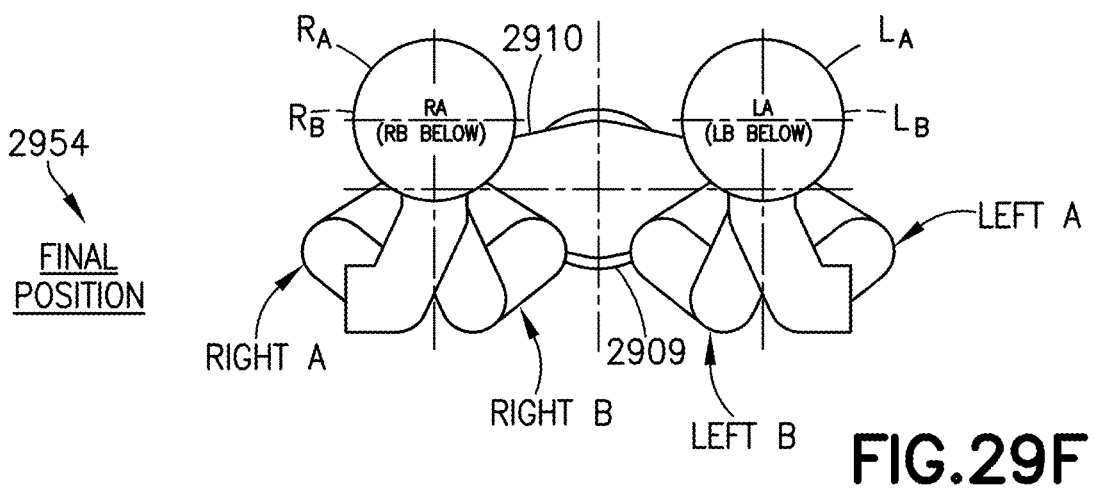

In one example operation, the robot 2900 may also be capable of transferring payloads between left workstations and right workstations. For instance, as illustrated diagrammatically in FIGS. 29D-29F, by rotating the pivoting beam-like structure by 180 degrees while keeping the absolute orientation of left linkage A, left linkage B, right linkage A, and right linkage B constant, left linkage A and left linkage B can be repositioned from the left-hand-side to the right-hand side and, at the same time, right linkage A and right linkage B can be repositioned from the right-hand side to the left-hand side. FIG. 29D shows the robot arm 2902 in an initial position 2950 where left linkage A and left linkage B are positioned to access a left workstation and right linkage A and right linkage B are positioned to access a right workstation; FIG. 29E depicts the robot arm 2902 in an intermediate position 2952 where the pivoting beam-like structure has been rotated by 90 degrees from its initial orientation; and FIG. 29F depicts the robot arm 2902 in a final position 2954 where left linkage A and left linkage B are positioned to access a right workstation and right linkage A and right linkage B are positioned to access a left workstation.

Figure 29G:
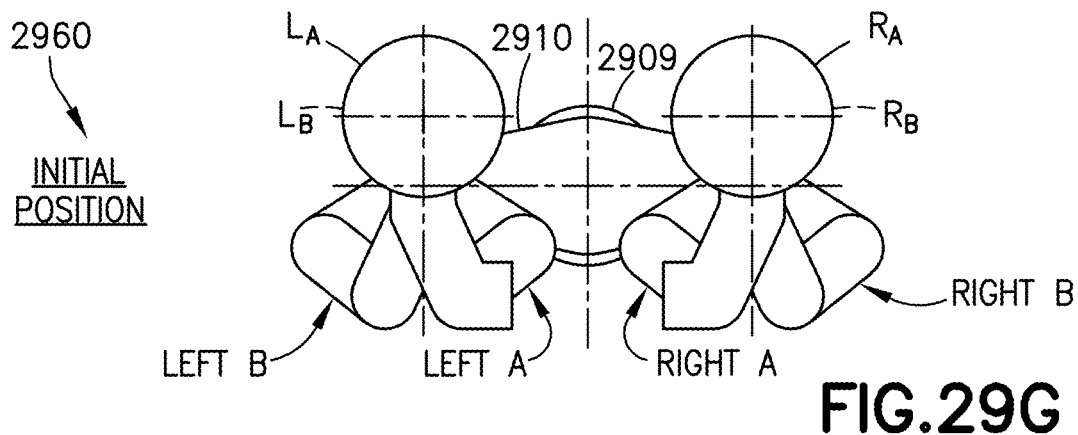
Figure 29H:
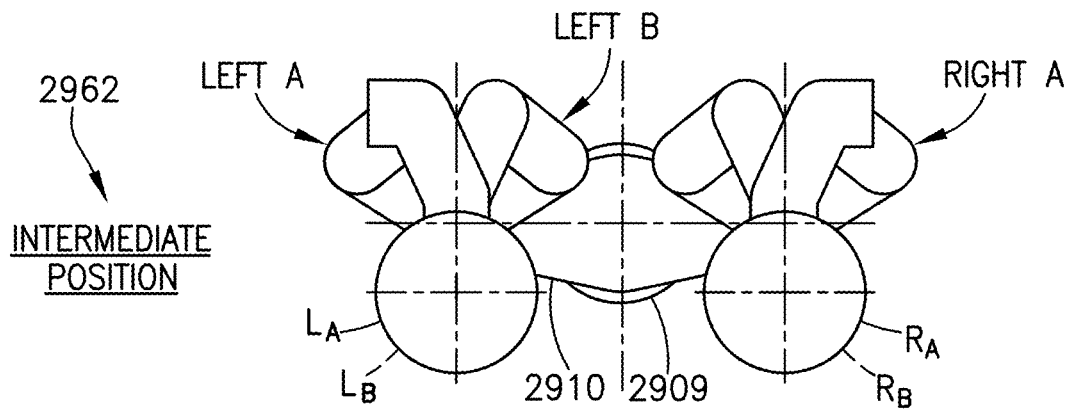
Figure 29I:
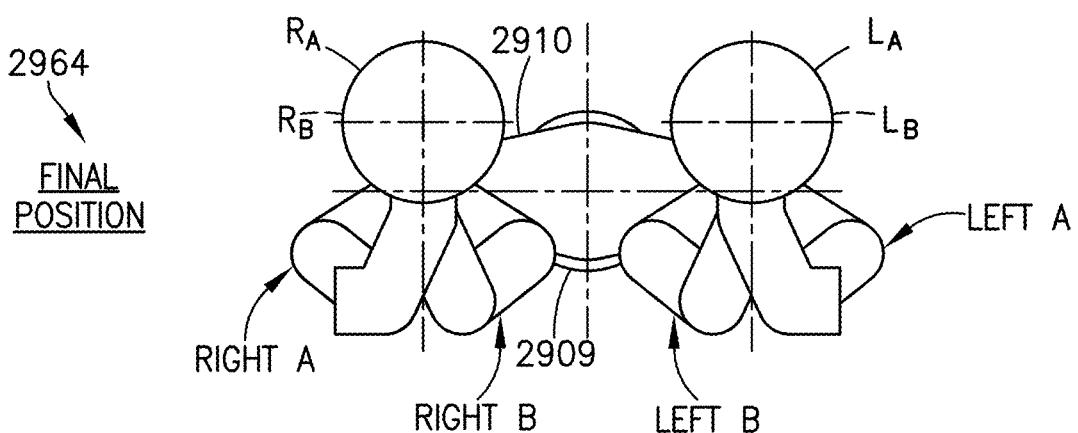

As another example operation, as illustrated diagrammatically in FIGS. 29G-29I, the same repositioning of the robot arm 2902 can be achieved by rotating left linkage A and left linkage B by 180 deg in either direction with respect to the pivoting beam like structure, rotating right linkage A and right linkage B in either direction with respect to the pivoting beam like structure, and rotating the pivoting beam like structure by 180 deg in either direction. FIG. 29G shows the robot arm 2902 in an initial position 2960 where left linkage A and left linkage B are positioned to access a left workstation and right linkage A and right linkage B are positioned to access a right workstation; FIG. 29H depicts the robot arm 2902 in an intermediate position 2962 where left linkage A and left linkage B have been rotated by 180 degrees with respect to the pivoting beam-like structure and right linkage A and right linkage B have also been rotated by 180 degrees with respect to the pivoting beam-like structure; and FIG. 29I depicts the robot arm 2902 in a final position 2964 where left linkage A and left linkage B are positioned to access a right workstation and right linkage A and right linkage B are positioned to access a left workstation.

The linkages of the example robots shown in FIGS. 24A-29I are based on a serial three-link mechanism, for example, a mechanism in which each linkage comprises link 1 (upper arm), link (forearm), and link 3 (wrist) connected in series via rotary joints. Alternatively, any of the linkages in any of the example embodiments may be based on a serial two-link mechanism.

Figure 30:
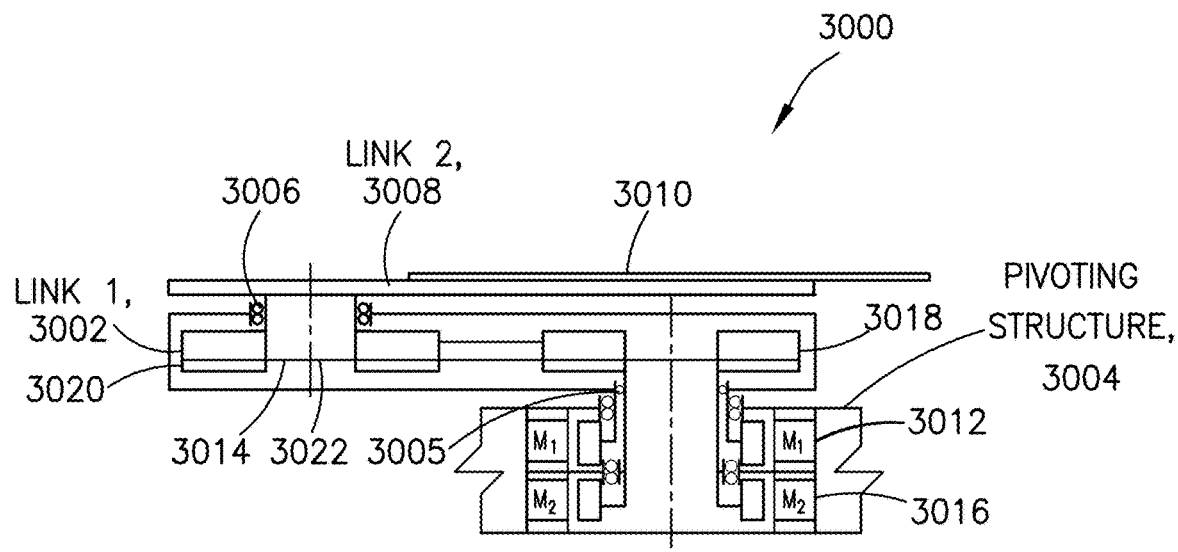
FIGS. 30 and 31 are schematic views of example linkages based on serial two-link mechanisms for robots.

Referring now to FIG. 30, one example of a linkage based on a serial two-link mechanism is shown generally at 3000 and is referred to hereinafter as "linkage 3000." Linkage 3000 may comprise a link 1 (upper arm) 3002 coupled to the pivoting structure of a robot arm 3004 (such as a pivoting base, an upper portion of a pivoting structure, a lower portion of a pivoting structure, or a pivoting beam-like structure described earlier) via a rotary joint (shoulder joint) 3005 and a link 2 (forearm) 3008 coupled to the link 1 3002 via another rotary joint (elbow joint) 3006. Link 2 3008 may carry an end-effector 3010 configured to receive a payload.

The link 1 3002 of the linkage 3000 may be driven by an actuator, for example, electric motor $M_1$ 3012, attached to the pivoting structure of the robot arm. Link 2 3008 of the linkage 3000 may be actuated via a transmission arrangement 3014 between another actuator, for example, electric motor $M_2$ 3016, attached to the pivoting structure of the robot arm and the link 2 3008. As an example, the transmission arrangement may comprise a shoulder pulley 3018 coupled to motor $M_2$ 3016, an elbow pulley 3020 attached to the link 2, and a belt, band, or cable 3022 between the two pulleys.

Figure 31:
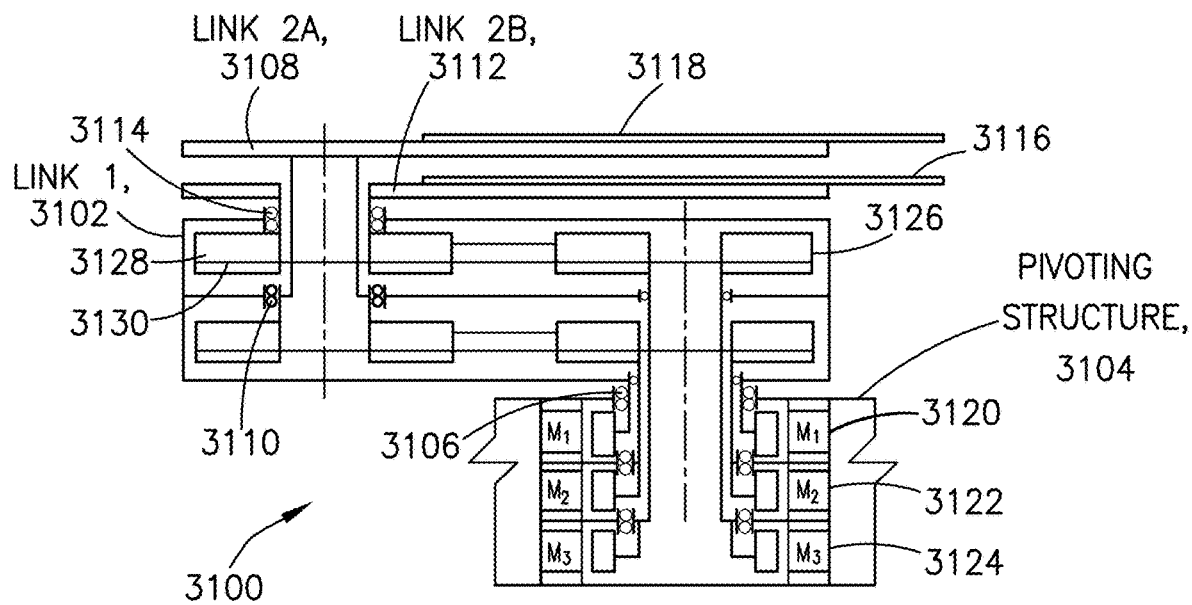

Referring now to FIG. 31, another example of a linkage based on a serial two-link mechanism is shown generally at 3100 and is hereinafter referred to as "linkage 3100." Linkage 3100 may comprise a link 1 (upper arm) 3102 coupled to the pivoting structure 3104 of the robot arm via a rotary joint (shoulder joint) 3106, a link 2A (forearm A) 3108 coupled to the link 1 3102 via a rotary joint (elbow joint A) 3110, and a link 2B (forearm B) 3112 coupled to the link 1 3102 via another rotary joint (elbow joint B) 3114. Link 2A and link 2B may each carry an end-effector 3116, 3118 configured to receive a payload.

The link 1 3102 of the linkage 3100 may be driven by an actuator, for example, an electric motor $M_1$ 3120, attached to the pivoting structure of the robot arm. Link 2A 3108 of the linkage 3100 may be actuated via a transmission arrangement between another actuator, for example, electric motor $M_2$ 3122, attached to the pivoting structure of the robot arm and link 2A 3108. As an example, the transmission arrangement may comprise a shoulder pulley A coupled to motor $M_2$ 3122, an elbow pulley A attached to the link 2A and a belt, band, or cable between the two pulleys. Similarly, link 2B 3112 of the linkage 3100 may be actuated via a transmission arrangement between yet another actuator, for example, electric motor $M_3$ 3124, attached to the pivoting structure of the robot arm and link 2B 3112. As an example, the transmission arrangement may comprise a shoulder pulley 3126 coupled to motor $M_3$ 3124, an elbow pulley 3128 attached to the link 2B 3112, and a belt, band, or cable 3130 between the two pulleys.

Figure 32:
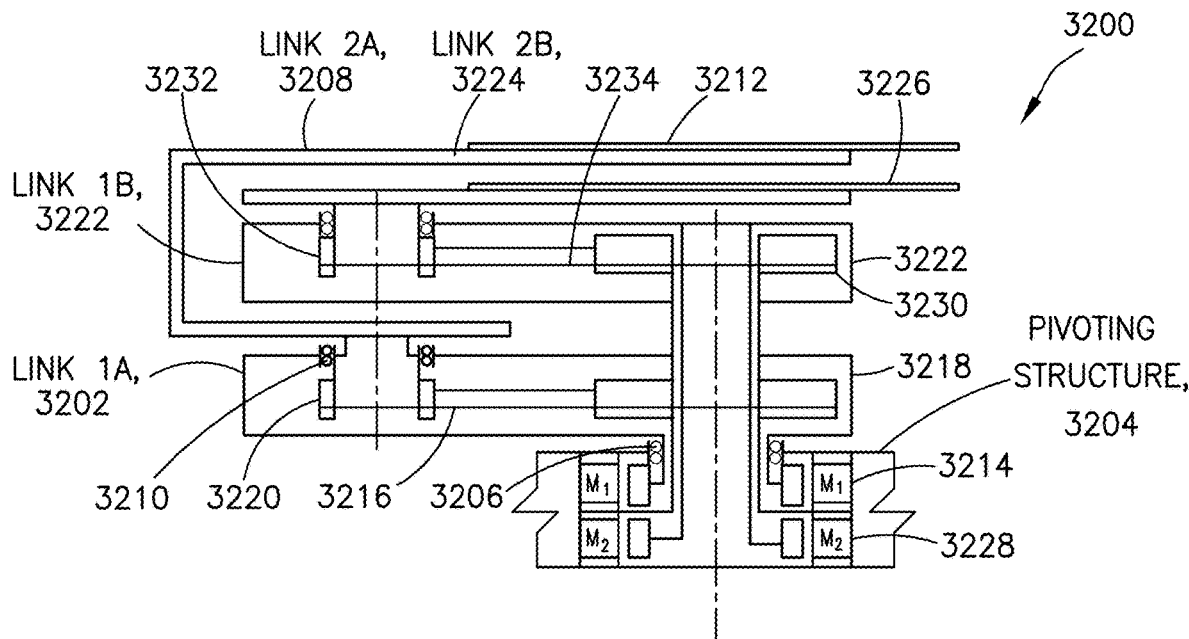
FIGS. 32 and 33 are schematic views of example systems of two-link mechanisms for robots.

Referring now to FIG. 32, a system of two linkages is shown generally at 3200 and is hereinafter referred to as "system 3200." Each of the linkages is based on a serial two-link mechanism and may include linkage A and linkage B. Linkage A may comprise link 1A (upper arm A) 3202 coupled to the pivoting structure 3204 of the robot arm (such as a pivoting base, an upper portion of a pivoting structure, a lower portion of a pivoting structure, or a pivoting beam-like structure described earlier) via a rotary joint (shoulder joint A) 3206 and link 2A (forearm A) 3208 coupled to link 1A 3202 via another rotary joint (elbow joint A) 3210. Link 2A 3208 may carry an end-effector (end-effector A) 3212 configured to receive a payload. As shown in FIG. 32, the effective length of link 2A 3208 measured from elbow joint A 3210 to the center of end-effector A 3212 may be substantially equal to the joint-to-joint effective length of link 1A 3202. Alternatively, the effective length of link 2A 3208 measured from elbow joint A 3210 to the center of end-effector A 3212 may be less or greater than the joint-to-joint length of link 1A 3202.

Link 1A 3202 may be driven by an actuator, for example, an electric motor $M_1$ 3214, attached to the pivoting structure 3204 of the robot arm. The motion of link 2A 3208 may be constrained via a transmission arrangement 3216 between the pivoting structure of the robot arm and link 2A, which may be configured so that the center of end-effector A moves along a substantially straight line when link 1A rotates with respect to the pivoting structure of the robot arm. As an example, the transmission arrangement 3216 may comprise shoulder pulley A 3218 attached to link 1A, elbow pulley A 3220 attached to link 2A, and a belt, band, or cable between the two pulleys. Considering the example where the length of link 2A (measured from elbow joint A to the center of end-effector A) and the joint-to-joint length of link 1A may be substantially equal, the two pulleys may have substantially circular profiles, and the effective radius of shoulder pulley A may be twice the effective radius of elbow pulley A. Alternatively, the lengths of links 1A and 2A are not equal, at least one of the pulleys, for instance shoulder pulley A, may feature a non-circular profile as described in the U.S. patents and patent publications incorporated by reference above.

Linkage B may comprise link 1B (upper arm B) 3222 coupled to the pivoting structure of the robot arm via a rotary joint (shoulder joint B) and link 2B (forearm B) 3224 coupled to link 1B 3222 via another rotary joint (elbow joint B). Link 2B 3224 may carry an end-effector (end-effector B) 3226 configured to receive a payload. As shown in FIG. 32, the length of link 2B 3224 measured from elbow joint B to the center of end-effector B 3226 may be substantially equal to the joint-to-joint length of link 1B 3222. Alternatively, the length of link 2B 3224 measured from elbow joint B to the center of end-effector B 3226 may be less or greater than the joint-to-joint length of link 1B 3222.

Link 1B 3222 may be driven by an actuator, for example, an electric motor $M_2$ 3228, attached to the pivoting structure 3204 of the robot arm. The motion of link 2B may be constrained via a transmission arrangement between the pivoting structure of the robot arm and link 2B, which may be configured so that the center of end-effector B 3226 moves along a substantially straight line when link 1B rotates with respect to the pivoting structure 3204 of the robot arm. As an example, the transmission arrangement may comprise shoulder pulley B 3230 attached to link 1B 3222, elbow pulley B 3232 attached to link 2B 3224, and a belt, band, or cable 3234 between the two pulleys. Considering the example where the length of link 2B 3224 (measured from elbow joint B to the center of end-effector B) and the joint-to-joint length of link 1B 3222 may be substantially equal, the two pulleys may have substantially circular profiles, and the effective radius of shoulder pulley B may be twice the effective radius of elbow pulley B.

Alternatively, the lengths of links 1B and 2B are not equal, at least one of the pulleys, for example shoulder pulley B, may feature a non-circular profile similar to that noted above.

Figure 33:
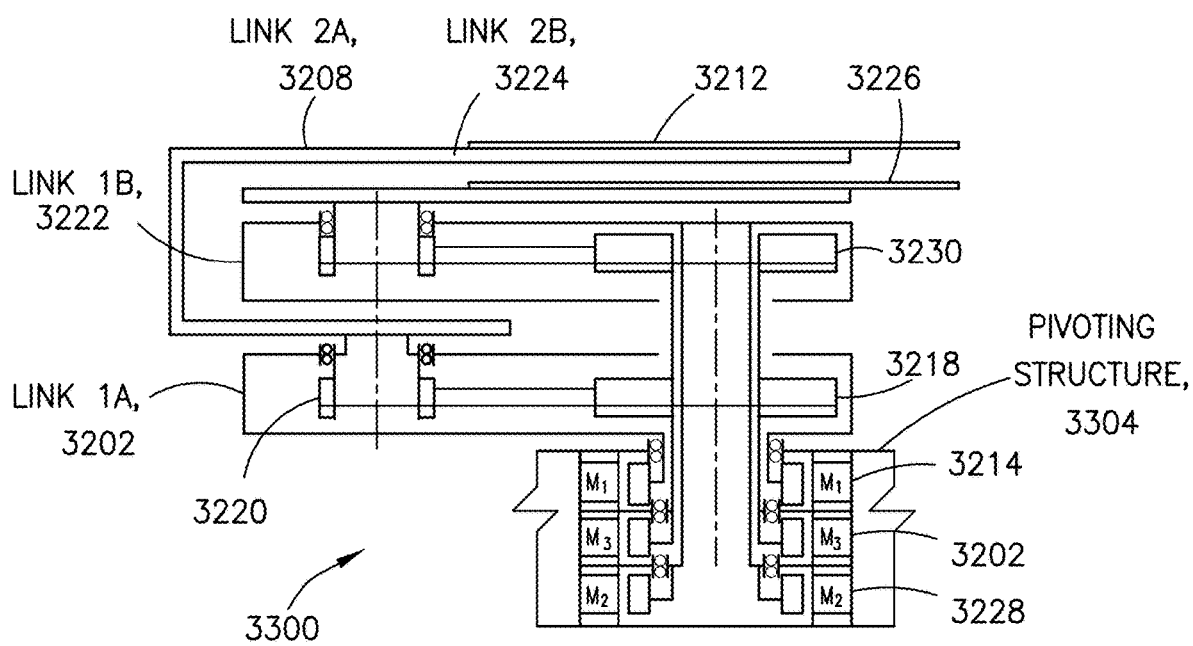

Referring now to FIG. 33, another example embodiment features a system of two linkages, each based on a serial two-link mechanism, and is referred to hereinafter as "system 3300." System 3300 is substantially the same as system 3200 except that shoulder pulley A 3218 and shoulder pulley B 3230 are not attached to the pivoting structure 3304 of the robot arm. Instead, shoulder pulleys A and B are coupled to an actuator, such as motor M3 3302, connected to the pivoting structure 3304 of the robot arm. This additional degree of freedom may be used to adjust the direction of the substantially straight-line motion of the center of end-effector A 3212 and the center of end-effector B 3226, which may take place when link 1A 3202 and link 2A 3208, respectively, rotate with respect to the pivoting structure of the robot arm.

In FIGS. 30-33, the second link (such as link 2, link 2A, or link 2B) is shown above the first link (such as link 1, link 1A, or link 2B). However, the linkages can be inverted such as, for example, the second link (such as link 2, link 2A, or link 2B) may be below the first link (such as link 1, link 1A, or link 2B). Such an inverted linkage configuration may be utilized, for example, when the linkage is suspended from the upper portion of the pivoting structure of the robot arm.

In another example embodiment, the pivoting structure of the robot arm (such as a pivoting base, an upper portion of a pivoting structure, a lower portion of a pivoting structure or a pivoting beam-like structure described earlier) may include one or more Z-axis (vertical lift) mechanisms configured to adjust the vertical elevation of one or more linkages of the robot arm. This may be conveniently used, for instance, to access stations in a stacked configuration, which have different vertical elevations, and stations in a side-by-side configurations, which may be set up at substantially the same vertical elevation.

Figure 34:
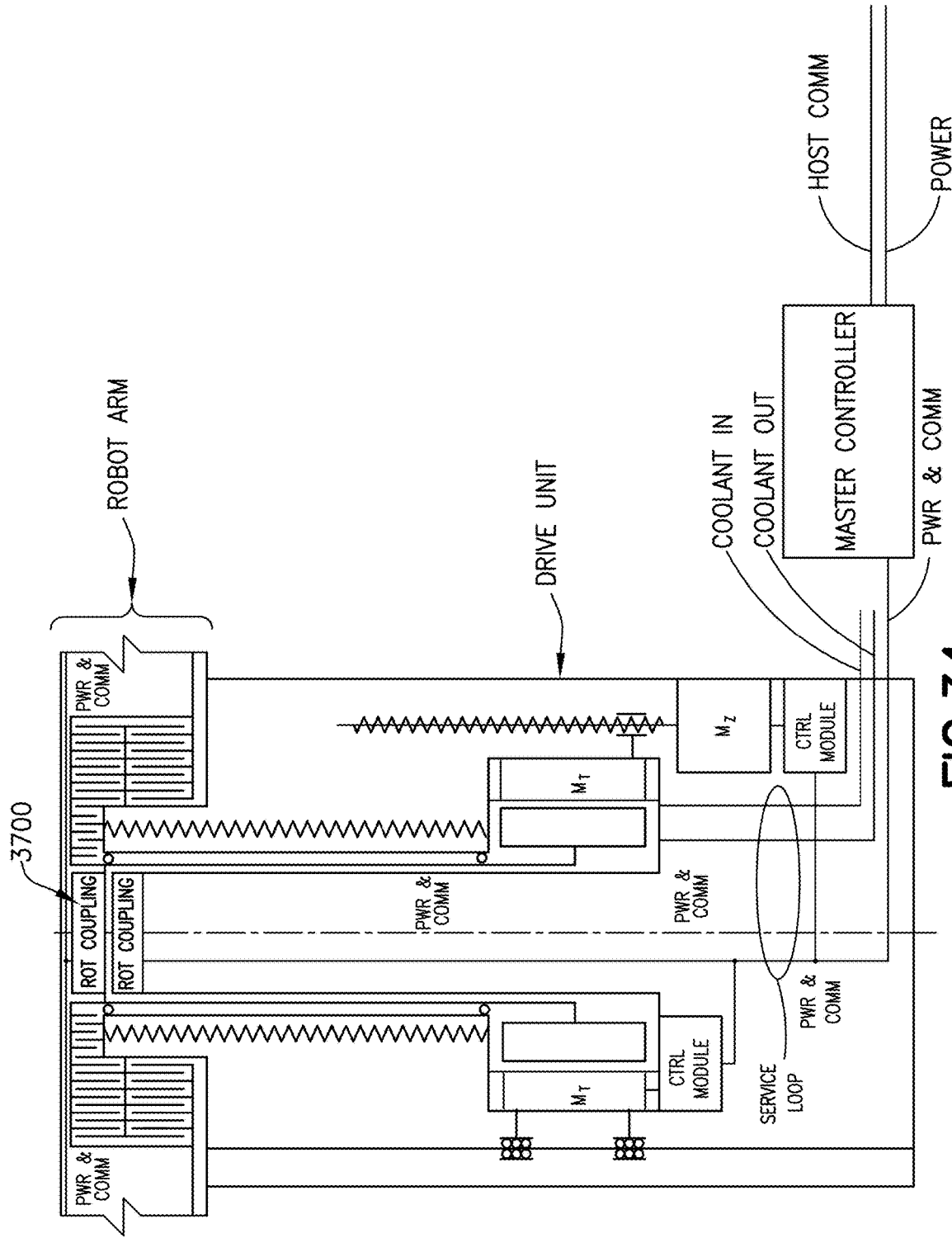
FIG. 34 is a schematic view of an example robot incorporating a rotary coupling.

In the above example embodiments, the rotary coupling is shown in the lower portion of the robot drive unit. However, as depicted in FIG. 34, the rotary coupling, such as the example rotary coupling 3700 described with respect to FIG. 36, may be located in the upper portion of the drive unit. This may allow for convenient separation (removal, replacement, etc.) of the robot arm without compromising the integrity of the sealed volume in the robot arm. When the robot arm is separated, the upper portion of the rotary coupling 3700 may remain attached to the robot arm and the lower portion of the rotary coupling may remain attached to the drive unit of the robot.

Although features have been described with respect to example robots with stationary drive units, features may be extended to robots with movable drive units, such as traversing drive units. For example, traversing drive units are described in U.S. Pat. Nos. 10,424,498 and 10,742,070 and U.S. Patent Publication No. 2020/0262660, which are hereby incorporated by reference in their entireties.

Although a drive unit with a single z-axis mechanism is shown as part of the above example embodiments, any number of z-axis mechanisms, including no z-axis mechanism, may be used. Although the above example embodiments are depicted with a z-axis actuated by a rotary motor via a ball-screw, any other suitable arrangement, such as, without limitation, a linkage mechanism or a linear motor, may be used.

It should be noted that the bearings, bearing arrangements and bearing locations shown in the diagrams throughout the document are intended for illustration only—the purpose is to communicate how individual components may generally be constrained with respect to each other, and are merely examples. Any suitable bearings, bearing arrangements and bearing locations may be used.

Although a communication network is described as the means of communication between the various components of the control system, any other suitable means of communication between the master controller and the control modules, such as a wireless network or point-to-point bus, may be utilized.

In one example embodiment, an apparatus comprises a drive; a movable arm comprising a base pivotally connected to the drive, a first linkage, and a second linkage, the first linkage comprising a first link rotatable on the base at a first rotary joint, a second link connected to the first link at a second rotary joint, and a third link connected to the second link at a third rotary joint, the third link comprising a first end-effector configured to carry a first payload, and the second linkage comprising a fourth link rotatable on the base at a fourth rotary joint, a fifth link connected to the fourth link at a fifth rotary joint, and a sixth link connected to the fifth link at a sixth rotary joint, the sixth link comprising a second end-effector configured to carry a second payload. The apparatus also comprises a master controller coupled to the drive, the master controller being configured to control a coordination of movements of the movable arm and the base relative to the drive. The first rotary joint comprises a first shoulder pulley and the fourth rotary joint comprises a second shoulder pulley, the first shoulder pulley and the second shoulder pulley being connected to the base via a substantially rigid post. The first link is rotatable about the first rotary joint by a first actuator attached to the base. The fourth link is rotatable about the fourth rotary joint by a second actuator attached to the base.

The drive may comprise a main actuator configured to cause a pivot of the base on the drive. The first shoulder pulley, the first actuator, the second shoulder pulley, and the second actuator may be coaxially arranged. The first shoulder pulley and the first actuator may be coaxially arranged and offset from a coaxial arrangement of the second shoulder pulley and the second actuator. The fourth link and the fifth link of the second linkage may be nested in the first linkage. A length of the first link may not be equal to a length of the fourth link. A length of the first link may be equal to a length of the fourth link. The sixth link may comprise a bridge that elevates the second end-effector above the third link. The apparatus may further comprise a thermal coupling between the base and the drive. The apparatus may further comprise a coupling configured to transmit one or more of power and communication signals between the base and the drive. The master controller may be further in communication with at least one sub-controller, the at least one sub-controller being located in at least one of the movable arm and the drive.

In another example embodiment, an apparatus comprises a drive; a first movable arm comprising a base pivotally connected to the drive, a first linkage, and a second linkage, the first linkage comprising a first link rotatable on the base at a first rotary joint, a second link connected to the first link at a second rotary joint, and a third link connected to the second link at a third rotary joint, the third link comprising a first end-effector configured to carry a first payload, and the second linkage comprising a fourth link rotatable on the base at a fourth rotary joint, a fifth link connected to the fourth link at a fifth rotary joint, and a sixth link connected to the fifth link at a sixth rotary joint, the sixth link comprising a second end-effector configured to carry a second payload. The apparatus also comprises a master controller coupled to the drive, the master controller being configured to control a coordination of movements of the first movable arm and the base relative to the drive. The first rotary joint comprises a first shoulder pulley and the fourth rotary joint comprises a second shoulder pulley, the first shoulder pulley and the second shoulder pulley being rotatably connected to the base and independently actuatable. The first link is rotatable about the first rotary joint by a first actuator attached to the base. The fourth link is rotatable about the fourth rotary joint by a second actuator attached to the base. The first shoulder pulley and the second shoulder pulley are independently actuatable by a third actuator attached to the base.

The first actuator, the second actuator, and the third actuator may be coaxially arranged. The third actuator may be configured to allow for independent positioning of the first end-effector and the second end-effector. The apparatus may further comprise a main actuator configured to cause a pivot of the base on the drive and a fourth actuator attached to the base, wherein the main actuator, the first actuator, the second actuator, and the fourth actuator are configured to provide four independently controlled axes of motion to position the first end-effector and the second end-effector independently. The apparatus may further comprise a second movable arm, the second movable arm comprising a third linkage comprising a plurality of links and a fourth linkage comprising a plurality of links, the third linkage and the fourth linkage each being connected to the base by a third shoulder pulley and a fourth shoulder pulley, respectively, the third shoulder pulley and the fourth shoulder pulley being connected to the base via a substantially rigid post.

In another example embodiment, an apparatus comprises a drive; a movable arm comprising a base pivotally connected to the drive, the base comprising an upper portion and a lower portion, a first linkage comprising at least one first link and being configured to carry a first payload, the at least one first link being rotatable on the lower portion of the base at a first rotary joint, and a second linkage comprising at least one second link and being configured to carry a second payload, the at least one second link being rotatable on the upper portion of the base at a second rotary joint; and a master controller coupled to the drive, the master controller being configured to control a coordination of movements of the base, the first linkage, the second linkage, the third linkage, and the fourth linkage relative to the drive. The first link is rotatable through a first shoulder pulley attached to the lower portion by a first actuator, and the second link is rotatable through a second shoulder pulley attached to the upper portion by a second actuator.

The apparatus may further comprise a third linkage comprising at least one third link and being configured to carry a third payload, the at least one third link being rotatable on the lower portion of the base at a third rotary joint, and a fourth linkage comprising at least one fourth link and being configured to carry a fourth payload, the at least one fourth link being rotatable on the upper portion of the base at a fourth rotary joint. The third link may be rotatable through a third pulley attached to the lower portion by a third actuator, and the fourth link may be rotatable through a shoulder pulley attached to the upper portion by a fourth actuator. The master controller may be configured to control a coordination of movements of the base, the first linkage, the second linkage, the third linkage, and the fourth linkage relative to the drive.

In another example embodiment, an apparatus comprises a drive; a movable arm comprising a base pivotally connected to the drive, the base comprising an upper portion and a lower portion, a first linkage comprising at least one first link and being configured to carry a first payload, the at least one first link being rotatable on the lower portion of the base at a first rotary joint; a second linkage comprising at least one second link and being configured to carry a second payload, the at least one second link being rotatable on the upper portion of the base at a second rotary joint; a third linkage comprising at least one third link and being configured to carry a third payload, the at least one third link being rotatable on the lower portion of the base at a third rotary joint; and a fourth linkage comprising at least one fourth link and being configured to carry a fourth payload, the at least one fourth link being rotatable on the upper portion of the base at a fourth rotary joint. The first link is rotatable on the lower portion by a first actuator and through a first shoulder pulley not attached to the lower portion by a second actuator, and the second link is rotatable on the upper portion by a third actuator and through a second shoulder pulley not attached to the upper portion by a fourth actuator, and the third link is rotatable on the lower portion by a fifth actuator and through a third pulley attached to the lower portion, and the fourth link is rotatable on the upper portion by a sixth actuator and through a fourth shoulder pulley attached to the upper portion. A master controller is coupled to the drive, the master controller being configured to control a coordination of movements of the base, the first linkage, the second linkage, the third linkage, and the fourth linkage relative to the drive. The first actuator, the second actuator, the third actuator, the fourth actuator, the fifth actuator, and the sixth actuator are attached to the base.

The first actuator, the third actuator, and the fifth actuator may be attached to the lower portion of the base, and the second actuator, the fourth actuator, and the sixth actuator may be attached to the upper portion of the base. The first linkage and the second linkage may be rotated by moving the first actuator and the second actuator in synchronization to adjust a direction in which the at least one of the at least one first link carrying the first payload and the at least one second link carrying the second payload can be extended.

In another example embodiment, an apparatus comprises a drive; a movable arm comprising a base pivotally connected to the drive, the base comprising an upper portion and a lower portion, a first linkage comprising at least one first link and being configured to carry a first payload, the at least one first link being rotatable on the lower portion of the base at a first rotary joint, a second linkage comprising at least one second link and being configured to carry a second payload, the at least one second link being rotatable on the upper portion of the base at a second rotary joint, a third linkage comprising at least one third link and being configured to carry a third payload, the at least one third link being rotatable on the lower portion of the base at a third rotary joint, and a fourth linkage comprising at least one fourth link and being configured to carry a fourth payload, the at least one fourth link being rotatable on the upper portion of the base at a fourth rotary joint. The first link is rotatable on the lower portion by a first actuator and through a first shoulder pulley not attached to the lower portion by a second actuator, and the second link is rotatable on the upper portion by a third actuator and through a second shoulder pulley not attached to the upper portion by a fourth actuator, and the third link is rotatable on the lower portion by a fifth actuator and through a third pulley not attached to the lower portion by a sixth actuator, and the fourth link is rotatable on the upper portion by a seventh actuator and through a fourth shoulder pulley not attached to the upper portion by an eighth actuator. The apparatus also includes a master controller coupled to the drive, the master controller being configured to control a coordination of movements of the base, the first linkage, the second linkage, the third linkage, and the fourth linkage relative to the drive.

Although the present invention is described with respect to example robots with stationary drive units, it can be extended to robots with movable drive units, such as traversing drive units such as, for example, shown and described in U.S. Pat. Nos. 10,800,050; 10,742,070; 10,596,710; and 10,269,604, which are hereby incorporated by reference in their entireties, and U.S. Patent Publication Nos. 2020/0262660 A1 and 2018/0108552 A1, which are also hereby incorporated by reference in their entireties. Similarly, although the present invention is described with respect to robots with rotary joints, it can be extended to robots with other types of joints, such as prismatic (linear) joints (robots with linear arms).

It should be understood that the foregoing description is only illustrative. Various alternatives and modifications can be devised by those skilled in the art. For example, features from different embodiments described above could be selectively combined into a new embodiment. Accordingly, the description is intended to embrace all such alternatives, modifications, and variances.

What is claimed is:

1. An apparatus, comprising:
 a drive;
 a movable arm comprising,
  a base pivotally connected to the drive,
  a first linkage, comprising, a first link rotatable on the base at a first rotary joint,
a second link connected to the first link at a second rotary joint, and
a third link connected to the second link at a third rotary joint, the third link comprising a first end-effector configured to carry a first payload, and
a second linkage, comprising,
a fourth link rotatable on the base at a fourth rotary joint,
a fifth link connected to the fourth link at a fifth rotary joint, and
a sixth link connected to the fifth link at a sixth rotary joint, the sixth link comprising a second end-effector configured to carry a second payload;
a master controller coupled to the drive, the master controller being configured to control a coordination of movements of the movable arm and the base relative to the drive;
wherein the first rotary joint comprises a first shoulder pulley and the fourth rotary joint comprises a second shoulder pulley, the first shoulder pulley and the second shoulder pulley being connected to the base via a substantially rigid post;
wherein the first link is rotatable about the first rotary joint by a first actuator attached to the base;
wherein the fourth link is rotatable about the fourth rotary joint by a second actuator attached to the base; wherein the first shoulder pulley, the first actuator, the second shoulder pulley, and the second actuator are coaxially arranged.

2. The apparatus of claim 1, wherein the drive comprises a main actuator configured to cause a pivot of the base on the drive.

3. The apparatus of claim 1, wherein the first shoulder pulley and the first actuator are coaxially arranged and offset from a coaxial arrangement of the second shoulder pulley and the second actuator.

4. The apparatus of claim 1, wherein the fourth link and the fifth link of the second linkage are nested in the first linkage.

5. The apparatus of claim 1, wherein a length of the first link is not equal to a length of the fourth link.

6. The apparatus of claim 1, wherein the sixth link comprises a bridge that elevates the second end-effector above the third link.

7. The apparatus of claim 1, further comprising a coupling configured to transmit one or more of power and communication signals between the base and the drive.

* * * * *